(12) United States Patent
Chen et al.

(10) Patent No.: US 12,354,968 B2
(45) Date of Patent: *Jul. 8, 2025

(54) RECONSTITUTED SUBSTRATE STRUCTURE AND FABRICATION METHODS FOR HETEROGENEOUS PACKAGING INTEGRATION

(71) Applicant: Applied Materials, Inc., Santa Clara, CA (US)

(72) Inventors: Han-Wen Chen, Cupertino, CA (US); Steven Verhaverbeke, San Francisco, CA (US); Guan Huei See, Singapore (SG); Giback Park, San Jose, CA (US); Giorgio Cellere, Torri di Quartesolo (IT); Diego Tonini, Treviso (IT); Vincent Dicaprio, Pleasanton, CA (US); Kyuil Cho, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,433

(22) Filed: Jul. 31, 2023

(65) Prior Publication Data
US 2024/0021533 A1 Jan. 18, 2024

Related U.S. Application Data

(63) Continuation of application No. 17/227,983, filed on Apr. 12, 2021, now Pat. No. 11,715,700, which is a
(Continued)

(30) Foreign Application Priority Data

May 10, 2019 (IT) .................. 102019000006736

(51) Int. Cl.
*H01L 23/538* (2006.01)
*H01L 21/48* (2006.01)
(Continued)

(52) U.S. Cl.
CPC ........ *H01L 23/5389* (2013.01); *H01L 21/486* (2013.01); *H01L 21/4864* (2013.01);
(Continued)

(58) Field of Classification Search
CPC ..... H01L 23/5389; H01L 23/66; H01L 23/13; H01L 23/147; H01L 23/49827;
(Continued)

(56) References Cited

U.S. PATENT DOCUMENTS 4,073,610 A 2/1978 Cox
5,126,016 A 6/1992 Glenning et al.
(Continued)

FOREIGN PATENT DOCUMENTS

CA 2481616 C 1/2013
CN 1376554 A 10/2002
(Continued)

OTHER PUBLICATIONS

PCT International Search Report and Written Opinion dated Feb. 4, 2022, for International Application No. PCT/US2021/053821.
(Continued)

*Primary Examiner* — Jasmine J Clark
(74) *Attorney, Agent, or Firm* — Patterson + Sheridan, LLP

(57) ABSTRACT

The present disclosure relates to thin-form-factor reconstituted substrates and methods for forming the same. The reconstituted substrates described herein may be utilized to fabricate homogeneous or heterogeneous high-density 3D integrated devices. In one embodiment, a silicon substrate is structured by direct laser patterning to include one or more
(Continued)

cavities and one or more vias. One or more semiconductor dies of the same or different types may be placed within the cavities and thereafter embedded in the substrate upon formation of an insulating layer thereon. One or more conductive interconnections are formed in the vias and may have contact points redistributed to desired surfaces of the reconstituted substrate. The reconstituted substrate may thereafter be integrated into a stacked 3D device.

20 Claims, 46 Drawing Sheets

Related U.S. Application Data continuation of application No. 16/870,843, filed on May 8, 2020, now Pat. No. 11,264,333.

(51) Int. Cl.
| | |
|---|---|
| H01L 21/50 | (2006.01) |
| H01L 21/60 | (2006.01) |
| H01L 21/768 | (2006.01) |
| H01L 23/13 | (2006.01) |
| H01L 23/14 | (2006.01) |
| H01L 23/498 | (2006.01) |
| H01L 23/66 | (2006.01) |
| H01L 25/065 | (2023.01) |
| H01L 25/10 | (2006.01) |
| H01Q 1/22 | (2006.01) |
| H01Q 1/24 | (2006.01) |
| H05K 1/02 | (2006.01) |
| H10D 88/00 | (2025.01) |

(52) U.S. Cl.
CPC ........ *H01L 21/50* (2013.01); *H01L 21/76802* (2013.01); *H01L 23/13* (2013.01); *H01L 23/147* (2013.01); *H01L 23/49827* (2013.01); *H01L 23/49838* (2013.01); *H01L 23/49866* (2013.01); *H01L 23/49894* (2013.01); *H01L 23/5384* (2013.01); *H01L 23/5385* (2013.01); *H01L 23/5386* (2013.01); *H01L 23/66* (2013.01); *H01L 25/0657* (2013.01); *H01L 25/105* (2013.01); *H01Q 1/2283* (2013.01); *H01Q 1/243* (2013.01); *H05K 1/0243* (2013.01); *H10D 88/00* (2025.01); *H01L 2021/60007* (2013.01); *H01L 2225/1035* (2013.01); *H01L 2225/107* (2013.01)

(58) Field of Classification Search
CPC ......... H01L 23/49838; H01L 23/49866; H01L 23/49894; H01L 23/5384; H01L 23/5385; H01L 23/5386; H01L 21/486; H01L 21/50; H01L 21/76802; H01L 25/105; H01L 25/0657; H01L 2225/1035; H01L 2225/107; H01L 27/0688; H01L 2021/60007; H05K 1/0243
USPC ........................................................ 438/109
See application file for complete search history.

(56) References Cited

U.S. PATENT DOCUMENTS

| | | |
|---|---|---|
| 5,268,194 A | 12/1993 | Kawakami et al. |
| 5,353,195 A | 10/1994 | Fillion et al. |
| 5,367,143 A | 11/1994 | White, Jr. |
| 5,374,788 A | 12/1994 | Endoh et al. |
| 5,474,834 A | 12/1995 | Tanahashi et al. |
| 5,670,262 A | 9/1997 | Dalman |
| 5,767,480 A | 6/1998 | Anglin et al. |
| 5,783,870 A | 7/1998 | Mostafazadeh et al. |
| 5,841,102 A | 11/1998 | Noddin |
| 5,878,485 A | 3/1999 | Wood et al. |
| 6,013,948 A | 1/2000 | Akram et al. |
| 6,039,889 A | 3/2000 | Zhang et al. |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,392,290 B1 | 5/2002 | Kasem et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,677,552 B1 | 1/2004 | Tulloch et al. |
| 6,713,719 B1 | 3/2004 | De Steur et al. |
| 6,724,638 B1 | 4/2004 | Inagaki et al. |
| 6,775,907 B1 | 8/2004 | Boyko et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 | 10/2007 | Shimoishizaka et al. |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |

(56) References Cited

U.S. PATENT DOCUMENTS

| | | | |
|---|---|---|---|
| 8,426,246 B2 | 4/2013 | Toh et al. |
| 8,470,708 B2 | 6/2013 | Shih et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,980,727 B1 | 3/2015 | Lei et al. |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,318,376 B1 | 4/2016 | Holm et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,837,484 B2 | 12/2017 | Jung et al. |
| 9,859,258 B2 | 1/2018 | Chen et al. |
| 9,875,970 B2 | 1/2018 | Yi et al. |
| 9,887,103 B2 | 2/2018 | Scanlan et al. |
| 9,887,167 B1 | 2/2018 | Lee et al. |
| 9,893,045 B2 | 2/2018 | Pagaila et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,134,687 B1 | 11/2018 | Kim et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 10,886,232 B2 | 1/2021 | Chen et al. |
| 11,264,331 B2 | 3/2022 | Chen et al. |
| 11,676,832 B2 | 6/2023 | Leschkies et al. |
| 11,715,700 B2 * | 8/2023 | Chen ............... H01Q 1/243 |
| | | 438/109 |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0070092 A1 | 3/2005 | Kirby |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2007/0290300 A1 | 12/2007 | Kawakami |
| 2008/0006945 A1 | 1/2008 | Lin et al. |
| 2008/0011852 A1 | 1/2008 | Gu et al. |
| 2008/0076256 A1 | 3/2008 | Kawai et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0277776 A1 | 11/2008 | Enomoto |
| 2008/0296273 A1 | 12/2008 | Lei et al. |
| 2009/0084596 A1 | 4/2009 | Inoue et al. |
| 2009/0224372 A1 | 9/2009 | Johnson |
| 2009/0243065 A1 | 10/2009 | Sugino et al. |
| 2009/0250823 A1 | 10/2009 | Racz et al. |
| 2009/0278126 A1 | 11/2009 | Yang et al. |
| 2010/0013081 A1 | 1/2010 | Toh et al. |
| 2010/0059876 A1 | 3/2010 | Shimizu et al. |
| 2010/0062287 A1 | 3/2010 | Beresford et al. |
| 2010/0068837 A1 | 3/2010 | Kumar et al. |
| 2010/0078805 A1 | 4/2010 | Li et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0151663 A1 | 6/2011 | Chatterjee et al. |
| 2011/0204505 A1 | 8/2011 | Pagaila et al. |
| 2011/0259631 A1 | 10/2011 | Rumsby |

(56) References Cited

U.S. PATENT DOCUMENTS

| | | |
|---|---|---|
| 2011/0272191 A1 | 11/2011 | Li et al. |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1 | 5/2012 | Takei et al. |
| 2012/0135608 A1 | 5/2012 | Shimoi et al. |
| 2012/0146209 A1 | 6/2012 | Hu et al. |
| 2012/0164827 A1 | 6/2012 | Rajagopalan et al. |
| 2012/0229990 A1 | 9/2012 | Adachi et al. |
| 2012/0261805 A1 | 10/2012 | Sundaram et al. |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0200528 A1 | 8/2013 | Lin et al. |
| 2013/0203190 A1 | 8/2013 | Reed et al. |
| 2013/0286615 A1 | 10/2013 | Inagaki et al. |
| 2013/0341738 A1 | 12/2013 | Reinmuth et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0021081 A1 | 1/2015 | Mitarai et al. |
| 2015/0187691 A1 | 7/2015 | Vick |
| 2015/0228416 A1 | 8/2015 | Hurwitz et al. |
| 2015/0255344 A1 | 9/2015 | Ebefors et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118325 A1 | 4/2016 | Wang et al. |
| 2016/0118337 A1 | 4/2016 | Yoon et al. |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0207197 A1 | 7/2017 | Yu et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0033779 A1 | 2/2018 | Park et al. |
| 2018/0047666 A1 | 2/2018 | Lin et al. |
| 2018/0116057 A1 | 4/2018 | Kajihara et al. |
| 2018/0145044 A1 | 5/2018 | Park et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0326224 A1 | 10/2019 | Aoki |
| 2019/0355675 A1 | 11/2019 | Lee et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0039002 A1 | 2/2020 | Sercel et al. |
| 2020/0130131 A1 | 4/2020 | Togawa et al. |
| 2020/0163218 A1 | 5/2020 | Mok |
| 2020/0357947 A1 | 11/2020 | Chen et al. |
| 2020/0358163 A1 | 11/2020 | See et al. |
| 2020/0395306 A1 | 12/2020 | Chen et al. |
| 2021/0005550 A1 | 1/2021 | Chavali et al. |

FOREIGN PATENT DOCUMENTS

| | | |
|---|---|---|
| CN | 1646650 A | 7/2005 |
| CN | 1714608 A | 12/2005 |
| CN | 1971894 A | 5/2007 |
| CN | 100463128 C | 2/2009 |
| CN | 100502040 C | 6/2009 |
| CN | 100524717 C | 8/2009 |
| CN | 100561696 C | 11/2009 |
| CN | 102024713 A | 4/2011 |
| CN | 102437110 A | 5/2012 |
| CN | 104637912 A | 5/2015 |
| CN | 105436718 A | 3/2016 |
| CN | 105575938 A | 5/2016 |
| CN | 106531647 A | 3/2017 |
| CN | 106653703 A | 5/2017 |
| CN | 107428544 A | 12/2017 |
| CN | 108028225 A | 5/2018 |
| CN | 108235562 A | 6/2018 |
| CN | 109155246 A | 1/2019 |
| CN | 111492472 A | 8/2020 |
| EP | 0264134 A2 | 4/1988 |
| EP | 1536673 A1 | 6/2005 |
| EP | 1478021 B1 | 7/2008 |
| EP | 2023382 A1 | 2/2009 |
| EP | 1845762 B1 | 5/2011 |
| EP | 2942808 A1 | 11/2015 |
| JP | H06152089 A | 5/1994 |
| JP | H11233950 A | 8/1999 |
| JP | 2001244591 A | 9/2001 |
| JP | 2002208778 A1 | 7/2002 |
| JP | 2002246755 A | 8/2002 |
| JP | 2003188340 A | 7/2003 |
| JP | 2004311788 A | 11/2004 |
| JP | 2004335641 A | 11/2004 |
| JP | 2006032556 A | 2/2006 |
| JP | 2008066517 A | 3/2008 |
| JP | 4108285 B2 | 6/2008 |
| JP | 2009081423 A | 4/2009 |
| JP | 2010129723 A | 6/2010 |
| JP | 2010528866 A | 8/2010 |
| JP | 2010529664 A | 8/2010 |
| JP | 2012069926 A | 4/2012 |
| JP | 5004378 B2 | 8/2012 |
| JP | 5111342 B2 | 1/2013 |
| JP | 2013176835 A | 9/2013 |
| JP | 2013207006 A | 10/2013 |
| JP | 2013222889 A | 10/2013 |
| JP | 5608605 B2 | 10/2014 |
| JP | 5693977 B2 | 4/2015 |
| JP | 5700241 B2 | 4/2015 |
| JP | 2015070007 A | 4/2015 |
| JP | 201692107 A | 5/2016 |
| JP | 2016102964 A | 6/2016 |
| JP | 5981232 B2 | 8/2016 |
| JP | 2016171118 A | 9/2016 |
| JP | 2017148920 A | 8/2017 |
| JP | 2017197708 A | 11/2017 |
| JP | 6394136 B2 | 9/2018 |
| JP | 2018195620 A | 12/2018 |
| JP | 2019009297 A | 1/2019 |
| JP | 2019512168 A | 5/2019 |
| JP | 6542616 B2 | 7/2019 |
| JP | 6626697 B2 | 12/2019 |
| KP | 20040096537 A | 3/2007 |
| KP | 20160038293 A | 4/2016 |
| KR | 100714196 B1 | 5/2007 |
| KR | 100731112 B1 | 6/2007 |
| KR | 10-2008-0037296 A | 4/2008 |
| KR | 2008052491 A | 6/2008 |
| KR | 20100097893 A | 9/2010 |
| KR | 100997993 B1 | 12/2010 |

(56) References Cited

FOREIGN PATENT DOCUMENTS

| | | |
|---|---|---|
| KR | 101301507 B1 | 9/2013 |
| KR | 20140086375 A | 7/2014 |
| KR | 101494413 B1 | 2/2015 |
| KR | 20160013706 A | 2/2016 |
| KR | 20180113885 A | 10/2018 |
| KR | 101922884 B1 | 11/2018 |
| KR | 20180121893 A | 11/2018 |
| KR | 101975302 B1 | 8/2019 |
| KR | 102012443 B1 | 8/2019 |
| KR | 20210068581 A | 6/2021 |
| TW | 201042019 A | 12/2010 |
| TW | 201511634 A | 3/2015 |
| TW | 201536130 A | 9/2015 |
| TW | I594397 B | 8/2017 |
| TW | 201805400 A | 2/2018 |
| TW | 201824472 A | 7/2018 |
| TW | 201943321 A | 11/2019 |
| TW | 201944533 A | 11/2019 |
| WO | 2011130300 A1 | 10/2011 |
| WO | 2013008415 A1 | 1/2013 |
| WO | 2013126927 A2 | 8/2013 |
| WO | 2014186538 A | 11/2014 |
| WO | 2015126438 A1 | 8/2015 |
| WO | 2016143797 A | 9/2016 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |
| WO | 2019/177742 A1 | 9/2019 |

OTHER PUBLICATIONS

Taiwan Office Action dated Feb. 25, 2022, for Taiwan Patent Application No. 109119795.
PCT International Search Report and Written Opinion dated Aug. 12, 2022 for International Application No. PCT/US2022/026652.
Taiwan Office Action dated Sep. 22, 2022, for Taiwan Patent Application No. 111130159.
Japanese Office Action dated Feb. 28, 2023, for Japanese Patent Application No. 2021-574255.
PCT International Search Report and Written Opinion dated Nov. 4, 2022, for International Application No. PCT/US2022/036724.
Taiwan Office Action dated Jan. 9, 2023, for Taiwan Patent Application No. 109140460.
Japanese Office Action dated Jan. 31, 2023, for Japanese Patent Application No. 2021-566586.
Korean Office Action dated Mar. 10, 2023, for Korean Patent Application No. 10-2021-7040360.
Korean Office Action dated Mar. 10, 2023, for Korean Patent Application No. 10-2021-7040365.
Japanese Office Action dated Feb. 7, 2023, for Japanese Patent Application No. 2021-566585.
Taiwan Office Action issued to Application No. 10914056 on Apr. 27, 2023.
Korean Office Action issued to Patent Application No. 109140506 on May 11, 2023.
Japanese Office Action issued to Patent Application No. 2021-574255 on Sep. 12, 2023.
Japanese Office Action dated Aug. 29, 2023, for Japanese Patent Application No. 2022-529566.
PCT International Search Report and Written Opinion dated Sep. 15, 2023, for International Application No. PCT/US2023/021345.
Office Action for Korean Application No. 10-2022-7001325 dated Nov. 16, 2023.
Taiwan Office Action dated Oct. 17, 2023, for Taiwan Patent Application No. 110138256.
Japanese Office Action dated Dec. 18, 2023 for Japan application No. 2021-574255.
Taiwan Office Action dated Feb. 5, 2024, for Taiwan Patent Application No. 112135866.

Japanese Office Action dated Feb. 27, 2024 for Application No. 2023-501778.
Makoto Fujiwara et al., Extended Abstracts of the 2008 International Conference on SSDM, Tsukuba, 2008, pp. 958-959.
Korean Office Action issued to Patent Application No. 10-2024-7009552 on Apr. 11, 2024.
Chinese Office Action dated Apr. 24, 2024, for Chinese Patent Application No. 2020800340030.
Taiwan Office Action dated Apr. 8, 2024, for Taiwan Patent Application No. 113106910.
Allresist Gmbh—Strausberg et al: "Resist-Wiki: Adhesion promoter HMDS and diphenylsilanedio (AR 300-80)- . . . -Allresist GmbH—Strausberg, Germany", Apr. 12, 2019 (Apr. 12, 2019), XP055663206, Retrieved from the Internet: URL:https://web.archive.org/web/2019041220micals-adhesion-promoter-hmds-and-diphenyl2908/ https://www.allresist.com/process-chemicals-adhesion-promoter-hmds-and-diphenylsilanedio/, [retrieved on Jan. 29, 2020].
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).
Arifur Rahman. "System-Level Performance Evaluation of Three-Dimensional Integrated Circuits", vol. 8, No. 6, Dec. 2000. pp. 671-678.
Baier, T. et al., Theoretical Approach to Estimate Laser Process Parameters for Drilling in Crystalline Silicon, Prog. Photovolt: Res. Appl. 18 (2010) 603-606, 5 pages.
Chien-Wei Chien et al "Chip Embedded Wafer Level Packaging Technology for Stacked RF-SiP Application",2007 IEEE, pp. 305-310.
Chien-Wei Chien et al. "3D Chip Stack With Wafer Through Hole Technology". 6 pages.
Doany, F.E., et al.—"Laser release process to obtain freestanding multilayer metal-polyimide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].
Han, Younggun, et al.—"Evaluation of Residual Stress and Warpage of Device Embedded Substrates with Piezo-Resistive Sensor Silicon Chips" technical paper, Jul. 31, 2015, pp. 81-94.
International Search Report and the Written Opinion for International Application No. PCT/US2019/064280 mailed Mar. 20, 2020, 12 pages.
International Search Report and Written Opinion for Application No. PCT/US2020/026832 dated Jul. 23, 2020.
Italian search report and written opinion for Application No. IT 201900006736 dated Mar. 2, 2020.
Italian Search Report and Written Opinion for Application No. IT 201900006740 dated Mar. 4, 2020.
Junghoon Yeom', et al. "Critical Aspect Ratio Dependence in Deep Reactive Ion Etching of Silicon", 2003 IEEE. pp. 1631-1634.
K. Sakuma et al. "3D Stacking Technology with Low-Volume Lead-Free Interconnections", IBM T.J. Watson Research Center. 2007 IEEE, pp. 627-632.
Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.
Kim et al. "A Study on the Adhesion Properties of Reactive Sputtered Molybdenum Thin Films with Nitrogen Gas on Polyimide

(56) References Cited

OTHER PUBLICATIONS

Substrate as a Cu Barrier Layer," 2015, Journal of Nanoscience and Nanotechnology, vol. 15, No. 11, pp. 8743-8748, doi: 10.1166/jnn.2015.11493.

Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.

Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.

Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.

L. Wang, et al. "High aspect ratio through-wafer interconnections for 3Dmicrosystems", 2003 IEEE. pp. 634-637.

Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.

Liu, C.Y. et al., Time Resolved Shadowgraph Images of Silicon during Laser Ablation: Shockwaves and Particle Generation, Journal of Physics: Conference Series 59 (2007) 338-342, 6 pages.

Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.

NT Nguyen et al. "Through-Wafer Copper Electroplating for Three-Dimensional Interconnects", Journal of Micromechanics and Microengineering. 12 (2002) 395-399. 2002 IOP.

PCT International Search Report and Written Opinion dated Aug. 28, 2020, for International Application No. PCT/US2020/032245.

PCT International Search Report and Written Opinion dated Feb. 17, 2021 for International Application No. PCT/US2020/057787.

PCT International Search Report and Written Opinion dated Feb. 19, 2021, for International Application No. PCT/US2020/057788.

PCT International Search Report and Written Opinion dated Sep. 15, 2020, for International Application No. PCT/US2020/035778.

Ronald Hon et al. "Multi-Stack Flip Chip 3D Packaging with Copper Plated Through-Silicon Vertical Interconnection", 2005 IEEE. pp. 384-389.

S. W. Ricky Lee et al. "3D Stacked Flip Chip Packaging with Through Silicon Vias and Copper Plating or Conductive Adhesive Filling", 2005 IEEE, pp. 798-801.

Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.

Shi, Tailong, et al.—"First Demonstration of Panel Glass Fan-out (GFO) Packages for High I/O Density and High Frequency Multi-chip Integration," Proceedings of 2017 IEEE 67th Electronic Components and Technology Conference, May 30-Jun. 2, 2017, pp. 41-46.

Srinivasan, R., et al.—"Ultraviolet Laser Ablation of Organic Polymers," Chemical Reviews, 1989, vol. 89, No. 6, pp. 1303-1316.

Taiwan Office Action dated Oct. 27, 2020 for Application No. 108148588.

Trusheim, D. et al., Investigation of the Influence of Pulse Duration in Laser Processes for Solar Cells, Physics Procedia Dec. 2011, 278-285, 9 pages.

Wu et al., Microelect. Eng., vol. 87 2010, pp. 505-509.

Yu et al. "High Performance, High Density RDL for Advanced Packaging," 2018 IEEE 68th Electronic Components and Technology Conference, pp. 587-593, DOI 10.1109/ETCC.2018.0009.

Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.

U.S. Office Action dated May 13, 2021, in U.S. Appl. No. 16/870,843.

Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.

Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.

Malta, D., et al.—"Fabrication of TSV-Based Silicon Interposers," 3D Systems Integration Conference (3DIC), 2010 IEEE International, Nov. 16-18, 2010, 6 pages.

Tecnisco, Ltd.—"Company Profile" presentation with product introduction, date unknown, 26 pages.

Wang et al. "Study of Direct Cu Electrodeposition on Ultra-Thin Mo for Copper Interconnect", State key lab of ASIC and system, School of microelectronics, Fudan University, Shanghai, China; 36 pages.

International Search Report and Written Opinion dated Oct. 7, 2021 for Application No. PCT/US2021037375.

PCT International Search Report and Written Opinion dated Oct. 19, 2021, for International Application No. PCT/US2021/038690.

PCT International Search Report and Written Opinion dated Feb. 4, 2022, for International Application No. PCT/US2021/053830.

Chinese Office Action dated Jan. 21, 2025, for Chinese Patent Application No. 202080034003.0.

Taiwan Office Action dated Jul. 17, 2024, for Taiwan Patent Application No. 113106910.

Taiwan Office Action dated Apr. 9, 2025, for Taiwan Patent Application No. 114101294.

\* cited by examiner

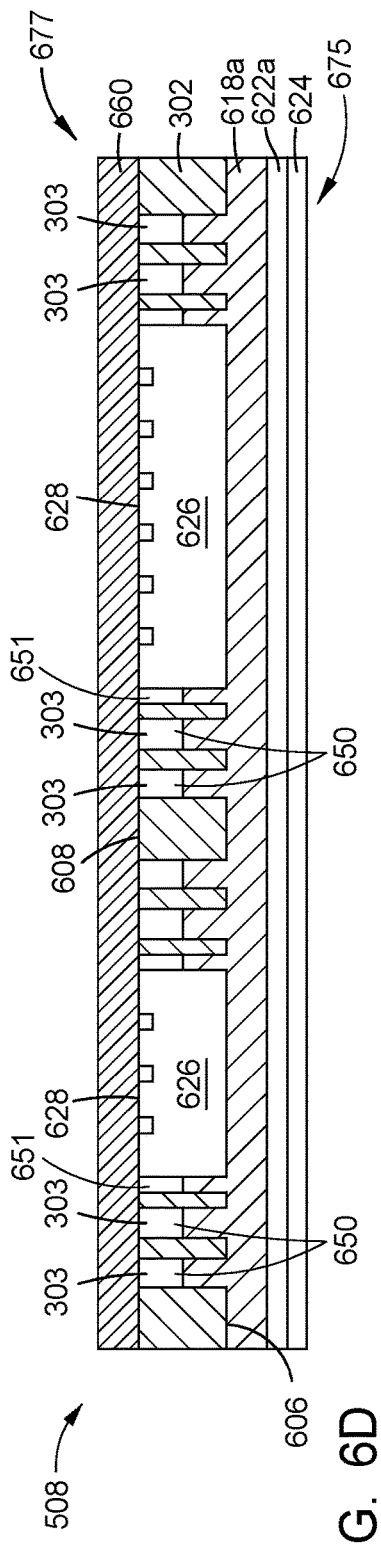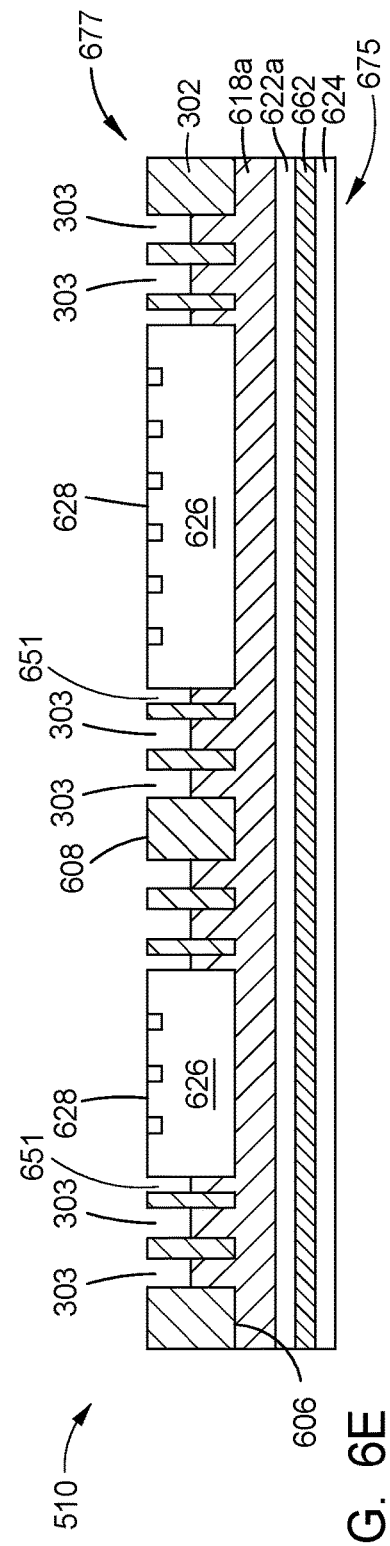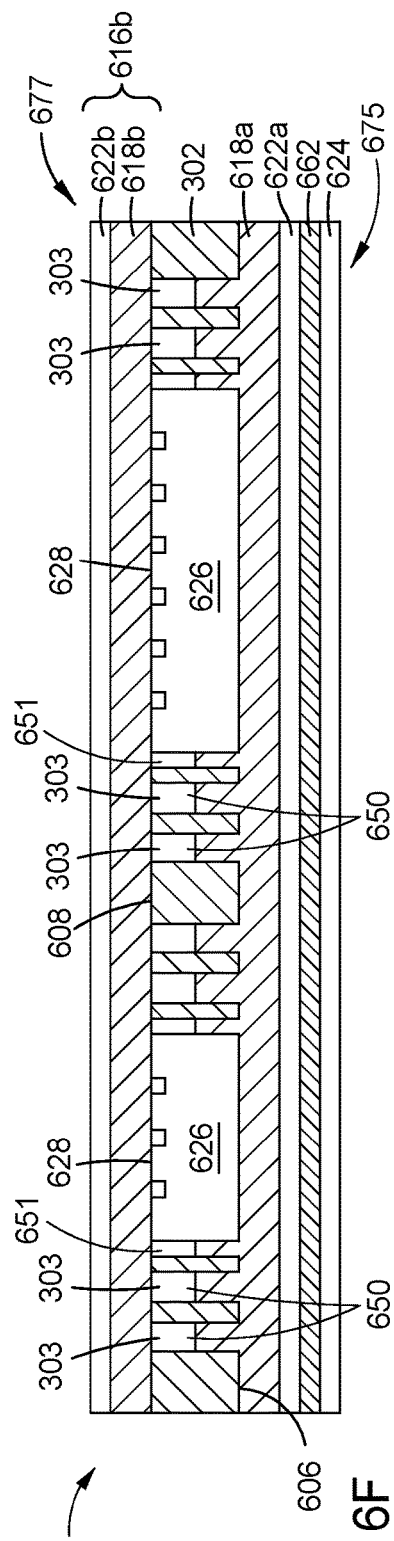

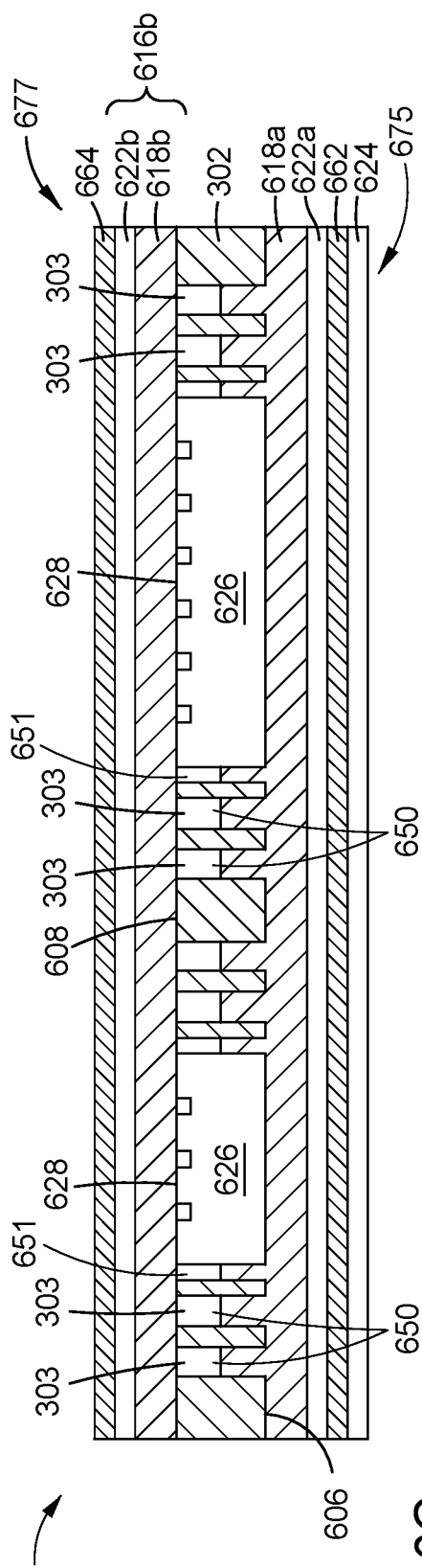
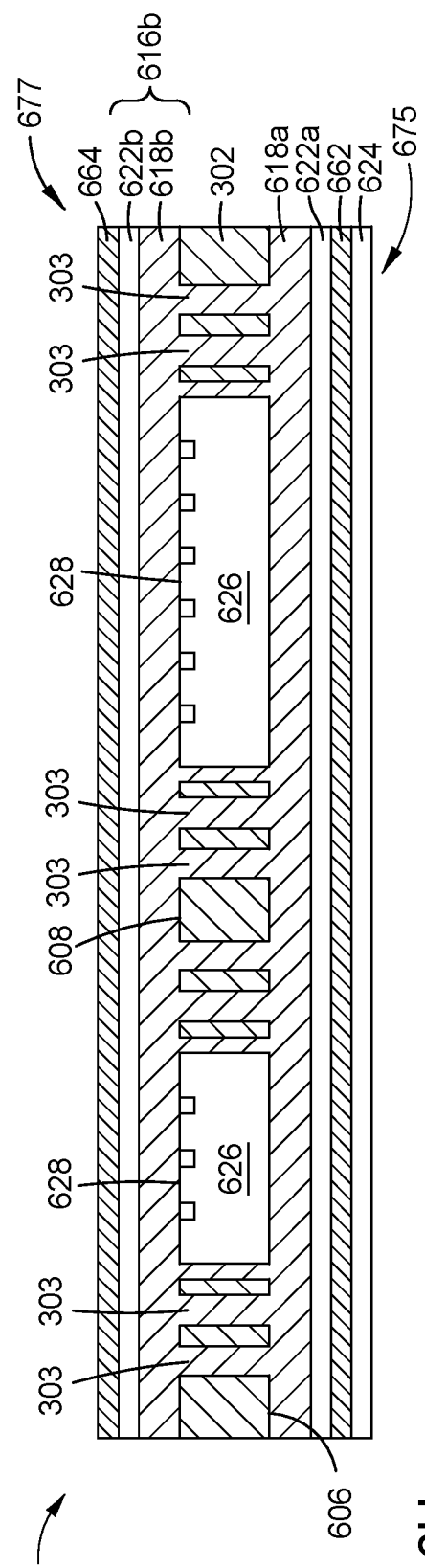
FIG. 6G
FIG. 6H

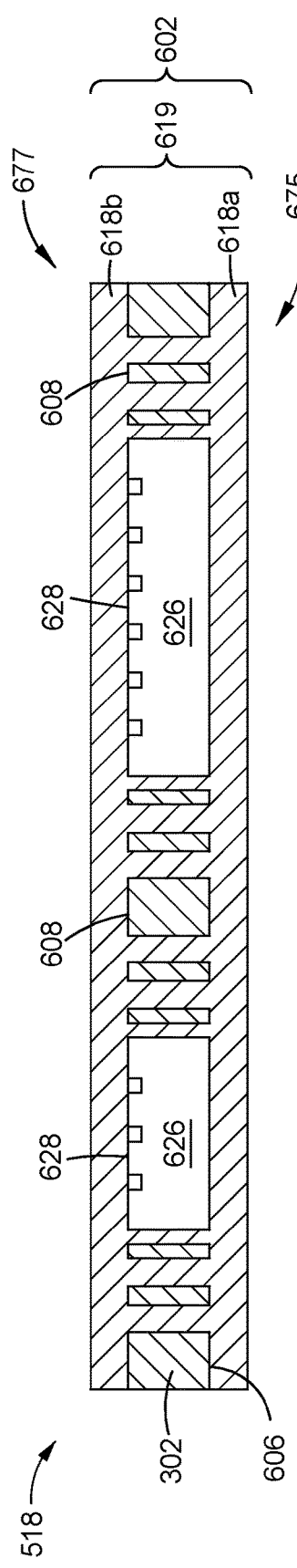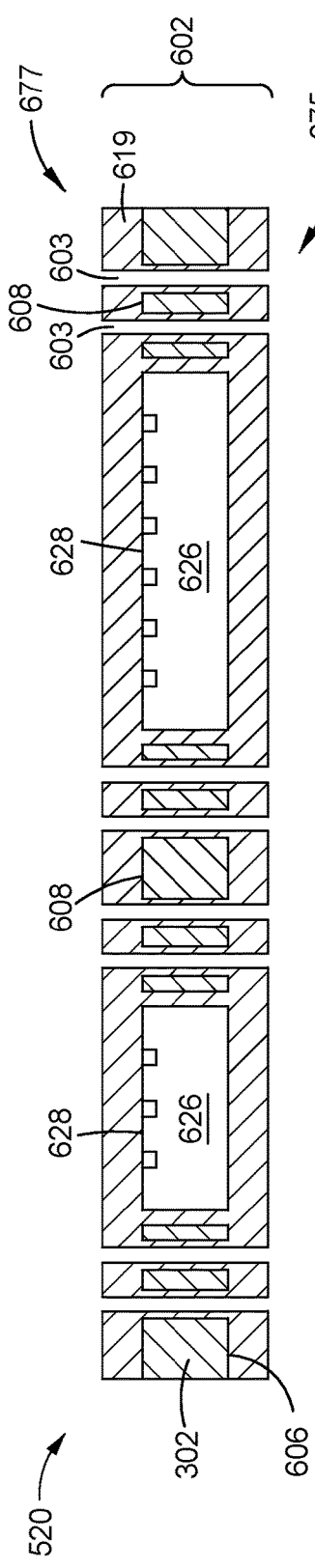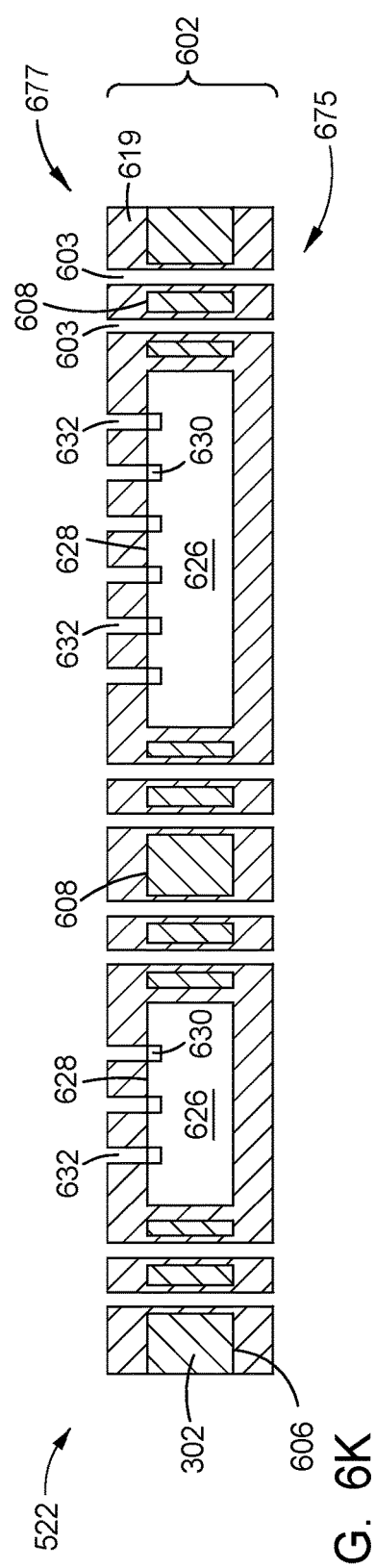

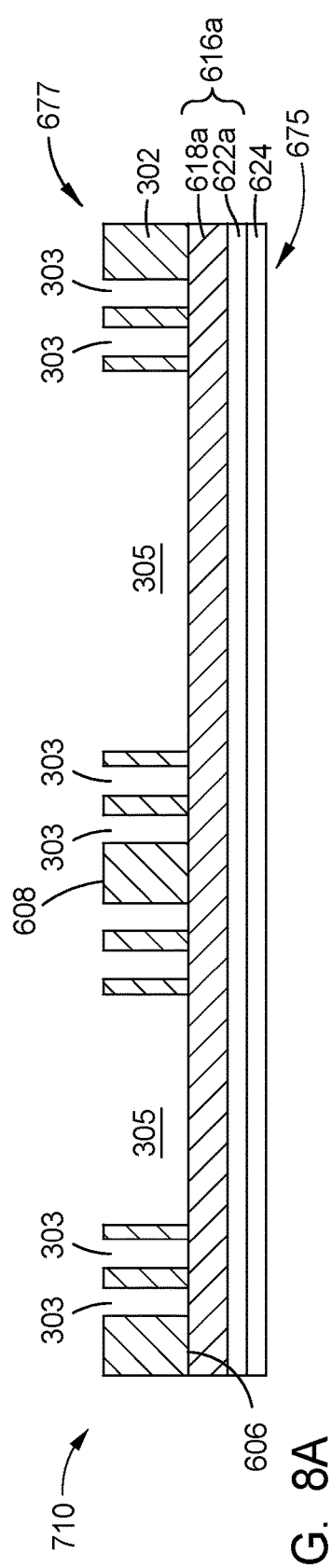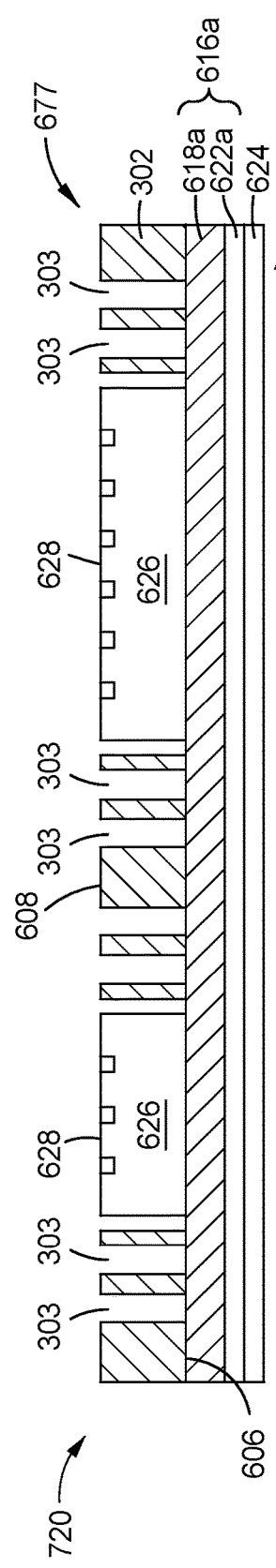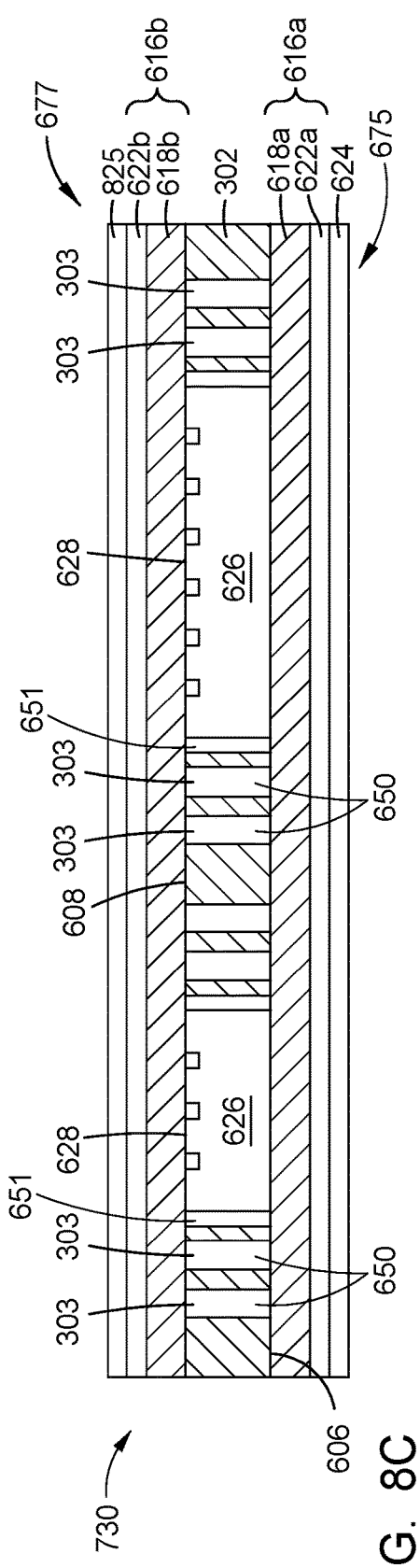
FIG. 8A
FIG. 8B
FIG. 8C

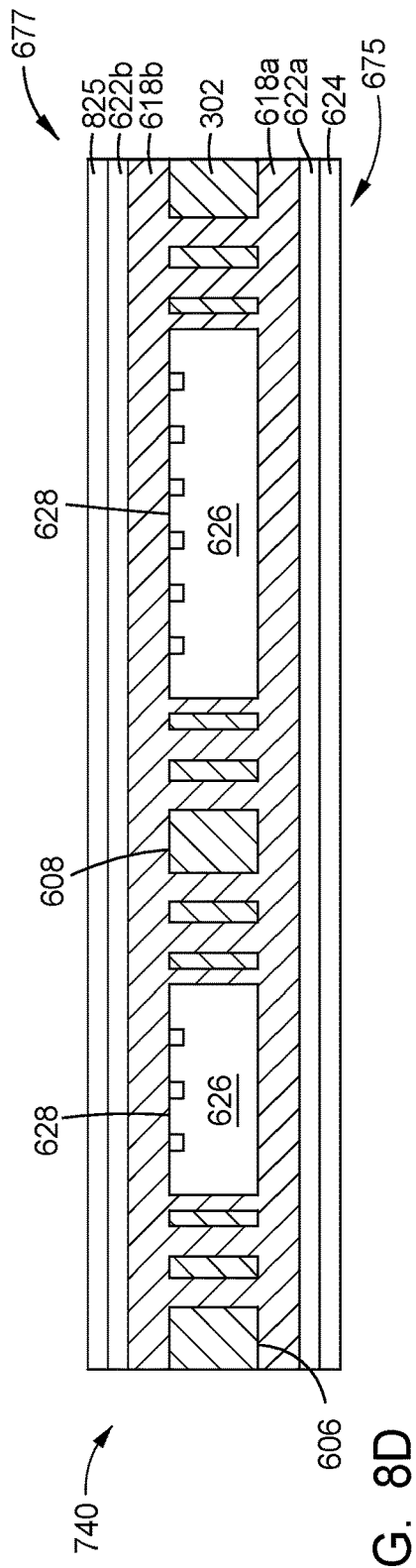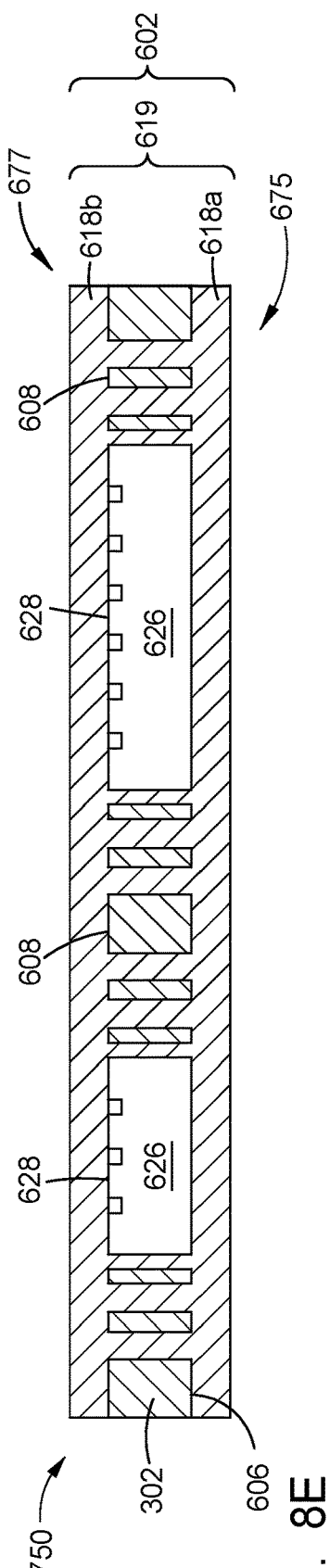
FIG. 8D
FIG. 8E

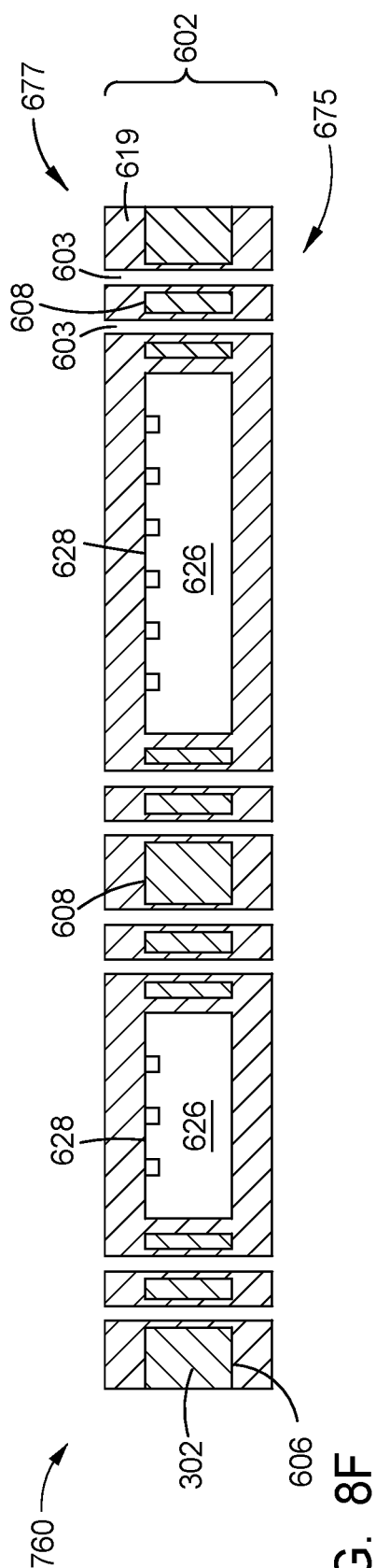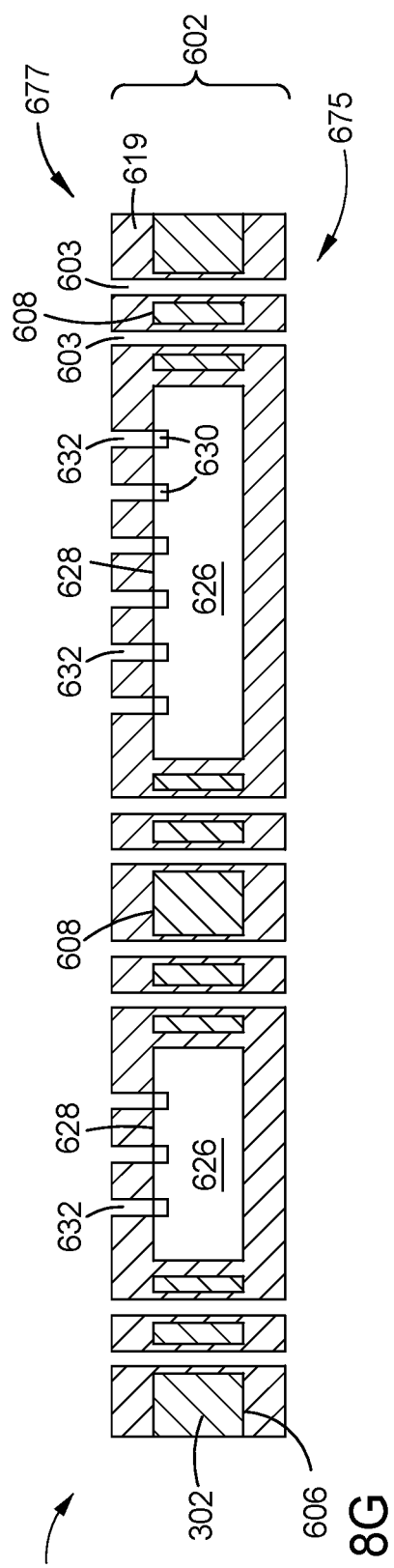
FIG. 8F
FIG. 8G

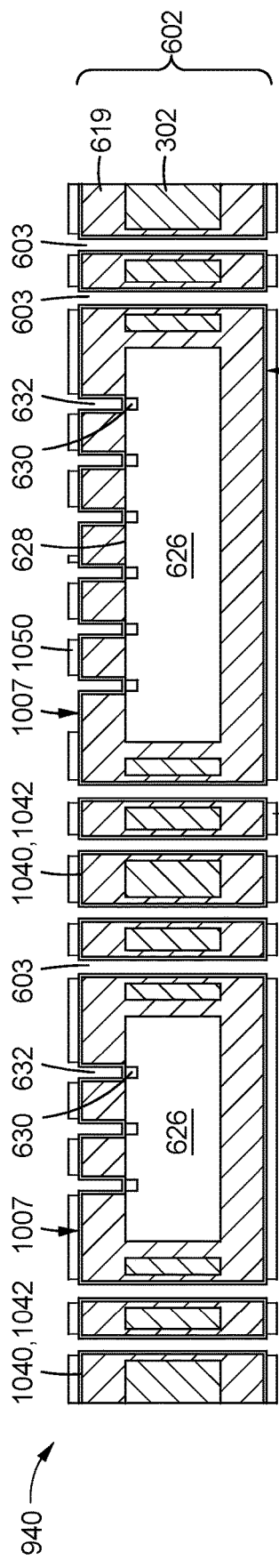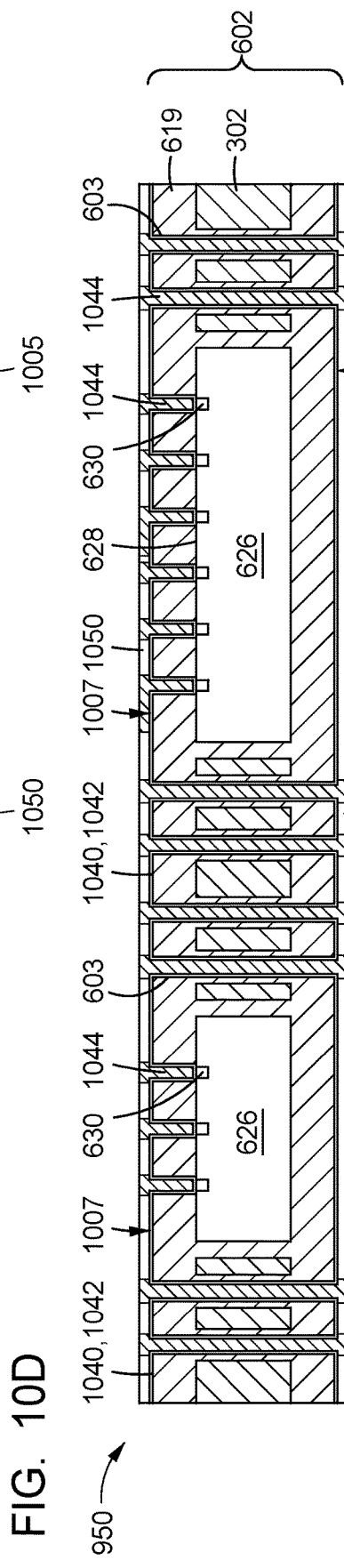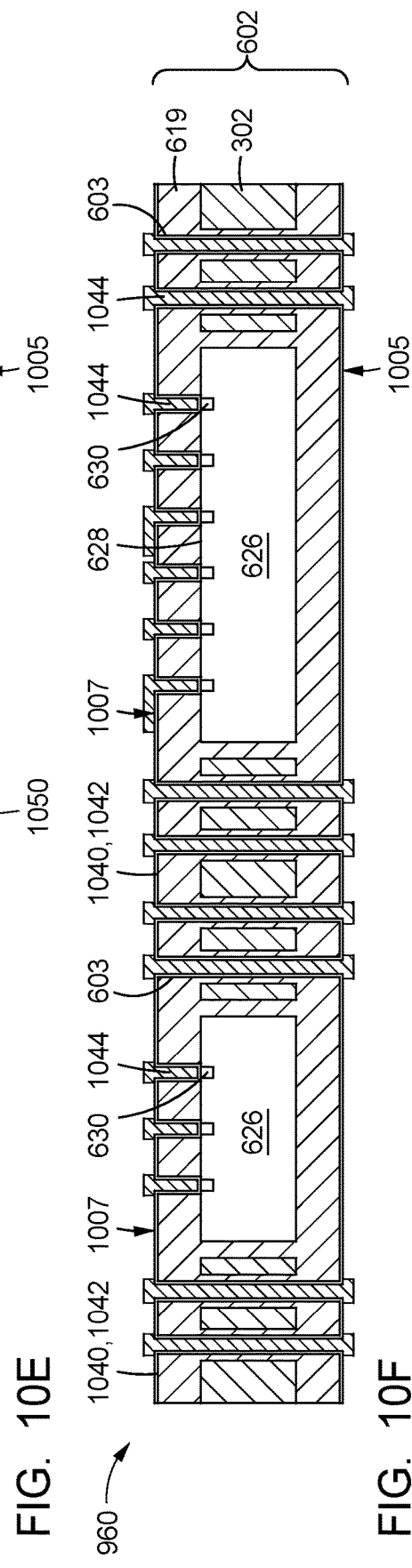
FIG. 10D
FIG. 10E
FIG. 10F

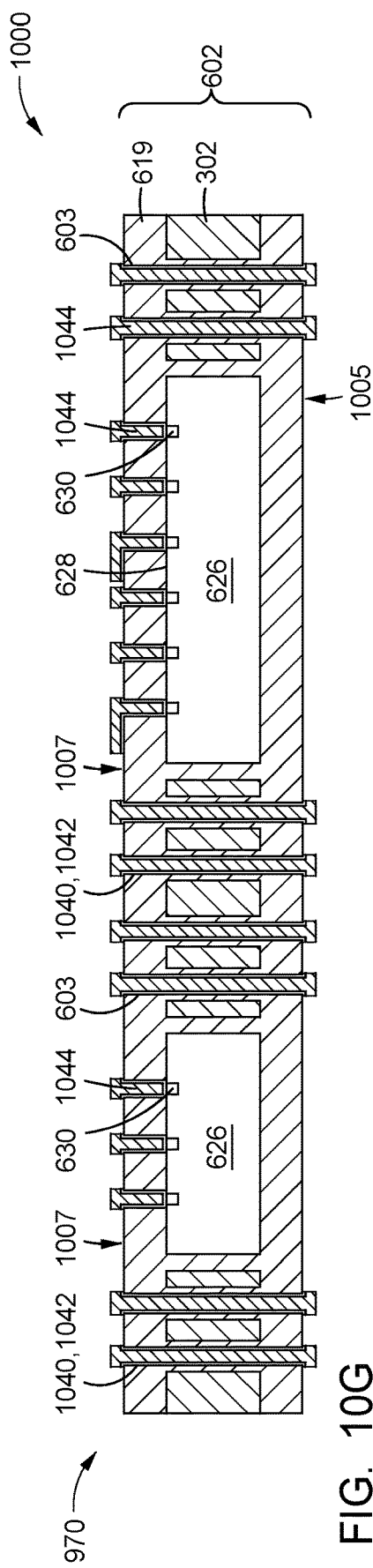
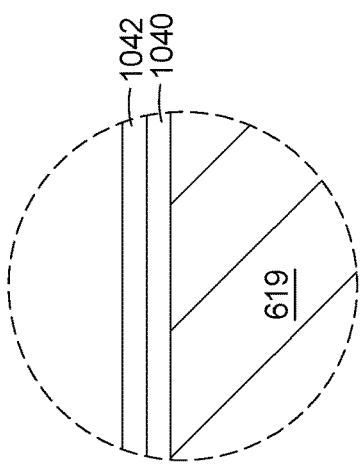
FIG. 10G
FIG. 10H

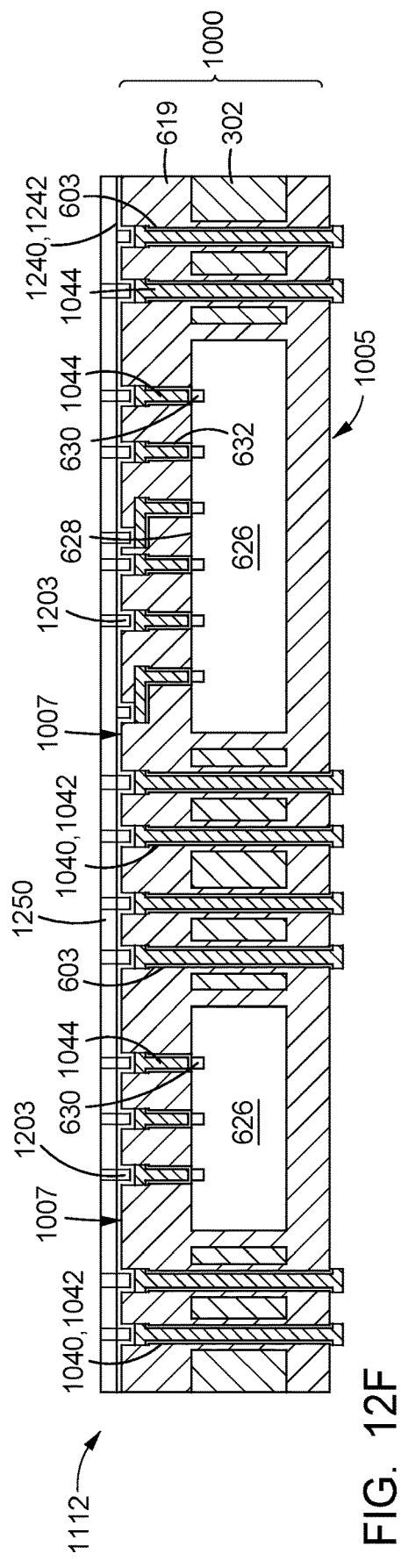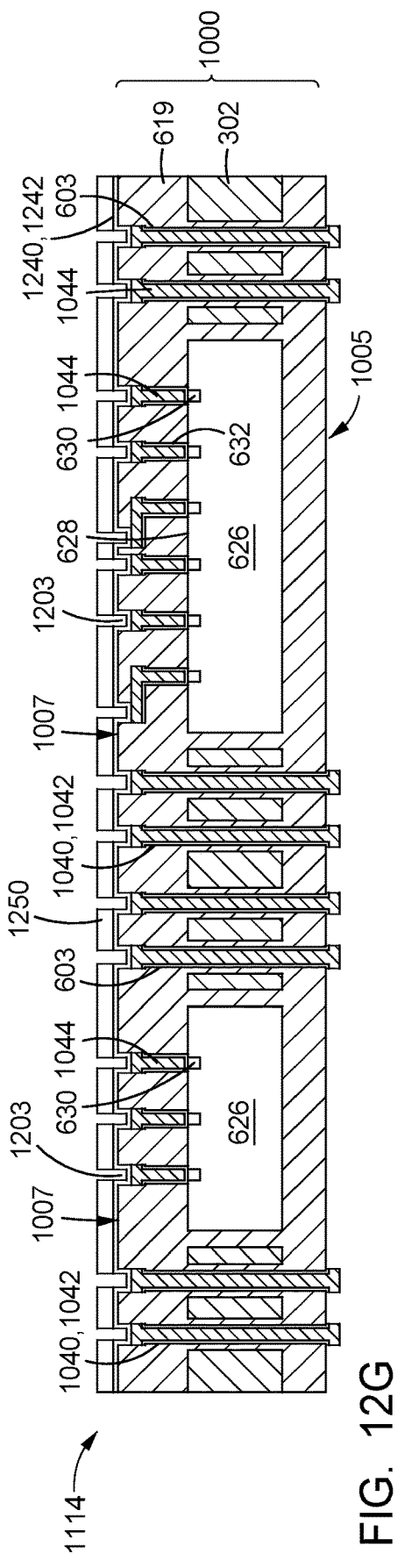
FIG. 12F
FIG. 12G

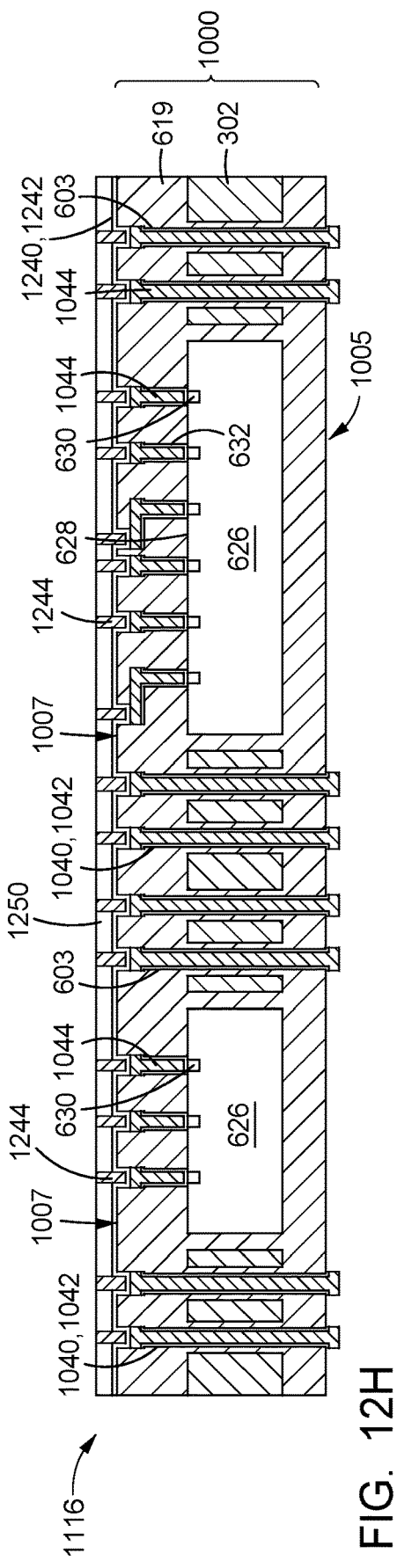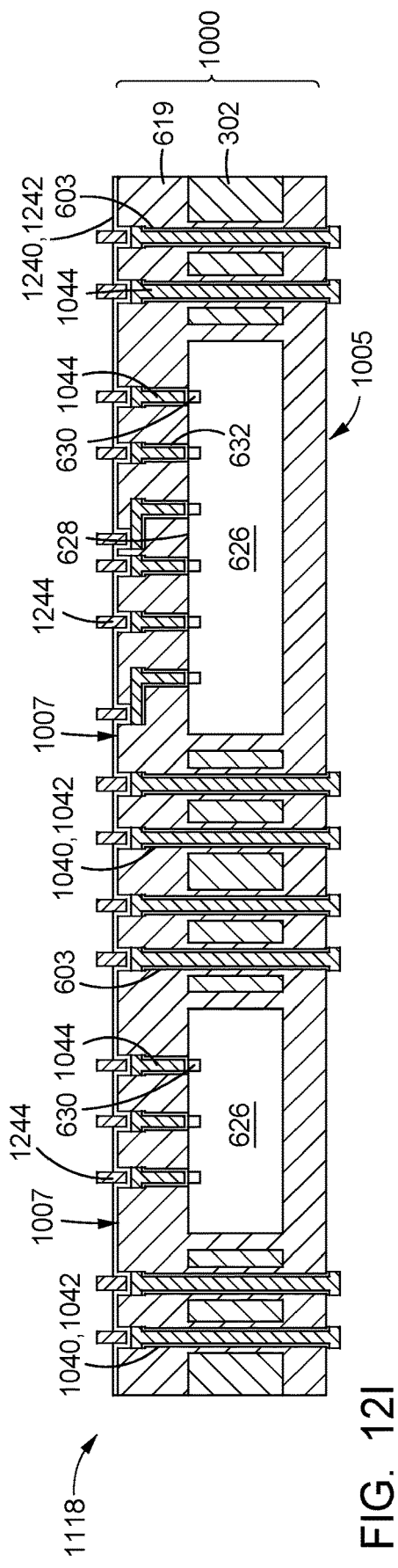
FIG. 12H
FIG. 12I

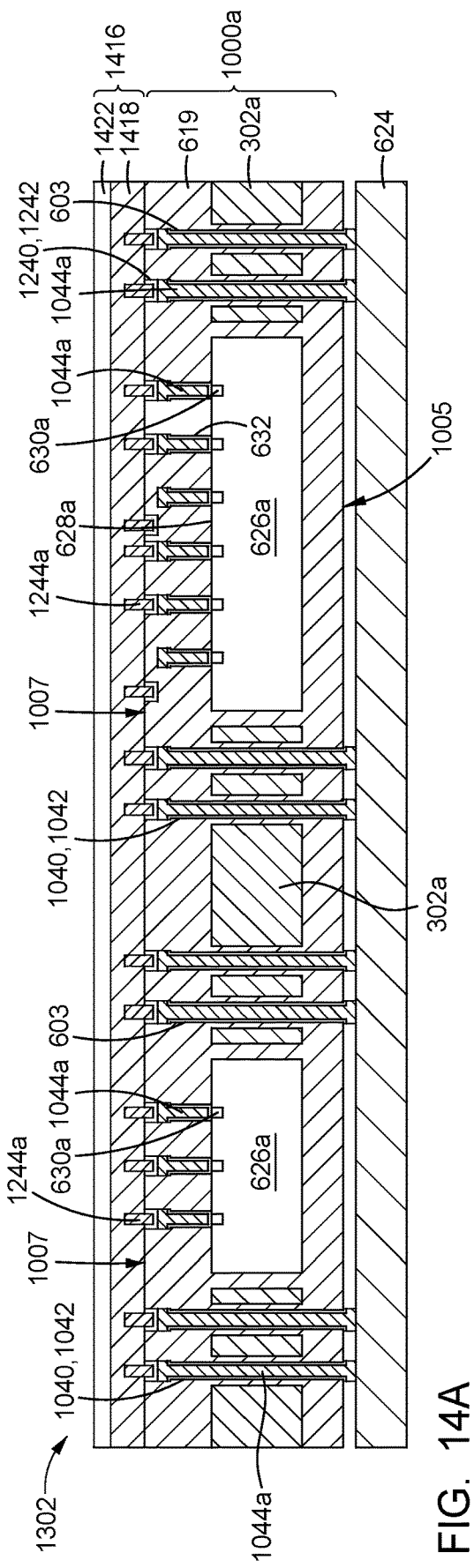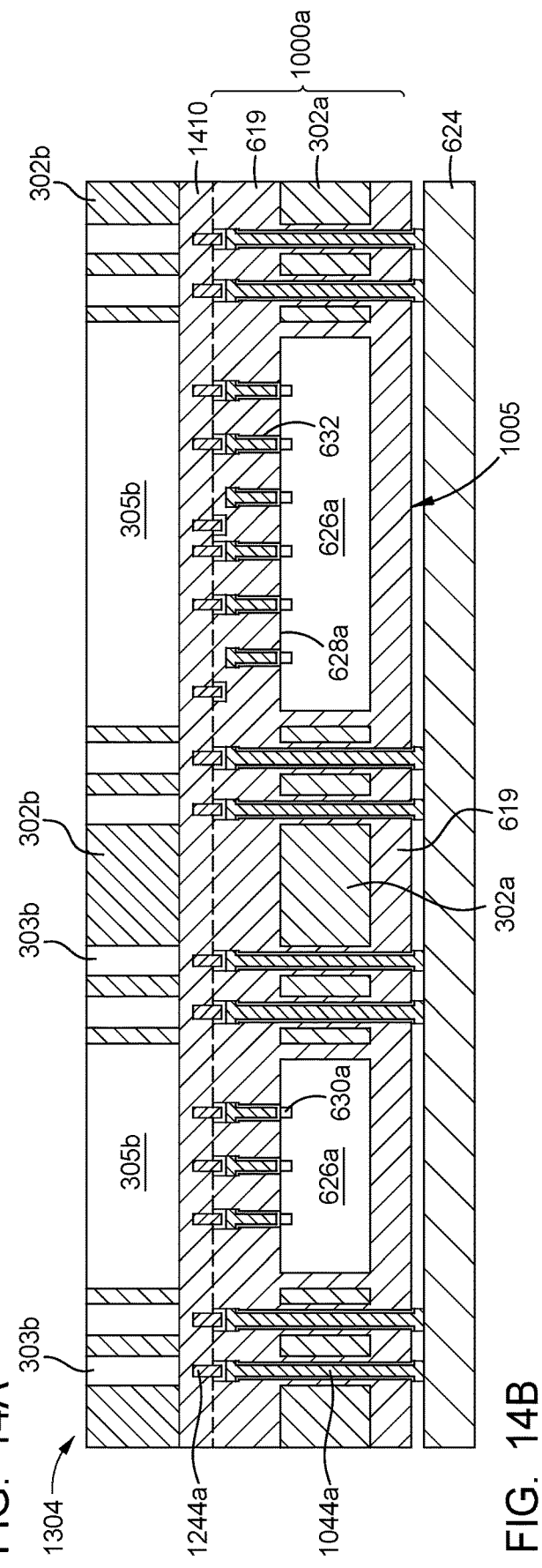
FIG. 14A
FIG. 14B

RECONSTITUTED SUBSTRATE STRUCTURE AND FABRICATION METHODS FOR HETEROGENEOUS PACKAGING INTEGRATION

CROSS-REFERENCE TO RELATED APPLICATIONS

This application is a continuation of U.S. patent application Ser. No. 17/227,983, filed Apr. 12, 2021, now U.S. Pat. No. 11,715,700, which is continuation of U.S. patent application Ser. No. 16/870,843, filed May 8, 2020, now U.S. Pat. No. 11,364,333, which claims priority to Italian patent application number 102019000006736, filed May 10, 2019, each of which is herein incorporated by reference in its entirety.

BACKGROUND

Field

Embodiments of the present disclosure generally relate to the field of semiconductor device manufacturing, and more particularly, to structures and methods of packaging semiconductor devices.

Description of the Related Art

The ever-increasing demand for miniaturized semiconductor devices has led to continuously increasing circuit densities and decreasing device sizes. As a result of the continued scaling of these devices, integrated circuits have evolved into complex 3D devices that can include millions of transistors, capacitors, and resistors on a single chip. 3D integration allows a significant reduction in device footprint and enables ever shorter and faster connections between that device's sub-components, thus improving processing capabilities and speed thereof. These capabilities make 3D integration a desirable technique for the semiconductor device industry to keep pace with Moore's law.

Currently, the 3D device technology landscape includes several general classes of 3D integration processes that vary in the level at which the devices are partitioned into different pieces. Such 3D integration processes include stacked integrated circuit ("SIC") technology, system-in-package ("SiP") technology, and system-on-chip ("SOC") technology. SIC devices are formed by stacking individual semiconductor dies on top of one another. Currently, such SIC devices are achieved by die-to-interposer stacking or die-to-wafer stacking approaches. SiP devices, on the other hand, are formed by stacking packages on top of one another, or by integrating multiple semiconductor dies or devices in a single package. Current approaches to fabricate SiP devices include package-to-package reflow and fan-out wafer level packaging. Lastly, SOCs realize higher density by heterogeneously stacking several different functional partitions of a circuit. Conventionally, these functional circuit partitions are stacked through wafer-to-wafer bonding techniques.

Despite the promise of 3D device technology, current approaches to 3D integration face many challenges. One of the major drawbacks associated with current 3D integration techniques and particularly SiP fabrication processes is sub-optimal thermal management. As a result of the thermal properties of the molding compound materials utilized during conventional packaging manufacturing processes, coefficient of thermal expansion ("CTE") mismatch may occur between the molding compound and any integrated semiconductor device components (e.g., semiconductor dies). The existence of CTE mismatch may cause undesirable repositioning of device components and warpage of wafers and/or even entire integrated packages, thus inducing misalignment between device contacts and via interconnects in any subsequently formed redistribution layers.

Accordingly, there is a need in the art for improved methods of forming reconstituted substrates for packaging schemes.

SUMMARY

The present disclosure generally relates to device packaging processes, and in particular, relates to methods of forming a reconstituted substrate for advanced 3D packaging applications.

In one embodiment, a method of forming a 3D integrated semiconductor device includes positioning a first semiconductor die within at least one cavity formed in a first substrate; disposing a first flowable material over a first surface and a second surface of the first substrate, the first flowable material filling voids formed between surfaces of the semiconductor die and surfaces of the at least one cavity in the first substrate, the first flowable material further disposed on a surface of at least one via formed through the first substrate; forming a first conductive layer in the at least one via through the first substrate, the first flowable material disposed between the first conductive layer and the surface of the at least one via through the first substrate; disposing a second flowable material over a surface of the first flowable material, the second flowable material integrating with the first flowable material; positioning a second substrate on the second flowable material, the second substrate having at least one cavity and at least one via formed therein; positioning a second semiconductor die within the at least one cavity formed in the second substrate; disposing a third flowable material over an exposed surface of the second substrate, the third flowable material filling voids formed between surfaces of the second semiconductor die and surfaces of the at least one cavity in the second substrate, the third flowable material integrating with the second flowable material; and forming a second conductive layer in the at least one via through the second substrate, the third flowable material disposed between the conductive layer and the surface of the at least one via through the second substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 6A-6K schematically illustrate cross-sectional views of the intermediary die assembly at different stages of the process depicted in FIG. 5.

FIGS. 8A-8G schematically illustrate cross-sectional views of the intermediary die assembly at different stages of the process depicted in FIG. 7.

FIGS. 10A-10K schematically illustrate cross-sectional views of the intermediary die assembly at different stages of the interconnection formation process depicted in FIG. 9.

FIGS. 14A-14D schematically illustrate cross-sectional views of a stacked 3D structure at different stages of build-up stacking, as depicted in FIG. 13.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to thin-form-factor reconstituted substrates and methods for forming the same. The reconstituted substrates described herein may be utilized to fabricate homogeneous or heterogeneous high-density 3D integrated devices. In one embodiment, a silicon substrate is structured by laser ablation to include one or more cavities and one or more vias. One or more semiconductor dies of the same or different types may be placed within the cavities and thereafter embedded in the substrate upon formation of an insulating layer thereon. One or more conductive interconnections are formed in the vias and may have contact points redistributed to desired surfaces of the reconstituted substrate. The reconstituted substrate may thereafter be integrated into a stacked 3D device, such as a 3D DRAM stack.

Figure 1:
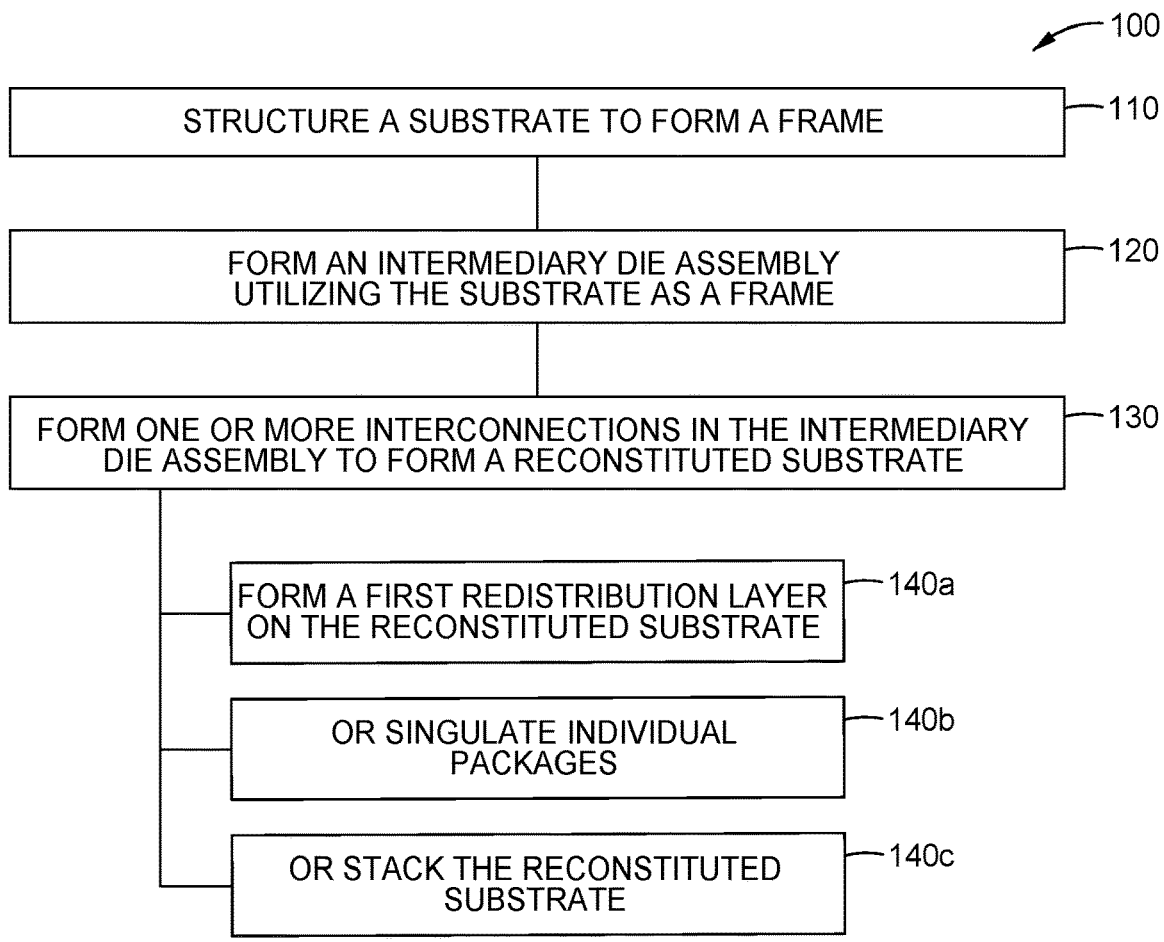
FIG. 1 illustrates a flow diagram of a process for forming a reconstituted substrate, according to embodiments described herein.

FIG. 1 illustrates a flow diagram of a representative method 100 of forming a reconstituted substrate and/or subsequent package, which may be homogeneous or heterogeneous. The method 100 has multiple operations 110, 120, 130, and 140a-140c. Each operation is described in greater detail with reference to FIGS. 2-14D. The method may include one or more additional operations which are carried out before any of the defined operations, between two of the defined operations, or after all of the defined operations (except where the context excludes the possibility).

In general, the method 100 includes structuring a substrate to be used as a frame at operation 110, further described in greater detail with reference to FIGS. 2, 3A-3E, and 4A-4B. At operation 120, an intermediary die assembly having one or more embedded dies and insulating layers is formed, which is described in greater detail with reference to FIGS. 5 and 6A-6K and FIGS. 7 and 8A-8G. One or more interconnections are formed in and/or through the intermediary die assembly to form a functional reconstituted substrate at operation 130, which is described in greater detail with reference to FIGS. 9 and 10A-10K. At operation 140, the reconstituted substrate may then have one or more redistribution layers formed thereon (140a), be singulated into individual packages or systems-in-packages ("SiPs") (140b), and/or be utilized to form a stacked 3D structure (140c). Formation of the redistribution layers is described with reference to FIGS. 11 and 12A-12N. Stacking is described with reference to FIGS. 13 and 14A-20F.

Figure 2:
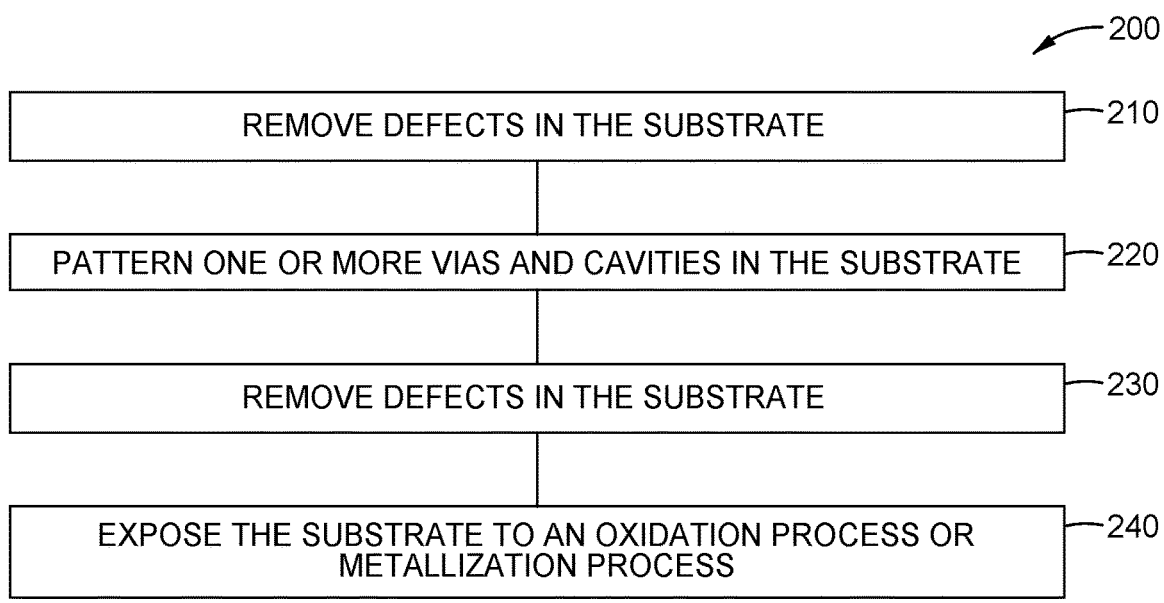
FIG. 2 illustrates a flow diagram of a substrate structuring process during formation of a reconstituted substrate, according to embodiments described herein.

FIG. 2 illustrates a flow diagram of a representative method 200 for structuring a substrate to be utilized as a reconstituted substrate frame. FIGS. 3A-3E schematically illustrate cross-sectional views of a substrate 302 at different stages of the substrate structuring process 200 represented in FIG. 2. Therefore, FIG. 2 and FIGS. 3A-3E are herein described together for clarity.

Figure 3A:
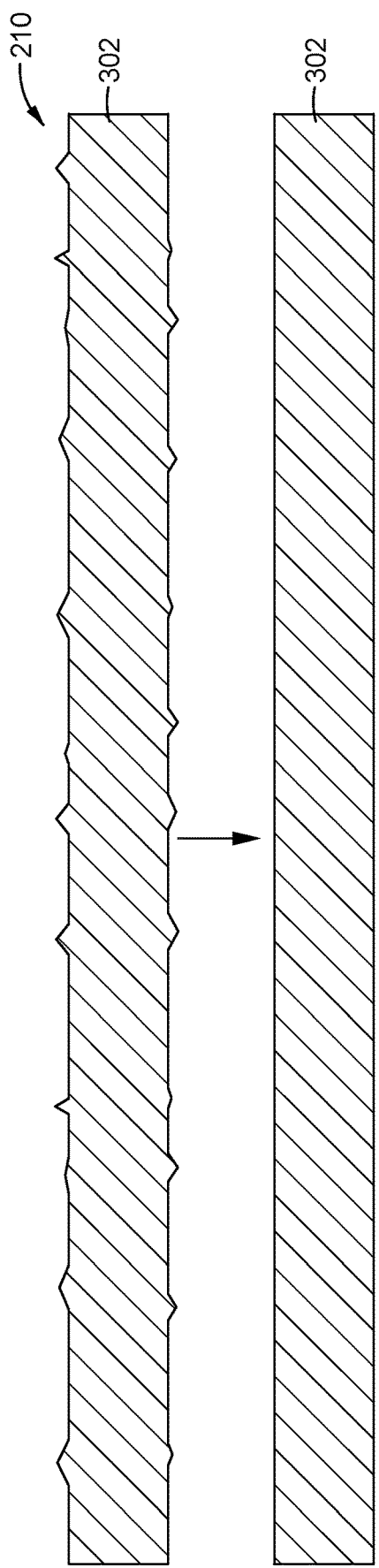
FIGS. 3A-3E schematically illustrate cross-sectional views of a substrate at different stages of the substrate structuring process depicted in FIG. 2.

The method 200 begins at operation 210 and corresponding FIG. 3A, wherein the substrate 302 is exposed to a first defect removal process. The substrate 302 is formed of any suitable substrate material including but not limited to a III-V compound semiconductor material, silicon (e.g., having a resistivity between about 1 and about 10 Ohm-com or conductivity of about 100 W/mK), crystalline silicon (e.g., Si<100> or Si<111>), silicon oxide, silicon germanium, doped or undoped silicon, undoped high resistivity silicon (e.g., float zone silicon having lower dissolved oxygen content and a resistivity between about 5000 and about 10000 ohm-cm), doped or undoped polysilicon, silicon nitride, silicon carbide (e.g., having a conductivity of about 500 W/mK), quartz, glass (e.g., borosilicate glass), sapphire, alumina, and/or ceramic materials. In one embodiment, the substrate 302 is a monocrystalline p-type or n-type silicon substrate. In one embodiment, the substrate 302 is a polycrystalline p-type or n-type silicon substrate. In another embodiment, the substrate 302 is a p-type or n-type silicon solar substrate. The substrate 302 may further have a polygonal or circular shape. For example, the substrate 302 may include a substantially square silicon substrate having lateral dimensions between about 120 mm and about 180 mm, such as about 150 mm or between about 156 mm and about 166 mm, with or without chamfered edges. In another example, the substrate 302 may include a circular silicon-containing wafer having a diameter between about 20 mm and about 700 mm, such as between about 100 mm and about 500 mm, for example about 200 mm or about 300 mm.

Unless otherwise noted, embodiments and examples described herein are conducted on substrates having a thickness between about 50 μm and about 1500 μm, such as between about 90 μm and about 780 μm. For example, the substrate 302 has a thickness between about 100 μm and about 300 μm, such as a thickness between about 110 μm and about 200 μm. In another example, the substrate 302 has a thickness between about 60 μm and about 160 μm, such as a thickness between about 80 μm and about 120 μm.

Prior to operation 210, the substrate 302 may be sliced and separated from a bulk material by wire sawing, scribing and breaking, mechanical abrasive sawing, or laser cutting. Slicing typically causes mechanical defects or deformities in substrate surfaces, such as scratches, micro-cracking, chipping, and other mechanical defects. Thus, the substrate 302 is exposed to the first defect removal process at operation 210 to smoothen and planarize surfaces thereof and remove any mechanical defects in preparation for later structuring and packaging operations. In some embodiments, the substrate 302 may further be thinned by adjusting the process parameters of the first defect removal process. For example, a thickness of the substrate 302 may be decreased with increased (e.g., additional) exposure to the first defect removal process.

In some embodiments, the first defect removal process at operation 210 includes exposing the substrate 302 to a substrate polishing process and/or an etch process followed by rinsing and drying processes. For example, the substrate 302 may be exposed to a chemical mechanical polishing (CMP) process at operation 210. In some embodiments, the etch process is a wet etch process, including a buffered etch process that is selective for the removal of desired materials (e.g., contaminants and other undesirable compounds). In other embodiments, the etch process is a wet etch process utilizing an isotropic aqueous etch process. Any suitable wet etchant or combination of wet etchants may be used for the wet etch process. In one embodiment, the substrate 302 is immersed in an aqueous HF etching solution for etching. In another embodiment, the substrate 302 is immersed in an aqueous KOH etching solution for etching. During the etch process, the etching solution may be heated to a temperature between about 30° C. and about 100° C., such as between about 40° C. and about 90° C., in order to accelerate the etching process. For example, the etching solution is heated to a temperature of about 70° C. during the etch process. In still other embodiments, the etch process at operation 210 is a dry etch process. An example of a dry etch process includes a plasma-based dry etch process.

The thickness of the substrate 302 may be modulated by controlling the time of exposure of the substrate 302 to the polishing process and/or the etchants (e.g., the etching solution) used during the etch process. For example, a final thickness of the substrate 302 may be reduced with increased exposure to the polishing process and/or etchants. Alternatively, the substrate 302 may have a greater final thickness with decreased exposure to the polishing process and/or the etchants.

Figure 3B:
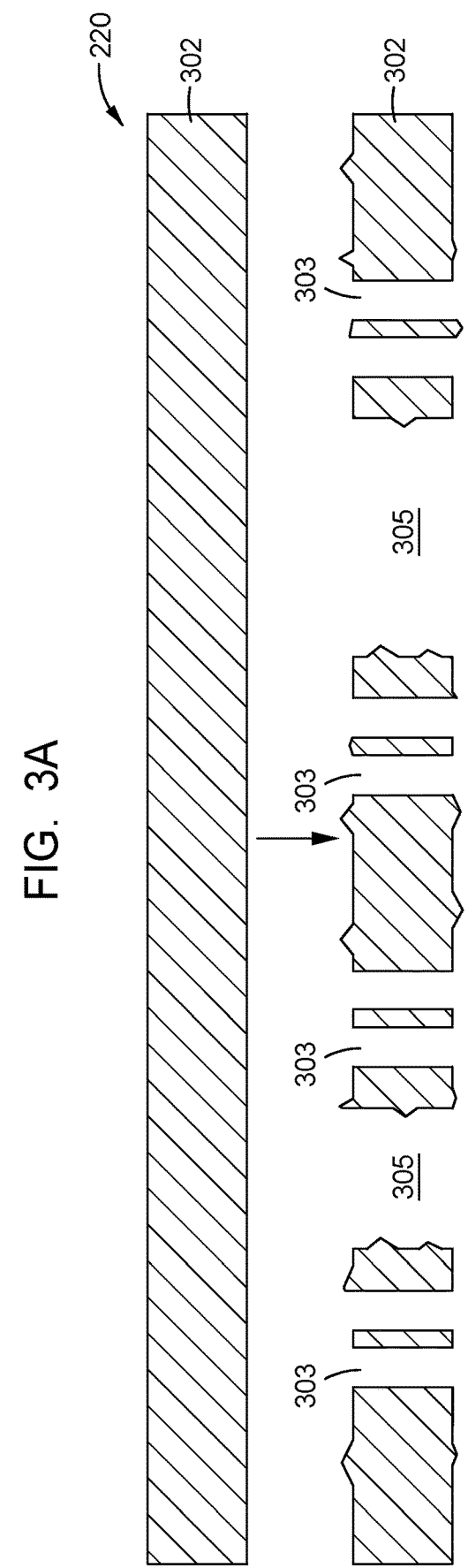

At operations 220 and 230, the now planarized and substantially defect-free substrate 302 has one or more features, such as vias 303 and cavities 305, patterned therein and smoothened (two cavities 305 and eight vias 303 are depicted in the lower cross-section of the substrate 302 in FIG. 3B for clarity). The vias 303 are utilized to form direct contact electrical interconnections through the substrate 302 and the cavities 305 are utilized to receive and enclose (i.e., embed) one or more semiconductor dies or devices therein.

In embodiments where the substrate 302 has a relatively small thickness, such as a thickness less than 200 μm, the substrate 302 may be coupled to a carrier plate (not shown) prior to patterning. For example, where the substrate 302 has a thickness less than about 100 μm, such as a thickness of about 50 μm, the substrate 302 is placed on a carrier plate for mechanical support and stabilization during the substrate structuring processes at operations 220 and 230, thus preventing the substrate 302 from breaking. The carrier plate is formed of any suitable chemically and thermally stable rigid material including but not limited to glass, ceramic, metal, or the like, and has a thickness between about 1 mm and about 10 mm. In some embodiments, the carrier plate has a textured surface to hold the substrate 302 in place during structuring. In other embodiments, the carrier plate has a polished or smooth surface.

The substrate 302 may be coupled to the carrier plate via an adhesive such as wax, glue, or any suitable temporary bonding material which may be applied to the carrier plate by mechanical rolling, pressing, lamination, spin coating, or doctor-blading. In some embodiments, the substrate 302 is coupled to the carrier plate via a water-soluble or solvent-soluble adhesive. In other embodiments, the adhesive is a thermal release or UV release adhesive. For example, the substrate 302 may be released from the carrier plate by exposure to a bake process with temperatures between about 50° C. and about 300° C., such as temperatures between about 100° C. and about 200° C., such as temperatures between about 125° C. and about 175° C.

In one embodiment, a desired pattern is formed in the substrate 302, such as a solar substrate or even a semiconductor wafer, by laser ablation. The laser ablation system utilized to laser drill features in the substrate 302 may include any suitable type of laser source. In some examples, the laser source is an infrared (IR) laser. In some examples the laser source is a picosecond UV laser. In other examples, the laser source is a femtosecond UV laser. In yet other examples, the laser source is a femtosecond green laser. The laser source generates a continuous or pulsed laser beam for patterning of the substrate. For example, the laser source may generate a pulsed laser beam having a frequency between 5 kHz and 500 kHz, such as between 10 kHz and about 200 kHz. In one example, the laser source is configured to deliver a pulsed laser beam at a wavelength of between about 200 nm and about 1200 nm and at a pulse duration between about 10 ns and about 5000 ns with an output power of between about 10 Watts and about 100 Watts. The laser source is configured to form any desired pattern and features in the substrate 302, including the cavities 305 and the vias 303 described above and depicted in FIG. 3B.

Figure 3C:
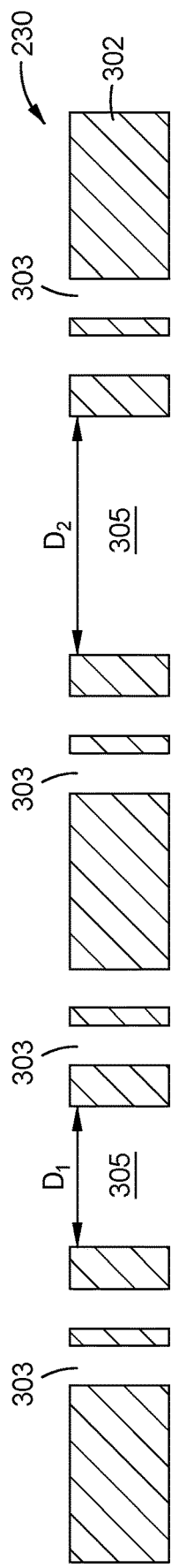

Similar to the process of separating the substrate 302 from the bulk material, the laser patterning of the substrate 302 may cause unwanted mechanical defects on the surfaces of the substrate 302, such as chipping and cracking. Thus, after forming desired features in the substrate 302 by direct laser patterning, the substrate 302 is exposed to a second defect removal and cleaning process at operation 230 substantially similar to the first defect removal process described above. FIGS. 3B and 3C illustrate the structured substrate 302 before and after performing the second damage removal and cleaning process at operation 230, resulting in a smoothened substrate 302 having the cavities 305 and vias 303 formed therein.

During the second damage removal process, the substrate 302 is etched, rinsed, and dried. The etch process proceeds for a predetermined duration to smoothen the surfaces of the substrate 302, and in particular, the surfaces exposed to laser patterning. In another aspect, the etch process is utilized to remove any undesired debris remaining from the laser ablation process. The etch process may be isotropic or anisotropic. In some embodiments, the etch process is a wet etch process utilizing any suitable wet etchant or combination of wet etchants in aqueous solution. For example, the substrate 302 may be immersed in an aqueous HF etching solution or an aqueous KOH etching solution. In some embodiments, the etching solution is heated to further accelerate the etching process. For example, the etching solution may be heated to a temperature between about 40° C. and about 80° C., such as between about 50° C. and about 70° C., such as a temperature of about 60° C. during etching of the substrate 302. In still other embodiments, the etch process at operation 230 is a dry etch process. An example of a dry etch process includes a plasma-based dry etch process.

FIG. 3C illustrates a longitudinal cross-section of the substrate 302 after completion of operations 210-230. The substrate 302 is depicted having two cavities 305 formed therethrough, each cavity 305 surrounded on either side by two vias 303. Furthermore, the two cavities 305 are shown having different lateral dimensions $D_1$ and $D_2$, thus enabling placement of different types of semiconductor devices and/or dies in each cavity during subsequent packaging operations. Accordingly, the cavities 305 may be shaped and sized to accommodate any desired devices and/or dies in any desired arrangement for 2D heterogeneous packaging integration. Although only two cavities and eight vias are depicted in FIGS. 3B-3E, any number and arrangement of cavities and vias may be formed in the substrate while performing the method 200. Top views of additional exemplary arrangements are later described with reference to FIGS. 4A and 4B.

At operation 240, the substrate 302 is then exposed to an optional oxidation or metallization process to grow an oxide layer 314 or a metal cladding layer 315 on desired surfaces thereof after removal of mechanical defects. For example, the oxide layer 314 or metal cladding layer 315 may be formed on all surfaces of the substrate 302 (e.g., including sidewalls of the cavities 305 and vias 303) such that the layer 314 or 315 surrounds the substrate 302.

Figure 3D:
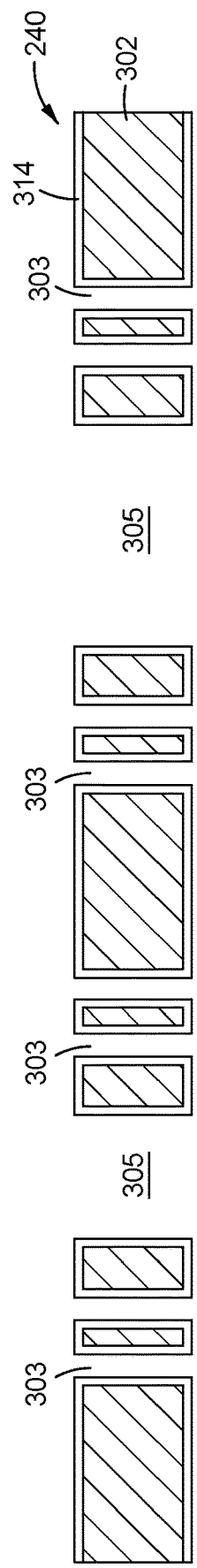
Figure 3E:
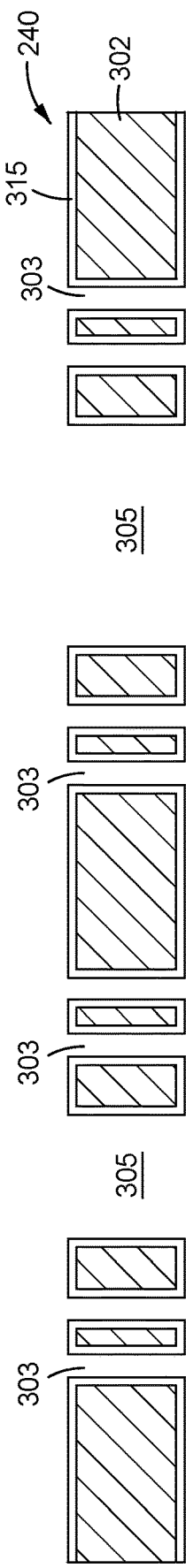

As shown in FIG. 3D, the oxide layer 314 acts as a passivating layer on the substrate 302 and provides a protective outer barrier against corrosion and other forms of damage. In one embodiment, the substrate 302 is exposed to a thermal oxidation process to grow the oxide layer 314 thereon. The thermal oxidation process is performed at a temperature of between about 800° C. and about 1200° C., such as between about 850° C. and about 1150° C. For example, the thermal oxidation process is performed at a temperature of between about 900° C. and about 1100° C., such as a temperature of between about 950° C. and about 1050° C. In one embodiment, the thermal oxidation process is a wet oxidation process utilizing water vapor as an oxidant. In one embodiment, the thermal oxidation process is a dry process utilizing molecular oxygen as the oxidant. It is contemplated that the substrate 302 may be exposed to any suitable oxidation process at operation 240 to form the oxide layer 314 thereon. In some embodiments, the oxide layer 314 is a silicon dioxide film. The oxide layer 314 formed at operation 240 generally has a thickness between about 100 nm and about 3 μm, such as between about 200 nm and about 2.5 μm. For example, the oxide layer 314 has a thickness between about 300 nm and about 2 μm, such as about 1.5 μm.

In embodiments where a metal cladding layer 315 is formed on the substrate 302 (depicted in FIG. 3E), the metal cladding layer 315 acts as a reference layer (e.g., grounding layer or a voltage supply layer). The metal cladding layer 315 is disposed on the substrate 302 to protect subsequently integrated semiconductor devices and connections from electromagnetic interference and shield semiconductor signals from the semiconductor material (Si) that is used to form the substrate 302. In one embodiment, the metal cladding layer 315 includes a conductive metal layer that includes nickel, aluminum, gold, cobalt, silver, palladium, tin, or the like. In one embodiment, the metal cladding layer 315 includes a metal layer that includes an alloy or pure metal that includes nickel, aluminum, gold, cobalt, silver, palladium, tin, or the like. The metal cladding layer 315 generally has thickness between about 50 nm and about 10 μm such as between about 100 nm and about 5 μm.

The metal cladding layer 315 may be formed by any suitable deposition process, including an electroless deposition process, an electroplating process, a chemical vapor deposition process, an evaporation deposition process, and/or an atomic layer deposition process. In certain embodiments, at least a portion of the metal cladding layer 315 includes a deposited nickel (Ni) layer formed by direct displacement or displacement plating on the surfaces of the substrate 302 (e.g., n-Si substrate or p-Si substrate). For example, the substrate 302 is exposed to a nickel displacement plating bath having a composition including 0.5 M $NiSO_4$ and $NH_4OH$ at a temperature between about 60° C. and about 95° C. and a pH of about 11, for a period of between about 2 and about 4 minutes. The exposure of the silicon substrate 302 to a nickel ion-loaded aqueous electrolyte in the absence of reducing agent causes a localized oxidation/reduction reaction at the surface of the substrate 302, thus leading to plating of metallic nickel thereon. Accordingly, nickel displacement plating enables selective formation of thin and pure nickel layers on the silicon material of substrate 302 utilizing stable solutions. Furthermore, the process is self-limiting and thus, once all surfaces of the substrate 302 are plated (e.g., there is no remaining silicon upon which nickel can form), the reaction stops. In certain embodiments, the nickel metal cladding layer 315 may be utilized as a seed layer for plating of additional metal layers, such as for plating of nickel or copper by electroless and/or electrolytic plating methods. In further embodiments, the substrate 302 is exposed to an SC-1 pre-cleaning solution and a HF oxide etching solution prior to a nickel displacement plating bath to promote adhesion of the nickel metal cladding layer 315 thereto.

Figure 4A:
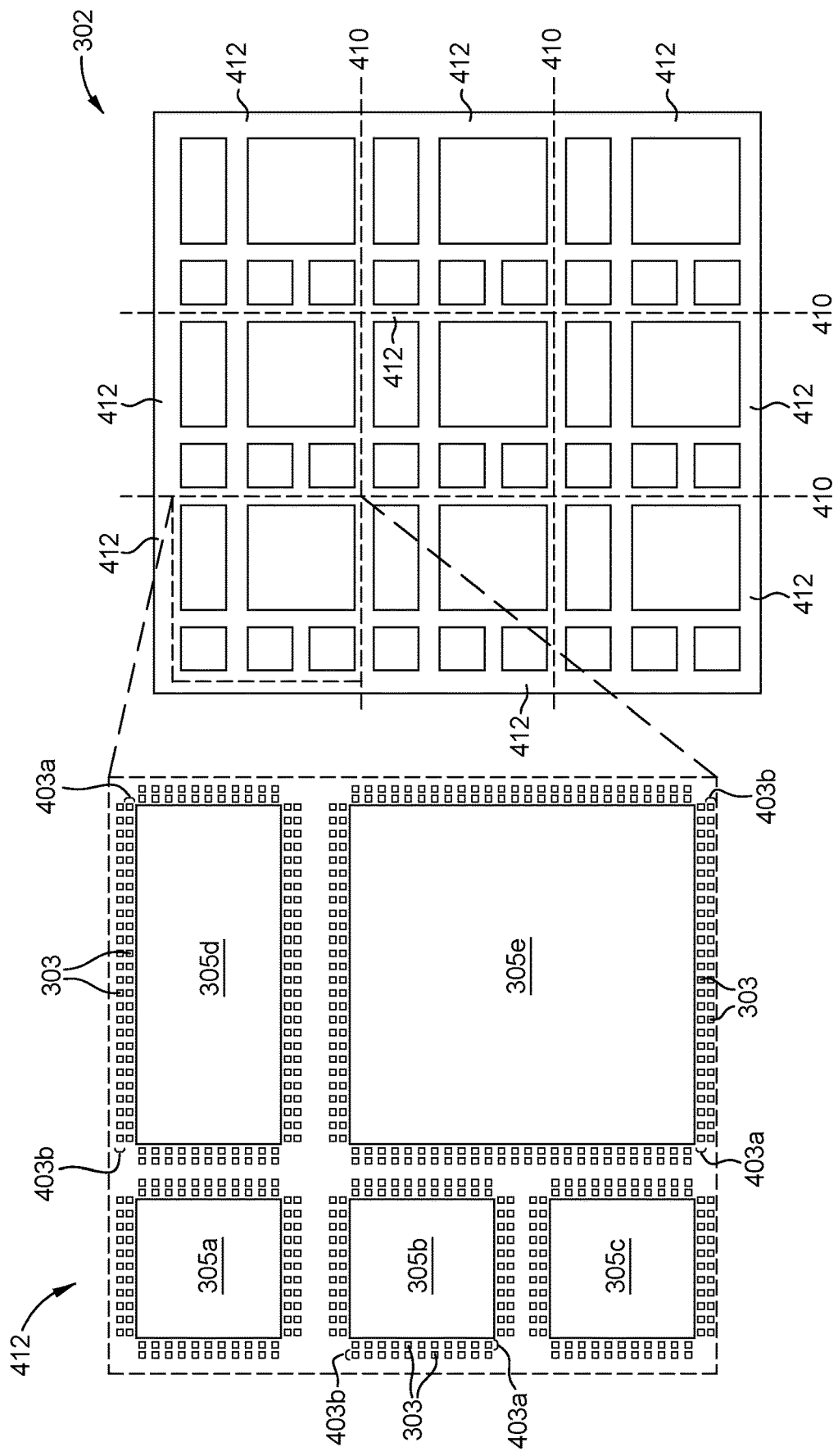
FIGS. 4A-4B illustrate schematic top views of substrates structured with the processes depicted in FIGS. 2 and 3A-3E according to embodiments described herein.

FIG. 4A illustrates a schematic top view of an exemplary pattern that may be formed in the substrate 302, thus enabling the substrate 302 to be utilized as a frame during heterogeneous 2D and 3D packaging integration according to one embodiment. The substrate 302 may be structured during operations 210-240 as described above with reference to FIGS. 2 and 3A-3E. As depicted, the substrate 302 is structured to include nine identical and quadrilateral regions 412 (separated by scribe lines 410) that may be packaged and singulated into nine individual 2D heterogeneous packages or SiPs. Although nine identical regions 412 are shown in FIG. 4A, it is contemplated that any desired number of regions and arrangements of features may be structured into the substrate 302 utilizing the processes described above. In one example, the regions 412 are not identical, and include different features and/or arrangements of features formed therein.

Each region 412 includes five quadrilateral cavities 305a-305e, each cavity 305a-305e surrounded by two rows 403a, 403b of vias 303 along major sides thereof. As depicted, cavities 305a-305c are structured to have substantially similar morphologies and thus, may each accommodate the placement (e.g., integration) of the same type of semiconductor device or die. Cavities 305d and 305e, however, have substantially differing morphologies from each other in addition to that of the cavities 305a-305c and thus, may accommodate the placement of two additional types of semiconductor devices or dies. Accordingly, the structured substrate 302 may be utilized to form a reconstituted substrate for singulation of heterogonous 2D packages or SiPs having three types of semiconductor devices or dies integrated therein. Although depicted as having three types of quadrilateral cavities 305, each region 412 may have more or less than three types of cavities 305 with morphologies other than quadrilateral. For example, each region 412 may have one type of cavity 305 formed therein, thus enabling the formation of homogeneous 2D packages.

In one embodiment, the cavities 305 and vias 303 have a depth equal to the thickness of the substrate 302, thus forming holes on opposing surfaces of the substrate 302 (e.g., through the thickness of the substrate 302). For example, the cavities 305 and the vias 303 formed in the substrate 302 may have a depth of between about 50 μm and about 1 mm, such as between about 100 μm and about 200 μm, such as between about 110 μm and about 190 μm, depending on the thickness of the substrate 302. In other embodiments, the cavities 305 and/or the vias 303 may have a depth equal to or less than the thickness of the substrate 302, thus forming a hole in only one surface (e.g., side) of the substrate 302.

In one embodiment, each cavity 305 has lateral dimensions ranging between about 0.5 mm and about 50 mm, such as between about 3 mm and about 12 mm, such as between about 8 mm and about 11 mm, depending on the size and number of semiconductor devices or dies to be embedded therein during package or reconstituted substrate fabrication. Semiconductor dies generally include a plurality of integrated electronic circuits that are formed on and/or within a substrate material, such as a piece of semiconductor material. In one embodiment, the cavities 305 are sized to have lateral dimensions substantially similar to that of the semiconductor devices or dies to be embedded (e.g., integrated) therein. For example, each cavity 305 is formed having lateral dimensions (i.e., X-direction or Y-direction in FIG. 4A) exceeding those of the semiconductor devices or dies by less than about 150 μm, such as less than about 120 μm, such as less than 100 μm. Having a reduced variance in the size of the cavities 305 and the semiconductor devices or dies to be embedded therein reduces the amount of gap-fill material necessitated thereafter.

Although each cavity 305 is depicted as being surrounded by two rows 403a, 403b of vias 303 along major sides thereof, each region 412 may have different arrangements of vias 303. For example, the cavities 305 may be surrounded by more or less than two rows 403 of vias 303 wherein the vias 303 in each row 403 are staggered and unaligned with vias 303 of an adjacent row 403. In some embodiments, the vias 303 are formed as singular and isolated vias through the substrate 302.

Generally, the vias 303 are substantially cylindrical in shape. However, other morphologies for the vias 303 are also contemplated. For example, the vias 303 may have a tapered or conical morphology, wherein a diameter at a first end thereof (e.g., at one surface of the substrate 302) is larger than a diameter at a second end thereof. Formation of tapered or conical morphologies may be accomplished by moving the laser beam of the laser source utilized during structuring in a spiraling (e.g., circular, corkscrew) motion relative to the central axis of each of the vias 303. The laser beam may also be angled using a motion system to form tapered vias 303. The same methods may also be utilized to form cylindrical vias 303 having uniform diameters therethrough.

In one embodiment, each via 303 has a diameter ranging between about 20 μm and about 200 μm, such as between about 50 μm and about 150 μm, such as between about 60 μm and about 130 μm, such as between about 80 μm and 110 μm. A minimum pitch between centers of the vias 303 is between about 70 μm and about 200 μm, such as between about 85 μm and about 160 μm, such as between about 100 μm and 140 μm. Although embodiments are described with reference to FIG. 4A, the substrate structuring processes described above with reference to operations 210-240 and FIGS. 2 and 3A-3E may be utilized to form patterned features in the substrate 302 having any desired depth, lateral dimensions, and morphologies.

Figure 4B:
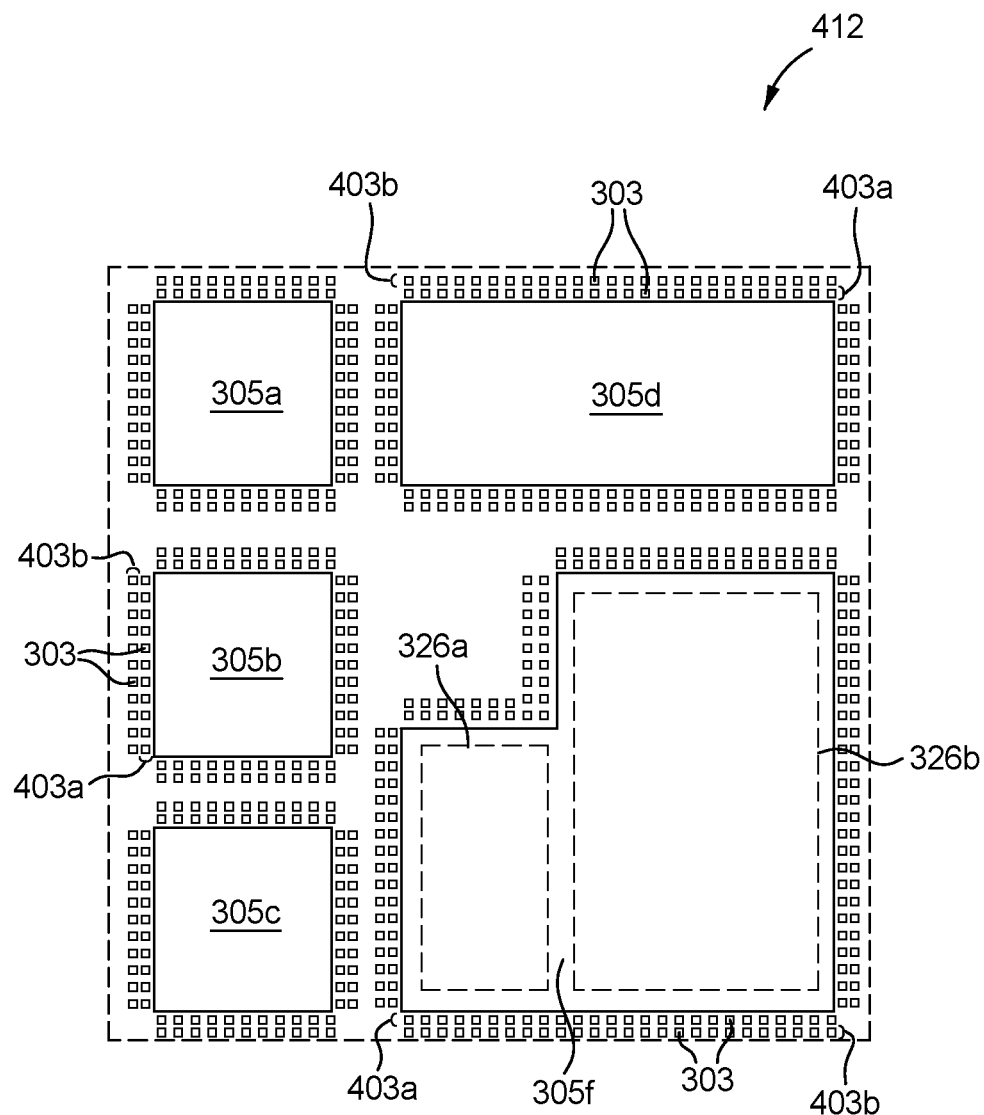

FIG. 4B illustrates a schematic top view of the region 412 with another exemplary pattern that may be formed in the substrate 302. In certain embodiments, it may be desirable to place two or more semiconductor dies of the same or different types in a single cavity 305 during packaging, with each semiconductor die having the same or different dimensions and/or shapes. Accordingly, in some examples, a cavity 305 may have an irregular or asymmetrical shape to accommodate semiconductor dies having different dimensions and/or shapes. As depicted in FIG. 4B, the region 412 includes four quadrilateral and symmetrical cavities 305a-d and a single asymmetrical cavity 305f. The cavity 305f is shaped to accommodate two semiconductor dies 326a and 326b (shown in phantom) having different dimensions. Although only one asymmetrical cavity 305f is depicted for accommodating two semiconductor dies 326a and 326b in FIG. 4B, it is contemplated that each region 412 may include more or less than one asymmetrical cavity 305 for accommodating any desired number of side-by-side dies having any suitable dimensions and shapes.

Figure 5:
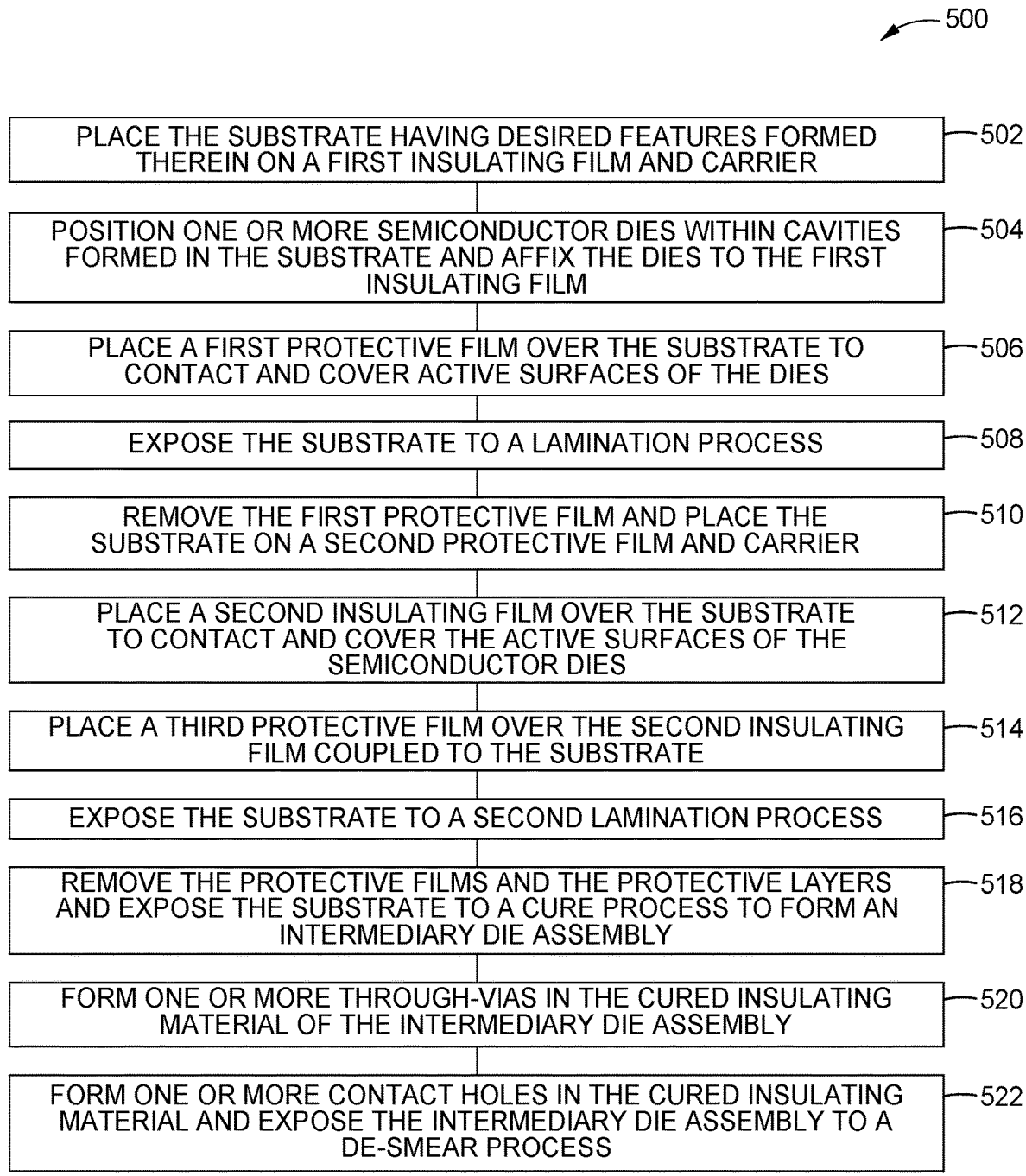
FIG. 5 illustrates a flow diagram of a process for forming an intermediary die assembly having through-assembly vias and contact holes, according to embodiments described herein.

After structuring, the substrate 302 may be utilized as a frame to form a reconstituted substrate in subsequent packaging operations. FIGS. 5 and 7 illustrate flow diagrams of representative methods 500 and 700, respectively, for fabricating an intermediary die assembly 602 around the substrate 302 prior to completed (e.g., final) reconstituted substrate formation. FIGS. 6A-6K schematically illustrate cross-sectional views of the substrate 302 at different stages of the method 500 depicted in FIG. 5, and are herein described together with FIG. 5 for clarity. Similarly, FIGS. 8A-8G schematically illustrate cross-sectional views of the substrate 302 at different stages of the method 700 depicted in FIG. 7, and are herein described together with FIG. 7.

Figure 6A:
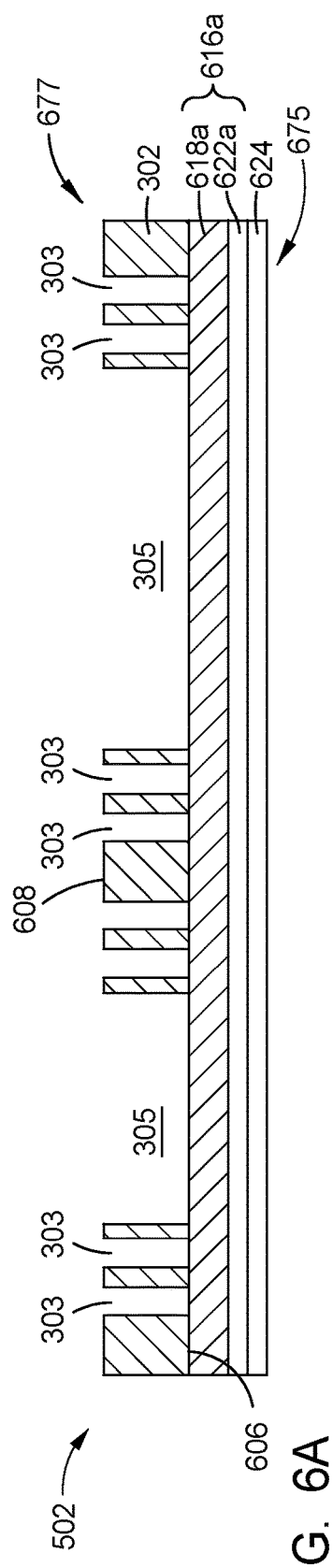
Figure 7:
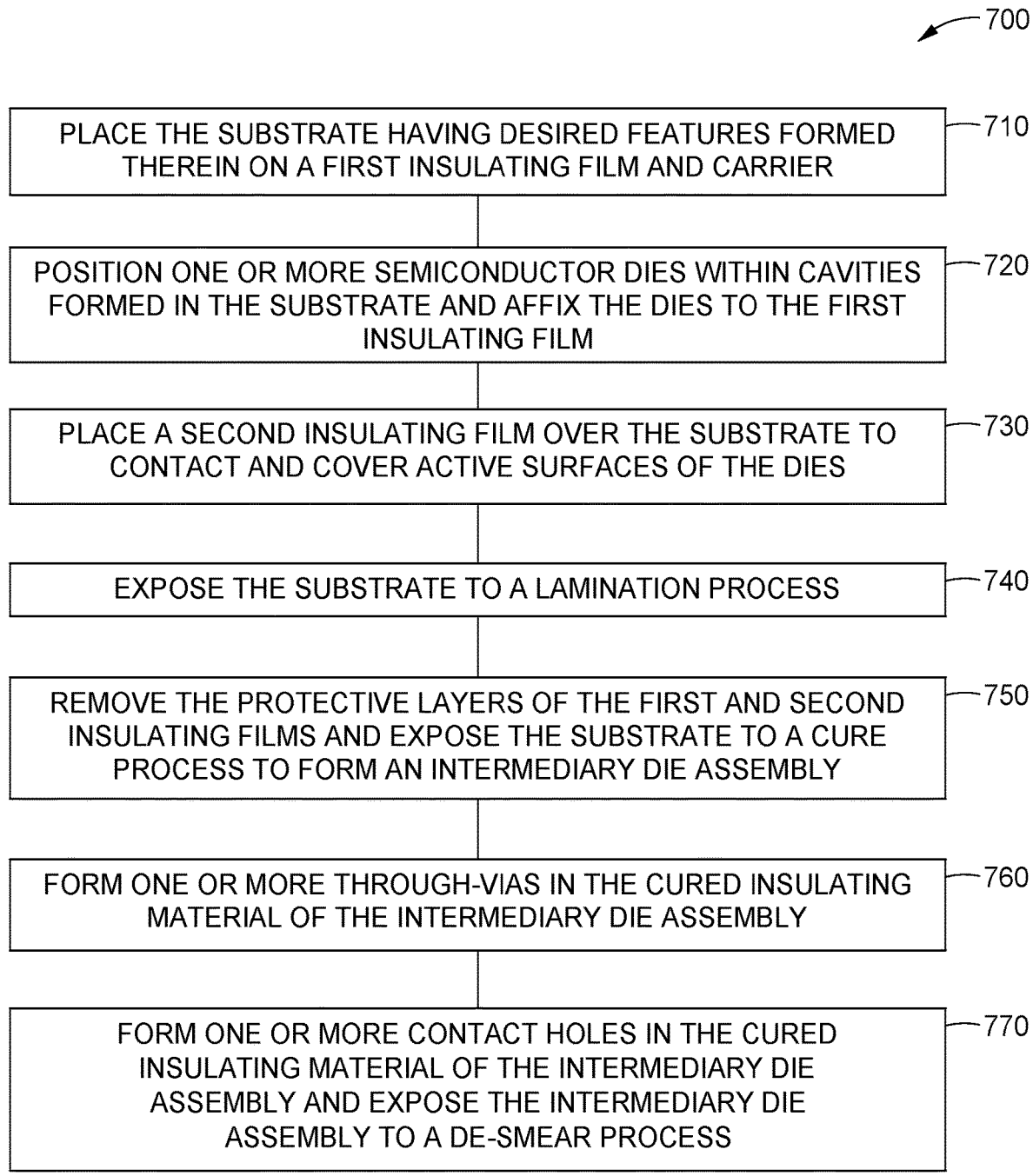
FIG. 7 illustrates a flow diagram of a process for forming an intermediary die assembly having through-assembly vias and contact holes, according to embodiments described herein.

Generally, the method 500 begins at operation 502 and FIG. 6A, wherein a first side 675 (e.g., a first major surface 606) of the substrate 302, now having desired features formed therein, is placed on a first insulating film 616a. In one embodiment, the first insulating film 616a includes one or more layers 618a formed of flowable and polymer-based dielectric materials, such as an insulating build-up material. In the embodiment depicted in FIG. 6A, the first insulating film 616a includes a flowable layer 618a formed of an epoxy resin. For example, the flowable layer 618a may be formed of a ceramic-filler-containing epoxy resin, such as an epoxy resin filled with (e.g., containing) substantially spherical silica ($SiO_2$) particles. As used herein, the term "spherical" refers to any round, ellipsoid, or spheroid shape. For example, in some embodiments, the ceramic fillers may have an elliptic shape, an oblong oval shape, or other similar round shape. However, other morphologies are also contemplated. Other examples of ceramic fillers that may be utilized to form the flowable layer 618a and other layers of the insulating film 616a include aluminum nitride (AlN), aluminum oxide ($Al_2O_3$), silicon carbide (SiC), silicon nitride ($Si_3N_4$), $Sr_2Ce_2Ti_5O_{16}$ ceramics, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like.

In some examples, the ceramic fillers utilized to form the flowable layer 618a have particles ranging in size between about 40 nm and about 1.5 µm, such as between about 80 nm and about 1 µm. For example, the ceramic fillers utilized to form the flowable layer 618a have particles ranging in size between about 200 nm and about 800 nm, such as between about 300 nm and about 600 nm. In some embodiments, the ceramic fillers include particles having a size less than about 25% of a width or diameter of the features (e.g., via, cavity, or through-assembly via) formed in the substrate, such as less than about 15% of a desired feature's width or diameter.

The flowable layer 618a typically has a thickness less than about 60 µm, such as between about 5 µm and about 50 µm. For example, the flowable layer 618a has a thickness between about 10 µm and about 25 µm. In one embodiment, the insulating film 616a may further include one or more protective layers. For example, the insulating film 616a includes a polyethylene terephthalate (PET) protective layer 622a. However, any suitable combination of layers and insulating materials is contemplated for the insulating film 616a. In some embodiments, the entire insulating film 616a has a thickness less than about 120 µm, such as a thickness less than about 90 µm.

The substrate 302, which is coupled to the insulating film 616a on the first side 675 thereof, and specifically to the flowable layer 618a of the insulating film 616a, may further be optionally placed on a carrier 624 for mechanical support during later processing operations. The carrier 624 is formed of any suitable mechanically and thermally stable material. For example, the carrier 624 is formed of polytetrafluoroethylene (PTFE). In another example, the carrier 624 is formed of PET.

Figure 6B:
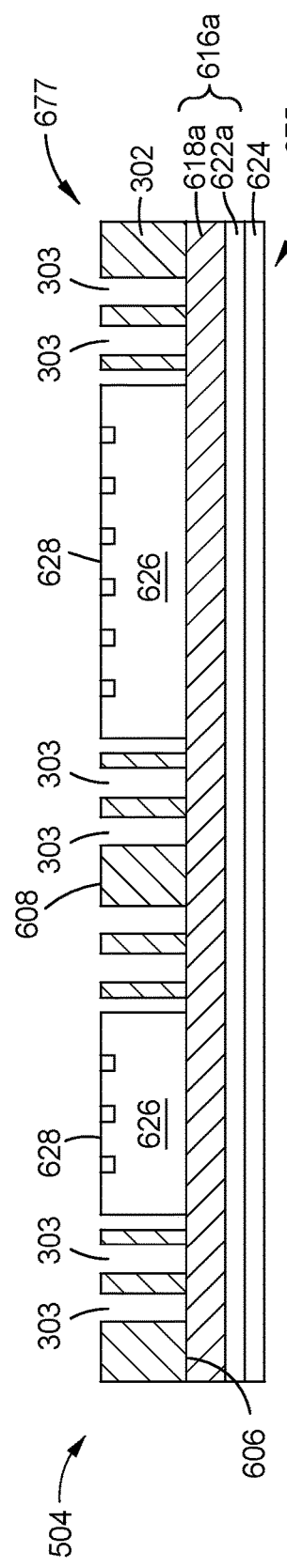

At operation 504 and depicted in FIG. 6B, one or more semiconductor dies 626 are placed within the cavities 305 formed in the substrate 302 so that the semiconductor dies 626 are now bound by the insulating film 616a on one side (two semiconductor dies 626 are depicted in FIG. 6B). In one embodiment, the semiconductor dies 626 are multipurpose dies having integrated circuits formed on active surfaces 628 thereof. In one embodiment, the semiconductor dies 626 are the same type of semiconductor devices or dies. In another embodiment, the semiconductor dies 626 are different types of semiconductor devices or dies. The semiconductor dies 626 are placed within the cavities 305 (e.g., cavities 350a-305e of FIG. 4) and positioned onto a surface of the insulating film 616a exposed through the cavities 305. In one embodiment, the semiconductor dies 626 are placed on an optional adhesive layer (not shown) disposed or formed on the insulating film 616a.

Figure 6C:
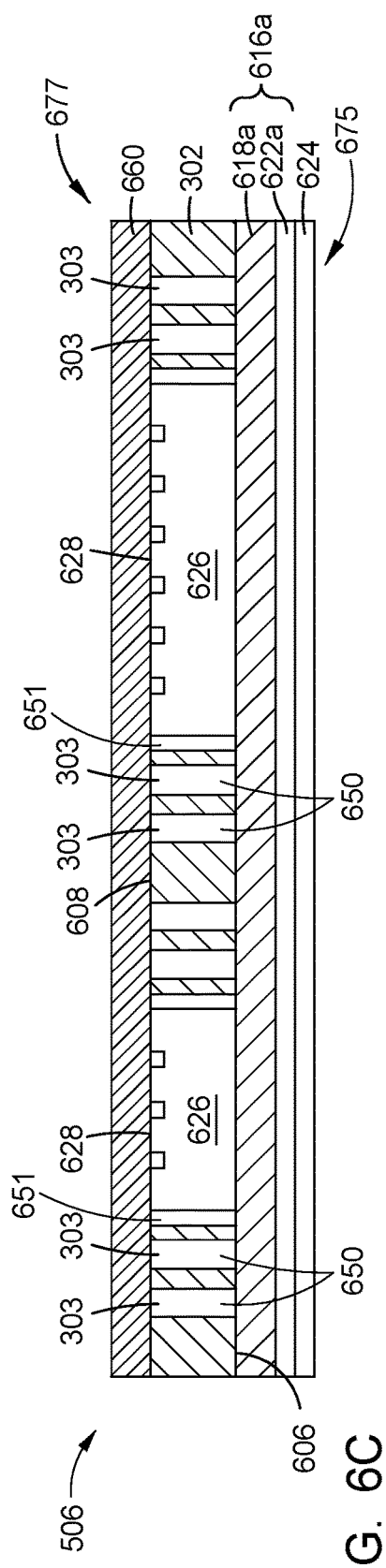

After placement of the dies 626 within the cavities 305, a first protective film 660 is placed over a second side 677 (e.g., surface 608) of the substrate 302 at operation 506 and FIG. 6C. The protective film 660 is coupled to the second side 677 of the substrate 302 and opposite of the first insulating film 616a such that it contacts and covers the active surfaces 628 of the dies 626 disposed within the cavities 305. In one embodiment, the protective film 660 is formed of a similar material to that of the protective layer 622a. For example, the protective film 660 is formed of PET, such as biaxial PET. However, the protective film 660 may be formed of any suitable protective materials. In some embodiments, the protective film 660 has a thickness between about 50 µm and about 150 µm.

The substrate 302, now affixed to the insulating film 616a on the first side 675 and the protective film 660 on the second side 677 and further having dies 626 disposed therein, is exposed to a first lamination process at operation 508. During the lamination process, the substrate 302 is exposed to elevated temperatures, causing the flowable layer 618a of the insulating film 616a to soften and flow into open voids or volumes between the insulating film 616a and the protective film 660, such as into voids 650 within the vias 303 and gaps 651 between the interior walls of the cavities 305 and the dies 626. Accordingly, the semiconductor dies 626 become at least partially embedded within the material of the insulating film 616a and the substrate 302, as depicted in FIG. 6D.

In one embodiment, the lamination process is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 5 seconds and about 1.5 minutes, such as between about 30 seconds and about 1 minute. In some embodiments, the lamination process includes the application of a pressure of between about 1 psig and about 50 psig while a temperature of between about 80° C. and about 140° C. is applied to substrate 302 and insulating film 616a for a period between about 5 seconds and about 1.5 minutes. For example, the lamination process is performed at a pressure of between about 5 psig and about 40 psig and a temperature of between about 100° C. and about 120° C. for a period between about 10 seconds and about 1 minute. For example, the lamination process is performed at a temperature of about 110° C. for a period of about 20 seconds.

At operation 510, the protective film 660 is removed and the substrate 302, now having the laminated insulating material of the flowable layer 618a at least partially surrounding the substrate 302 and the one or more dies 626, is coupled to a second protective film 662. As depicted in FIG. 6E, the second protective film 662 is coupled to the first side 675 of the substrate 302 such that the second protective film 662 is disposed against (e.g., adjacent) the protective layer 622a of the insulating film 616a. In some embodiments, the substrate 302 now coupled to the protective film 662, may be optionally placed on the carrier 624 for additional mechanical support on the first side 675. In some embodiments, the protective film 662 is placed on the carrier 624 prior to coupling the protective film 662 with the substrate 302, now laminated with the insulating film 616a. Generally, the protective film 662 is substantially similar in composition to the protective film 660. For example, the protective film 662 may be formed of PET, such as biaxial PET. However, the protective film 662 may be formed of any suitable protective materials. In some embodiments, the protective film 662 has a thickness between about 50 μm and about 150 μm.

Upon coupling the substrate 302 to the second protective film 662, a second insulating film 616b substantially similar to the first insulating film 616a is placed on the second side 677 of the substrate 302 at operation 512 and FIG. 6F, thus replacing the protective film 660. In one embodiment, the second insulating film 616b is positioned on the second side 677 of the substrate 302 such that a flowable layer 618b of the second insulating film 616b contacts and covers the active surface 628 of the dies 626 within the cavities 305. In one embodiment, the placement of the second insulating film 616b on the substrate 302 may form one or more voids 650 and gaps 651 between the insulating film 616b and the already-laminated insulating material of the flowable layer 618a partially surrounding the one or more dies 626. The second insulating film 616b may include one or more layers formed of polymer-based dielectric materials. As depicted in FIG. 6F, the second insulating film 616b includes a flowable layer 618b, which is similar to the flowable layer 618a described above. The second insulating film 616b may further include a protective layer 622b formed of similar materials to the protective layer 622a, such as PET.

At operation 514, a third protective film 664 is placed over the second insulating film 616b, as depicted in FIG. 6G. Generally, the protective film 664 is substantially similar in composition to the protective films 660, 662. For example, the protective film 664 is formed of PET, such as biaxial PET. However, the protective film 664 may be formed of any suitable protective materials. In some embodiments, the protective film 664 has a thickness between about 50 μm and about 150 μm.

The substrate 302, now affixed to the insulating film 616b and protective layer 664 on the second side 677 and the protective film 662 and optional carrier 624 on the first side 675, is exposed to a second lamination process at operation 516 and FIG. 6H. Similar to the lamination process at operation 508, the substrate 302 is exposed to elevated temperatures, causing the flowable layer 618b of the insulating film 616b to soften and flow into the voids 650 and gaps 651 between the insulating film 616b and the already-laminated insulating material of the flowable layer 618a, thus integrating itself with the insulating material of the flowable layer 618a. Accordingly, the cavities 305 and the vias 303 become filled (e.g., packed, sealed) with an insulating material, and the semiconductor dies 626 previously placed within the cavities 305 become entirely embedded within the insulating material of the flowable layers 618a, 618b.

In one embodiment, the lamination process is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between about 10 psig and about 150 psig while a temperature of between about 80° C. and about 140° C. is applied to substrate 302 and insulting film 616b for a period between about 1 minute and about 30 minutes. For example, the lamination process is performed at a pressure of between about 20 psig and about 100 psig, a temperature of between about 100° C. and about 120° C. for a period between about 2 minutes and 10 minutes. For example, the lamination process is performed at a temperature of about 110° C. for a period of about 5 minutes.

After lamination, the substrate 302 is disengaged from the carrier 624 and the protective films 662, 664 are removed at operation 518, resulting in a laminated intermediary die assembly 602. As depicted in FIG. 6I, the intermediary die assembly 602 includes the substrate 302 having one or more cavities 305 and/or vias 303 formed therein and filled with the insulating dielectric material of the flowable layers 618a, 618b, in addition to the dies 626 embedded within the cavities 305. The insulating dielectric material of the flowable layers 618a, 618b encases the substrate 302 such that the insulating material covers at least two surfaces or sides of the substrate 302, such as major surfaces 606, 608, and covers all sides of the embedded semiconductor dies 626. In some examples, the protective layers 622a, 622b are also removed from the intermediary die assembly 602 at operation 518. Generally, the protective layers 622a and 622b, the carrier 624, and the protective films 662 and 664 are removed from the intermediary die assembly 602 by any suitable mechanical processes, such as peeling therefrom.

Upon removal of the protective layers 622a, 622b and the protective films 662, 664, the intermediary die assembly 602 is exposed to a cure process to fully cure (i.e., harden through chemical reactions and cross-linking) the insulating dielectric material of the flowable layers 618a, 618b, thus forming a cured insulating layer 619. The insulating layer 619 substantially surrounds the substrate 302 and the semiconductor dies 626 embedded therein. For example, the insulating layer 619 contacts or encapsulates at least the sides 675, 677 of the substrate 302 (including surfaces 606, 608), and at least six sides or surfaces of each semiconductor die 626, which have rectangular prism shapes as illustrated in FIG. 6I.

In one embodiment, the cure process is performed at high temperatures to fully cure the insulating layer 619. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 518 is performed at or near ambient (e.g., atmospheric) pressure conditions.

After curing, one or more through-assembly vias 603 are drilled through the intermediary die assembly 602 at operation 520, forming channels through the entire thickness of the intermediary die assembly 602 for subsequent interconnection formation. In some embodiments, the intermediary die assembly 602 may be placed on a carrier, such as the carrier 624, for mechanical support during the formation of the through-assembly vias 603 and subsequent contact holes 632. The through-assembly vias 603 are drilled through the vias 303 that were formed in the substrate 302 and subsequently filled with the insulating layer 619. Thus, the through-assembly vias 603 may be circumferentially surrounded by the insulating layer 619 filled within the vias 303. By having the polymer-based dielectric material of the insulating layer 619 (e.g., a ceramic-filler-containing epoxy resin material) line the walls of the vias 303, capacitive coupling between the conductive silicon-based substrate 302 and interconnections 1044 (described with reference to FIG.

9 and FIGS. 10E-10K), and thus capacitive coupling between adjacently positioned vias 303 and/or redistribution connections 1244 (described with reference to FIG. 11 and FIGS. 12H-12N), in a completed 2D reconstituted substrate 1000 is significantly reduced as compared to other conventional interconnecting structures that utilize conventional via insulating liners or films. Furthermore, the flowable nature of the epoxy resin material enables more consistent and reliable encapsulation and insulation, thus enhancing electrical performance by minimizing leakage current of the completed reconstituted substrate 1000.

In one embodiment, the through-assembly vias 603 have a diameter of less than about 100 µm, such as less than about 75 µm. For example, the through-assembly vias 603 have a diameter of less than about 60 µm, such as less than about 50 µm. In one embodiment, the through-assembly vias 603 have a diameter of between about 25 µm and about 50 µm, such as a diameter of between about 35 µm and about 40 µm. In one embodiment, the through assembly vias 603 are formed using any suitable mechanical process. For example, the through-assembly vias 603 are formed using a mechanical drilling process. In one embodiment, through-assembly vias 603 are formed through the intermediary die assembly 602 by laser ablation. For example, the through-assembly vias 603 are formed using an ultraviolet laser. In one embodiment, the laser source utilized for laser ablation has a frequency between about 5 kHz and about 500 kHz. In one embodiment, the laser source is configured to deliver a pulsed laser beam at a pulse duration between about 10 ns and about 100 ns with a pulse energy of between about 50 microjoules (µJ) and about 500 µJ. Utilizing an epoxy resin material having small ceramic filler particles for the insulating layer 619 promotes more precise and accurate laser patterning of small-diameter vias, such as the vias 603, as the small ceramic filler particles therein exhibit reduced laser light reflection, scattering, diffraction, and transmission of the laser light away from the area in which the via is to be formed during the laser ablation process.

At operation 522 and FIG. 6K, one or more contact holes 632 are drilled through the insulating layer 619 to expose one or more contacts 630 formed on the active surface 628 of each embedded semiconductor die 626. The contact holes 632 are drilled through the insulating layer 619 by laser ablation, leaving all external surfaces of the semiconductor dies 626 covered and surrounded by the insulating layer 619 and the contacts 630 exposed. Thus, the contacts 630 are exposed by the formation of the contact holes 632. In one embodiment, the laser source may generate a pulsed laser beam having a frequency between about 100 kHz and about 1000 kHz. In one embodiment, the laser source is configured to deliver a pulsed laser beam at a wavelength of between about 100 nm and about 2000 nm, at a pulse duration between about 10E-4 ns and about 10E-2 ns, and with a pulse energy of between about 10 µJ and about 300 µJ. In one embodiment, the contact holes 632 are drilled using a $CO_2$, green, or UV laser. In one embodiment, the contact holes 632 have a diameter of between about 5 µm and about 60 µm, such as a diameter of between about 20 µm and about 50 µm.

After the formation of the contact holes 632, the intermediary die assembly 602 is exposed to a de-smear process at operation 522 to remove any unwanted residues and/or debris caused by laser ablation during the formation of the through-assembly vias 603 and the contact holes 632. The de-smear process thus cleans the through-assembly vias 603 and contact holes 632 and fully exposes the contacts 630 on the active surfaces 628 of the embedded semiconductor die 626 for subsequent metallization. In one embodiment, the de-smear process is a wet de-smear process. Any suitable aqueous etchants, solvents, and/or combinations thereof may be utilized for the wet de-smear process. In one example, a potassium permanganate ($KMnO_4$) solution may be utilized as an etchant. Depending on the residue thickness, exposure of the intermediary die assembly 602 to the wet de-smear process at operation 522 may be varied. In another embodiment, the de-smear process is a dry de-smear process. For example, the de-smear process may be a plasma de-smear process with an $O_2$:$CF_4$ mixture gas. The plasma de-smear process may include generating a plasma by applying a power of about 700 W and flowing $O_2$:$CF_4$ at a ratio of about 10:1 (e.g., 100:10 sccm) for a time period between about 60 seconds and about 120 seconds. In further embodiments, the de-smear process is a combination of wet and dry processes.

Following the de-smear process at operation 522, the intermediary die assembly 602 is ready for the formation of interconnection paths therein, described below with reference to FIG. 9 and FIGS. 10A-10K.

As previously discussed, FIG. 5 and FIGS. 6A-6K illustrate a representative method 500 for forming the intermediary die assembly 602. FIG. 7 and FIGS. 8A-8G illustrate an alternative method 700 substantially similar to the method 500 but with fewer operations. The method 700 generally includes seven operations 710-770. However, operations 710, 720, 760, and 770 of the method 700 are substantially similar to the operations 502, 504, 520, and 522 of the method 500, respectively. Thus, only operations 730, 740, and 750, depicted in FIGS. 8C, 8D, and 8E, respectively, are herein described for clarity.

Accordingly, after placement of the one or more semiconductor dies 626 onto a surface of the insulating film 616a exposed through the cavities 305, the second insulating film 616b is positioned over the second side 677 (e.g., major surface 608) of the substrate 302 at operation 730 and FIG. 8C, prior to lamination. In some embodiments, the second insulating film 616b is positioned on the second side 677 of the substrate 302 such that the flowable layer 618b of the second insulating film 616b contacts and covers the active surface 628 of the semiconductor dies 626 within the cavities 305. In some embodiments, a second carrier 825 is affixed to the protective layer 622b of the second insulating film 616b for additional mechanical support during later processing operations. As depicted in FIG. 8C, one or more voids 650 are formed between the insulating films 616a and 616b through the vias 303 and gaps 651 between the semiconductor dies 626 and interior walls of the cavities 305.

At operation 740 and FIG. 8D, the substrate 302, now affixed to the insulating films 616a and 616b and having dies 626 disposed therein, is exposed to a single lamination process. During the single lamination process, the substrate 302 is exposed to elevated temperatures, causing the flowable layers 618a and 618b of both insulating films 616a, 616b to soften and flow into the open voids 650 or gaps 651 between the insulating films 616a, 616b. Accordingly, the semiconductor dies 626 become embedded within the material of the insulating films 616a, 616b, and the vias 303 filled therewith.

Similar to the lamination processes described with reference to FIG. 5 and FIGS. 6A-6K, the lamination process at operation 740 may be a vacuum lamination process that may be performed in an autoclave or other suitable device. In another embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between about 1 psig and about 150 psig while a temperature of between about 80° C. and about 140° C. is applied to substrate 302 and insulating film 616a, 616b layers for a period between about 1 minute and about 30 minutes. For example, the lamination process is performed at a pressure of between about 10 psig and about 100 psig, a temperature of between about 100° C. and about 120° C. for a period between about 2 minutes and 10 minutes. For example, the lamination process is performed at a temperature of about 110° C. for a period of about 5 minutes.

At operation 750, the one or more protective layers of the insulating films 616a and 616b are removed from the substrate 302, resulting in the laminated intermediary die assembly 602. As depicted in FIG. 8E, the intermediary die assembly 602 includes the substrate 302 having one or more cavities 305 and/or vias 303 formed therein and filled with the insulating dielectric material of the flowable layers 618a, 618b, as well as the embedded dies 626 within the cavities 305. The insulating material encases the substrate 302 such that the insulating material covers at least two surfaces or sides of the substrate 302, for example major surfaces 606, 608. In one example, the protective layers 622a, 622b are removed from the intermediary die assembly 602, and thus the intermediary die assembly 602 is disengaged from the carriers 624, 825. Generally, the protective layers 622a, 622b and the carriers 624, 825 are removed by any suitable mechanical processes, such as peeling therefrom.

Upon removal of the protective layers 622a, 622b, the intermediary die assembly 602 is exposed to a cure process to fully cure the insulating dielectric material of the flowable layers 618a, 618b. Curing of the insulating material results in the formation of the cured insulating layer 619. As depicted in FIG. 8E and similar to operation 518 corresponding with FIG. 7I, the insulating layer 619 substantially surrounds the substrate 302 and the semiconductor dies 626 embedded therein.

In one embodiment, the cure process is performed at high temperatures to fully cure the intermediary die assembly 602. For example, the cure process is performed at a temperature of between about 140° C. and about 220° C. and for a period between about minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 750 is performed at or near ambient (e.g. atmospheric) pressure conditions.

After curing at operation 750, the method 700 is substantially similar to operations 520 and 522 of the method 500. For example, the intermediary die assembly 602 has one or more through-assembly vias 603 and one or more contact holes 632 drilled through the insulating layer 619. Subsequently, the intermediary die assembly 602 is exposed to a de-smear process, after which the intermediary die assembly 602 is ready for the formation of interconnection paths therein, as described below.

Figure 9:
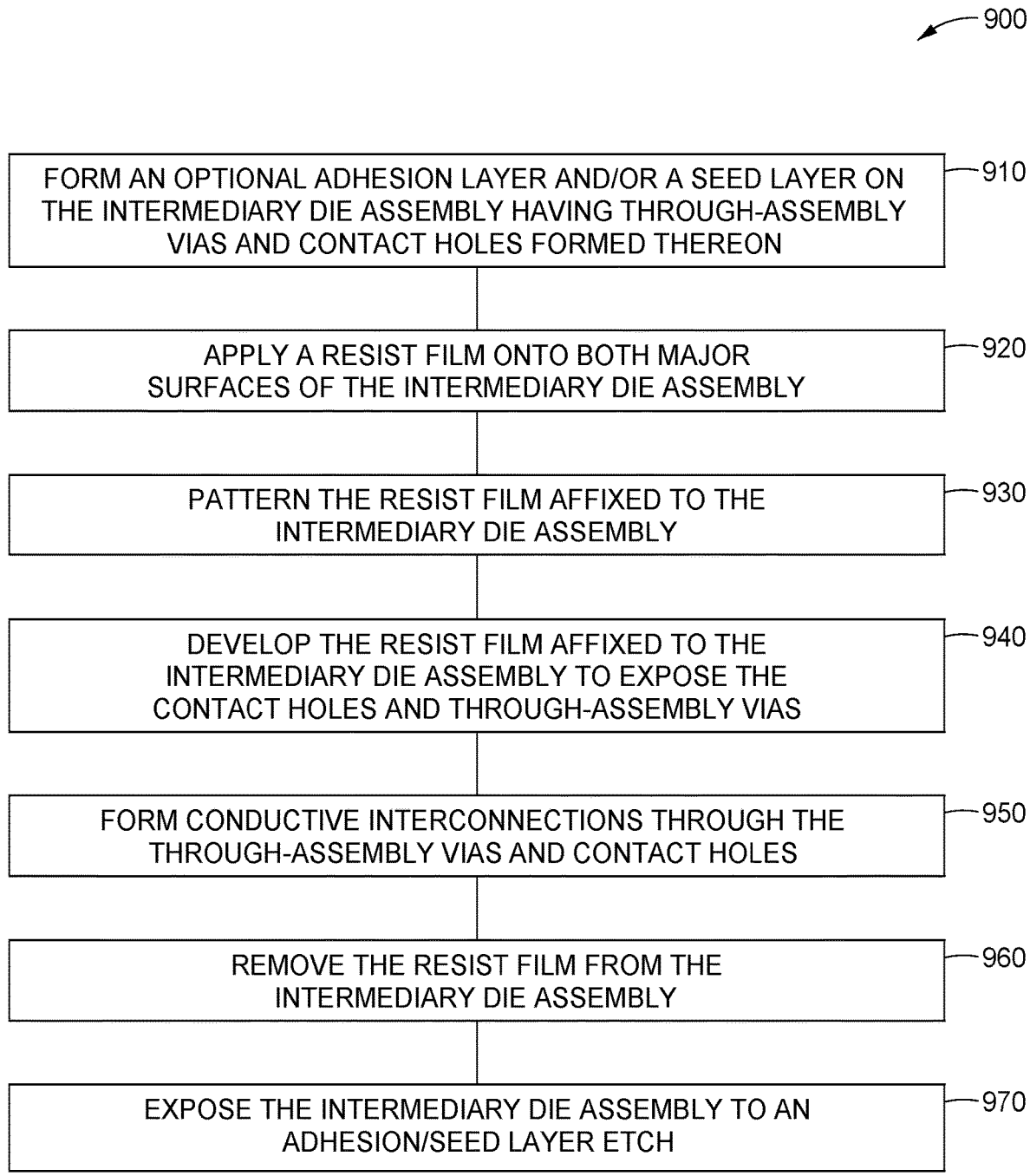
FIG. 9 illustrates a flow diagram of a process for forming interconnections in an intermediary die assembly, according to embodiments described herein.

FIG. 9 illustrates a flow diagram of a representative method 900 of forming electrical interconnections through the intermediary die assembly 602. FIGS. 10A-10K schematically illustrate cross-sectional views of the intermediary die assembly 602 at different stages of the process of the method 900 depicted in FIG. 9. Thus, FIG. 9 and FIGS. 10A-10K are herein described together for clarity.

Figure 10A:
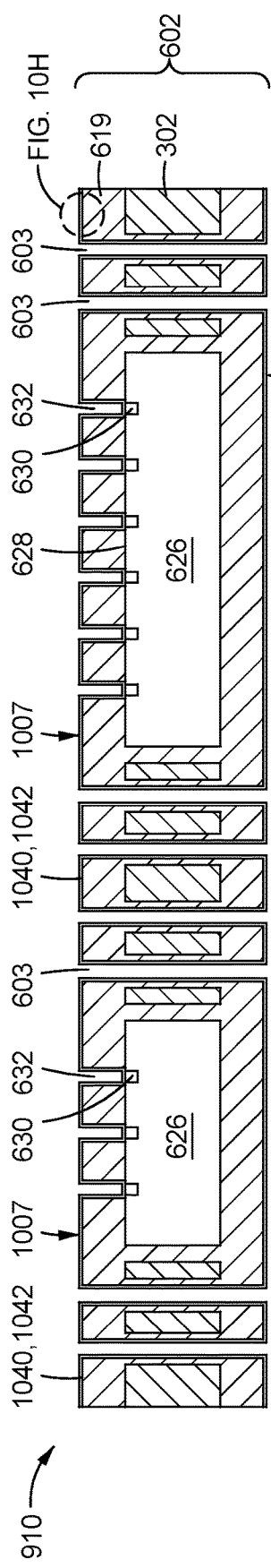

In one embodiment, the electrical interconnections formed through the intermediary die assembly 602 are formed of copper. Thus, the method 900 may optionally begin at operation 910 and FIG. 10A wherein the intermediary die assembly 602, having through-assembly vias 603 and contact holes 632 formed therein, has an adhesion layer 1040 and/or a seed layer 1042 formed thereon. An enlarged partial view of the adhesion layer 1040 and the seed layer 1042 formed on the intermediary die assembly 602 is depicted in FIG. 10H for reference. The adhesion layer 1040 may be formed on desired surfaces of the insulating layer 619, such as major surfaces 1005, 1007 of the intermediary die assembly 602, as well as on the active surfaces 628 within the contact holes 632 on each semiconductor die 626 and interior walls of the through-assembly vias 603, to assist in promoting adhesion and blocking diffusion of the subsequently formed seed layer 1042 and copper interconnections 1044. Thus, in one embodiment, the adhesion layer 1040 acts as an adhesion layer; in another embodiment, the adhesion layer 1040 acts as a barrier layer. In both embodiments, however, the adhesion layer 1040 will be hereinafter described as an "adhesion layer."

In one embodiment, the optional adhesion layer 1040 is formed of titanium, titanium nitride, tantalum, tantalum nitride, manganese, manganese oxide, molybdenum, cobalt oxide, cobalt nitride, or any other suitable materials or combinations thereof. In one embodiment, the adhesion layer 1040 has a thickness of between about 10 nm and about 300 nm, such as between about 50 nm and about 150 nm. For example, the adhesion layer 1040 has a thickness between about 75 nm and about 125 nm, such as about 100 nm. The adhesion layer 1040 is formed by any suitable deposition process, including but not limited to chemical vapor deposition (CVD), physical vapor deposition (PVD), plasma enhanced CVD (PECVD), atomic layer deposition (ALD), or the like.

The optional seed layer 1042 may be formed on the adhesion layer 1040 or directly on the insulating layer 619 (e.g., without the formation of the adhesion layer 1040). The seed layer 1042 is formed of a conductive material such as copper, tungsten, aluminum, silver, gold, or any other suitable materials or combinations thereof. Where the seed layer 1042 and subsequently plated interconnections 1044 are formed of the same conductive material, the seed layer 1042 and the interconnections 1044 may have different grain sizes. For example, the seed layer 1042, when deposited electrolessly and when composed of copper, typically has a grain size between 20 nm and 100 nm. The electrodeposited copper interconnection 1044 typically has a larger grain size of the order of 100 nm-5 um. When the seed layer 1042 is deposited by sputtering (PVD), then the grain size is also smaller than the electroplated copper interconnection 1044 formed thereon. In the case of PVD (sputtering), the grain size in the seed layer 1042 is also of the order of 20 nm to 100 nm.

In one embodiment, the seed layer 1042 has a thickness between about 50 nm and about 500 nm, such as between about 100 nm and about 300 nm. For example, the seed layer 1042 has a thickness between about 150 nm and about 250 nm, such as about 200 nm. In one embodiment, the seed layer 1042 has a thickness of between about 0.1 μm and about 1.5 μm. Similar to the adhesion layer 1040, the seed layer 1042 is formed by any suitable deposition process, such as CVD, PVD, PECVD, ALD dry processes, wet electroless plating processes, or the like. In one embodiment, a molybdenum adhesion layer 1040 is formed on the intermediary die assembly in combination with a seed layer 1042 formed of copper. The Mo—Cu adhesion and seed layer combination enables improved adhesion with the surfaces of the insulating layer 619 and reduces undercut of conductive interconnect lines during a subsequent seed layer etch process at operation 970.

Figure 10B:
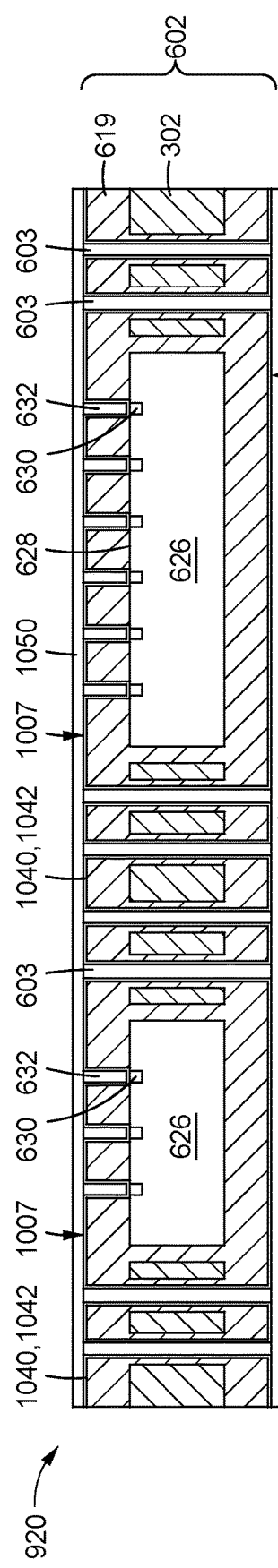
Figure 10C:
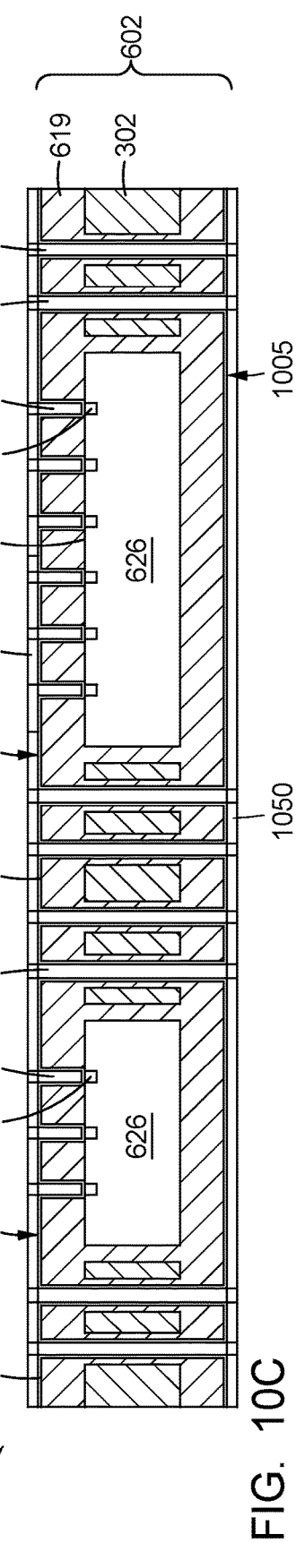

At operations 920 and 930, corresponding to FIGS. 10B and 10C, respectively, a spin-on/spray-on or dry resist film 1050, such as a photoresist, is applied on both major surfaces 1005, 1007 of the intermediary die assembly 602 and is subsequently patterned. In one embodiment, the resist film 1050 is patterned via selective exposure to UV radiation. In one embodiment, an adhesion promoter (not shown) is applied to the intermediary die assembly 602 prior to formation of the resist film 1050. The adhesion promoter improves adhesion of the resist film 1050 to the intermediary die assembly 602 by producing an interfacial bonding layer for the resist film 1050 and by removing any moisture from the surface of the intermediary die assembly 602. In some embodiments, the adhesion promoter is formed of bis(trimethylsilyl)amine or hexamethyldisilazane (HMDS) and propylene glycol monomethyl ether acetate (PGMEA).

At operation 940 and FIG. 10D, the intermediary die assembly 602 is exposed to resist film development, ashing, and descum processes. In certain embodiments, the descum process is an oxygen plasma treatment for removal of any residual organic resist residues. As depicted in FIG. 10D, the development of the resist film 1050 results in exposure of the through-assembly vias 603 and contact holes 632, now having an adhesion layer 1040 and a seed layer 1042 formed thereon. In one embodiment, the film development process is a wet process, such as a wet process that includes exposing the resist to a solvent. In one embodiment, the film development process is a wet etch process utilizing an aqueous etch process. In other embodiments, the film development process is a wet etch process utilizing a buffered etch process selective for a desired material. Any suitable wet solvents or combination of wet etchants may be used for the resist film development process.

At operations 950 and 960, corresponding to FIGS. 10E and 10F respectively, interconnections 1044 are formed on exposed surfaces of the intermediary die assembly 602, such as through the exposed through-assembly vias 603 and contact holes 632, and the resist film 1050 is thereafter removed. The interconnections 1044 are formed by any suitable methods including electroplating and electroless deposition. In one embodiment, the resist film 1050 is removed via a wet process. As depicted in FIGS. 10E and 10F, the formed interconnections 1044 completely fill the through-assembly vias 603 and contact holes 632 or only cover inner circumferential walls thereof and protrude from the surfaces 1005, 1007 of the intermediary die assembly 602 upon removal of the resist film 1050. For example, the interconnections 1044 may line the inner circumferential walls of the through-assembly vias 603 and have hollow cores. In one embodiment, the interconnections 1044 are formed of copper. In other embodiments, the interconnections 1044 may be formed of any suitable conductive material including but not limited to aluminum, gold, nickel, silver, palladium, tin, or the like.

In some embodiments, the interconnections 1044 include lateral trace (e.g., line or pad) regions for electrical connection of interconnections 1044 with other electrical contacts or devices, such as redistribution connections 1244 described below. The lateral trace regions can include a portion of the conductive layer formed in operation 950 and will typically extend across a portion of the major surfaces 1007 or 1005.

At operation 970 and FIG. 10G, the intermediary die assembly 602 having interconnections 1044 formed therein is exposed to an adhesion and/or seed layer etch process to remove the adhesion layer 1040 and the seed layer 1042, thus resulting in the formation of the completed reconstituted substrate 1000. In one embodiment, the seed layer etch is a wet etch process including a rinse and drying of the intermediary die assembly 602. In one embodiment, the seed layer etch process is a buffered etch process selective for a desired material such as copper, tungsten, aluminum, silver, or gold. In other embodiments, the etch process is an aqueous etch process. Any suitable wet etchant or combination of wet etchants may be used for the seed layer etch process.

Figure 10I:
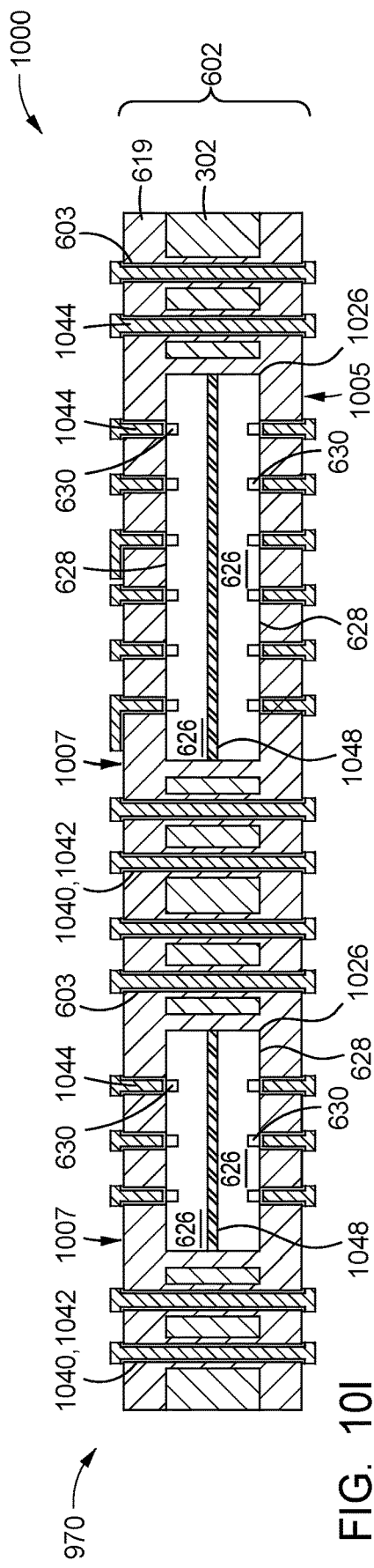
Figure 10J:
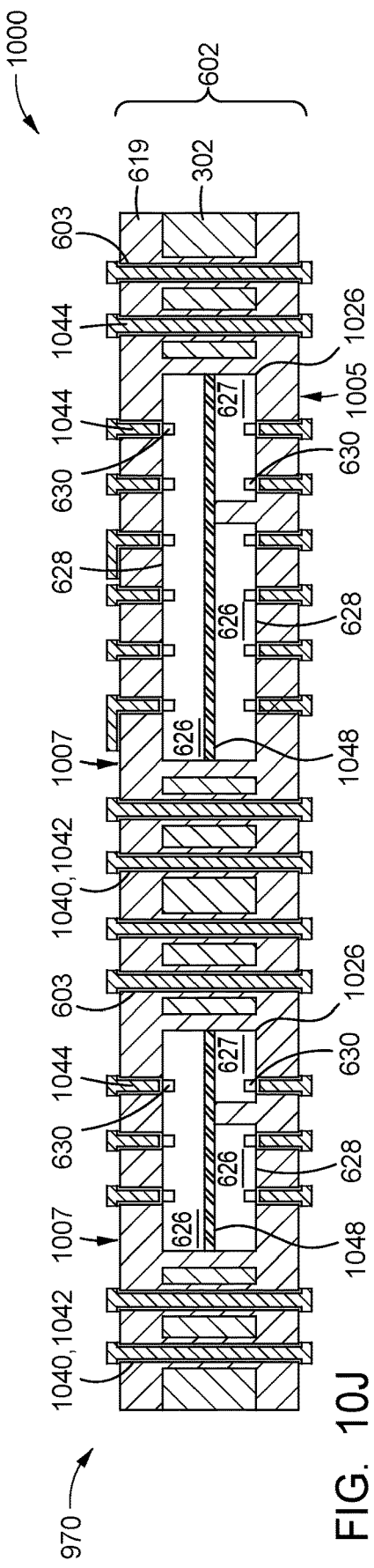

FIGS. 10I and 10J depict further exemplary arrangements for the reconstituted substrate 1000 according to certain embodiments. The packaging schemes depicted in FIGS. 10I and 10J are particularly beneficial for memory die stacking, as they reduce the amount of operations required to stack a desired number of memory dies (e.g., stacking eight memory dies to form a "byte" now only requires stacking of four packages or reconstituted substrates).

As shown, the reconstituted substrate 1000 includes two semiconductor dies 626 stacked backside-to-backside in a die stack 1026 within each cavity 305, wherein the backsides of the semiconductor dies 626 are coupled to one another by an adhesive layer 1048. Accordingly, active sides 628 of the stacked semiconductor dies 626 face opposite sides of the reconstituted substrate 1000 and have interconnections 1044 extending in opposite directions therefrom. In certain embodiments, the stacked semiconductor dies 626 are of the same type and/or have substantially the same lateral dimensions, as shown in FIG. 10I. In certain other embodiments, the stacked semiconductor dies 626 are of different types and/or have different lateral dimensions, shown in FIG. 10J. In such embodiments, a dummy die 627 may be placed alongside the semiconductor die 626 having the smaller lateral dimension to ensure substantially similar overall dimensions of each layer of the die stack 1026. The adhesive layer 1048 utilized to couple the backsides of the semiconductor dies 626 may be any suitable type of adhesive, such as a laminated adhesive material, die attach film, glue, or the like.

Figure 10K:
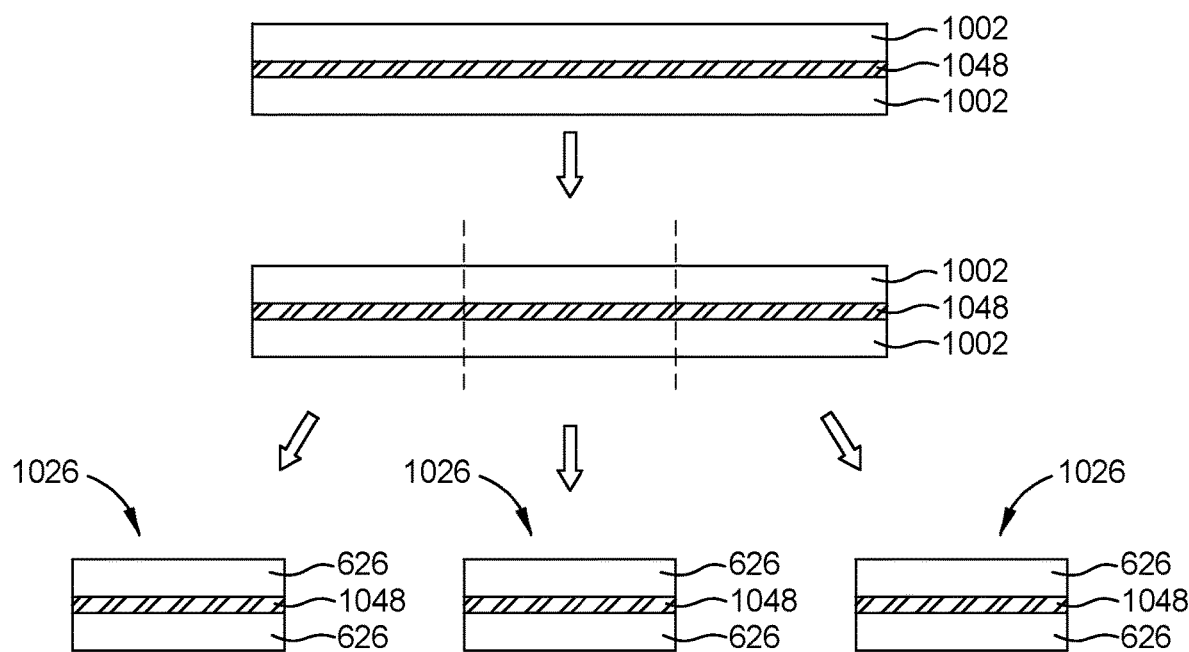

To form the arrangements depicted in FIGS. 10I and 10J, the semiconductor dies 626 can be attached to each other prior to placement of the die stack 1026 within cavities 305 of the substrate 302. An exemplary process flow for forming the die stack 1026 is shown in FIG. 10K. As depicted, backsides of two die substrates 1002 (e.g., DRAM substrates) are aligned and bonded to each other using the adhesive layer 1048. In certain embodiments, the die substrates 1002 may be thinned before or after bonding, depending on the desired thickness of the die stack 1026. The die substrates 1002 are then singulated into individual die stacks 1026, which may be placed within cavities 305 of the substrate 302 and encapsulated within the insulating layer 619, as described with reference to methods 500 and 700. Thereafter, interconnections and/or redistribution layers may be formed according to any of the operations described herein (e.g., methods 900 and 1200), substantially similar to examples wherein a single semiconductor die 626 or side-by-side semiconductor dies 626 are embedded within a cavity 305 of the substrate 302.

Following the adhesion and/or seed layer etch process at operation 970, the reconstituted substrate 1000 may be singulated into one or more electrically functioning packages or SiPs (e.g., each singulated package or SiP may include a single region 412 of the substrate 302, now having the insulating layer 619 and interconnections 1044 formed thereon, and the semiconductor dies 626 embedded therein). Each package or SiP may thereafter be integrated with other semiconductor devices and packages in various 2.5D and 3D arrangements and architectures. For example, the packages or SiPs may be vertically stacked with additional packages or SiPs and/or other semiconductor devices and systems to form homogeneous or heterogeneous 3D stacked systems. Alternatively, the reconstituted substrate 1000 may be integrated with additional semiconductor devices and systems prior to singulation. Such 3D integration of the 2D reconstituted substrate 1000 is further described below with reference to FIG. 13 and FIGS. 14A-14D.

Figure 11:
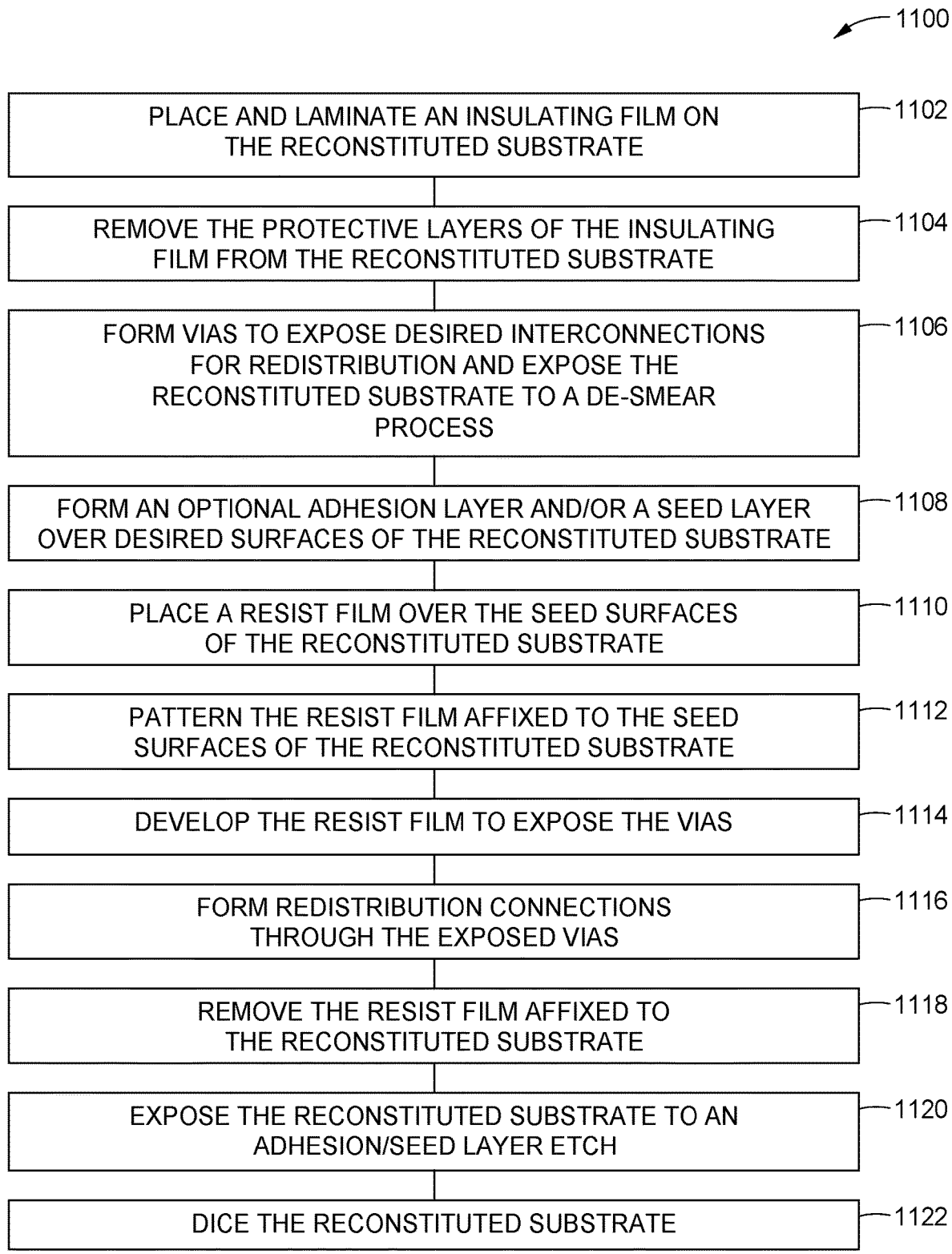
FIG. 11 illustrates a flow diagram of a process for forming a redistribution layer on a reconstituted substrate followed by singulation, according to embodiments described herein.
Figure 12A:
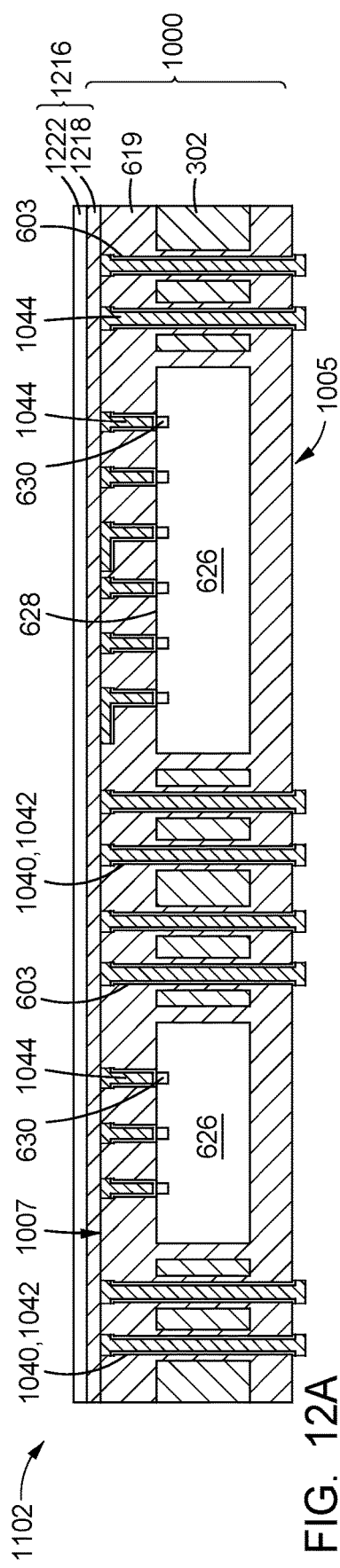
FIGS. 12A-12N schematically illustrate cross-sectional views of a reconstituted substrate at different stages of forming a redistribution layer followed by singulation, as depicted in FIG. 11.

In yet another embodiment, upon etching of the adhesion and/or seed layers, the reconstituted substrate 1000 may have one or more redistribution layers 1258, 1260 (shown in FIGS. 12K-12N) formed thereon as needed to enable rerouting and/or extension of contact points of the interconnections 1044 to desired locations on the surfaces of the reconstituted substrate 1000. FIG. 11 illustrates a flow diagram of a representative method 1100 of forming a redistribution layer 1258 on the reconstituted substrate 1000. FIGS. 12A-12N schematically illustrate cross-sectional views of the reconstituted substrate 1000 at different stages of the method 1100, depicted in FIG. 11. Thus, FIG. 11 and FIGS. 12A-12N are herein described together for clarity.

The method 1100 is substantially similar to the methods 500, 700, and 900 described above. Generally, the method 1100 begins at operation 1102 and FIG. 12A, wherein an insulating film 1216 is placed on the reconstituted substrate 1000, already having the insulating layer 619 formed thereon, and thereafter laminated. The insulating film 1216 may be substantially similar to the insulating films 616 and may include one or more flowable layers 1218 formed of polymer-based dielectric materials and one or more protective layers 1222 formed of PET.

In one embodiment, the flowable layer 1218 includes an epoxy resin material. In one embodiment, the flowable layer 1218 includes a ceramic-filler-containing epoxy resin material. In another embodiment, the flowable layer 1218 includes a photodefinable polyimide material. The material properties of photodefinable polyimide enable the formation of smaller (e.g., narrower) vias through the resulting interconnect redistribution layer formed from the insulating film 1216. However, any suitable combination of flowable layers 1218 and insulating materials is contemplated for the insulating film 1216. For example, the insulating film 1216 may include one or more flowable layers 1218 including a non-photosensitive polyimide material, a polybenzoxazole (PBO) material, a silicon dioxide material, and/or a silicon nitride material.

In some examples, the material of the flowable layer 1218 is different from the flowable layers 618 of the insulating films 616. For example, the flowable layers 618 may include a ceramic-filler-containing epoxy resin material and the flowable layer 1218 may include a photodefinable polyimide material. In another example, the flowable layer 1218 includes a different inorganic dielectric material from the flowable layers 618. For example, the flowable layers 618 may include a ceramic-filler-containing epoxy resin material and the flowable layer 1218 may include a silicon dioxide material.

The insulating film 1216 has a total thickness of less than about 120 μm, such as between about 40 μm and about 100 μm. For example, the insulating film 1216 including the flowable layer 1218 and the protective layer 1222 has a total thickness of between about 50 μm and about 90 μm. In one embodiment, the flowable layer 1218 has a thickness of less than about 60 μm, such as a thickness between about 5 μm and about 50 μm, such as a thickness of about 20 μm. The insulating film 1216 is placed on a surface of the reconstituted substrate 1000 having exposed interconnections 1044 that are coupled to the contacts 630 on the active surface 628 of semiconductor dies 626 and/or coupled to the metallized through-assembly vias 603, such as the major surface 1007.

After placement of the insulating film 1216, the reconstituted substrate 1000 is exposed to a lamination process substantially similar to the lamination process described with reference to operations 508, 516, and 740. The reconstituted substrate 1000 is exposed to elevated temperatures to soften the flowable layer 1218, which subsequently bonds to the insulating layer 619 already formed on the reconstituted substrate 1000. Thus, in one embodiment, the flowable layer 1218 becomes integrated with the insulating layer 619 and forms an extension thereof. The integration of the flowable layer 1218 and the insulating layer 619 results in an expanded and integrated insulating layer 619, covering the previously exposed interconnections 1044. Accordingly, the bonded flowable layer 1218 and the insulating layer 619 will herein be jointly described as the insulating layer 619. In other embodiments, however, the lamination and subsequent curing of the flowable layer 1218 forms a second insulating layer (not shown) on the insulating layer 619. In some examples, the second insulating layer is formed of a different material layer than the insulating layer 619.

In one embodiment, the lamination process is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between psig and about 100 psig while a temperature of between about 80° C. and about 140° C. is applied to the substrate 302 and insulating film 1216 for a period between about 1 minute and about 30 minutes. For example, the lamination process is performed at a pressure of between about 30 psig and about 80 psig and a temperature of between about 100° C. and about 120° C. for a period between about 2 minutes and about 10 minutes. For example, the lamination process is performed at a temperature of about 110° C. for a period of about 5 minutes. In further examples, the lamination process is performed at a pressure between about 30 psig and about 70 psig, such as about 50 psig.

Figure 12B:
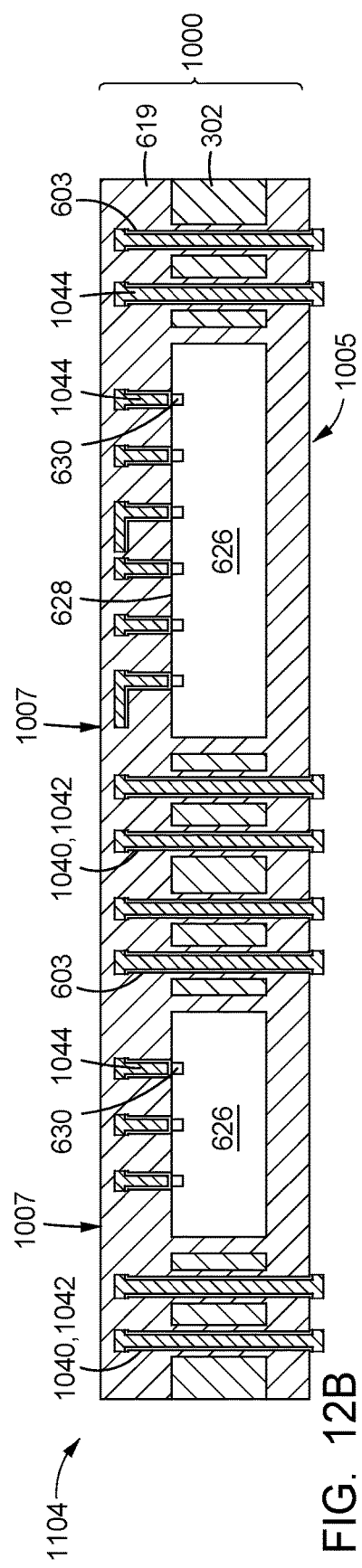

At operation 1104 and FIG. 12B, the protective layer 1222 is removed from the reconstituted substrate 1000 by mechanical processes. After removal of the protective layer 1322 and carrier 1324, the reconstituted substrate 1000 is exposed to a cure process to fully cure the newly expanded insulating layer 619. In one embodiment, the cure process is substantially similar to the cure process described with reference to operations 518 and 750. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 1104 is performed at or near ambient pressure conditions.

Figure 12C:
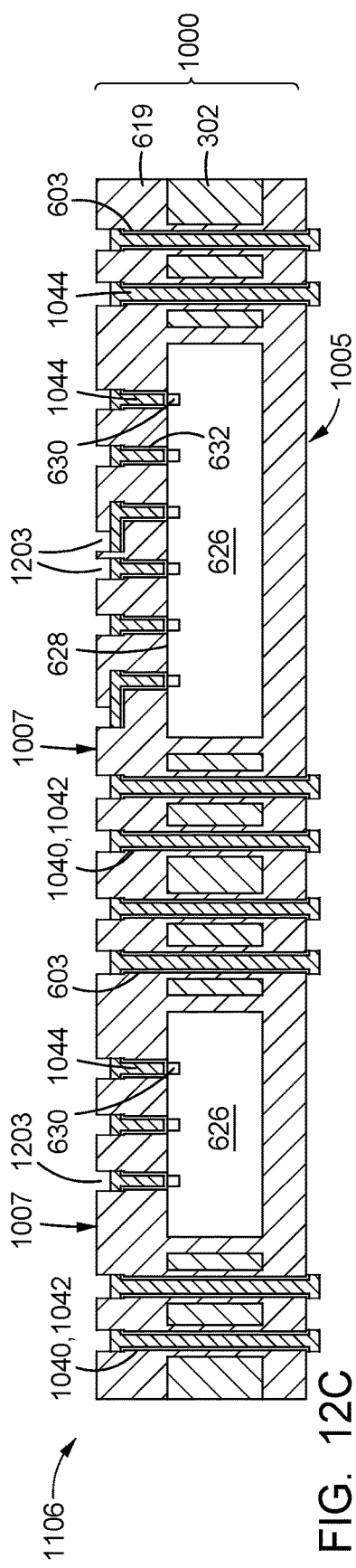

The reconstituted substrate 1000 is then selectively patterned by laser ablation at operation 1106 and FIG. 12C. The laser ablation at operation 1106 forms redistribution vias 1203 through the newly expanded insulating layer 619 and exposes desired interconnections 1044 for redistribution of contact points thereof. In one embodiment, the redistribution vias 1203 have a diameter of between about 5 µm and about 60 µm, such as a diameter of between about 10 µm and about 50 µm, such as between about 20 µm and about 45 µm. In one embodiment, the laser ablation process at operation 1106 is performed utilizing a $CO_2$ laser. In one embodiment, the laser ablation process at operation 1106 is performed utilizing a UV laser. In one embodiment, the laser ablation process at operation 1106 is performed utilizing a green laser. For example, the laser source may generate a pulsed laser beam having a frequency between about 100 kHz and about 1000 kHz. In one example, the laser source is configured to deliver a pulsed laser beam at a wavelength of between about 100 nm and about 2000 nm, at a pulse duration between about 10E-4 ns and about 10E-2 ns, and with a pulse energy of between about 10 µJ and about 300 µJ.

Upon patterning of the reconstituted substrate 1000, the reconstituted substrate 1000 is exposed to a de-smear process substantially similar to the de-smear process at operations 522 and 770. During the de-smear process at operation 1106, any unwanted residues and debris formed by laser ablation during the formation of the redistribution vias 1203 are removed from the redistribution vias 1203 to clear (e.g., clean) the surfaces thereof for subsequent metallization. In one embodiment, the de-smear process is a wet process. Any suitable aqueous etchants, solvents, and/or combinations thereof may be utilized for the wet de-smear process. In one example, $KMnO_4$ solution may be utilized as an etchant. In another embodiment, the de-smear process is a dry de-smear process. For example, the de-smear process may be a plasma de-smear process with an $O_2/CF_4$ mixture gas. In further embodiments, the de-smear process is a combination of wet and dry processes.

Figure 12D:
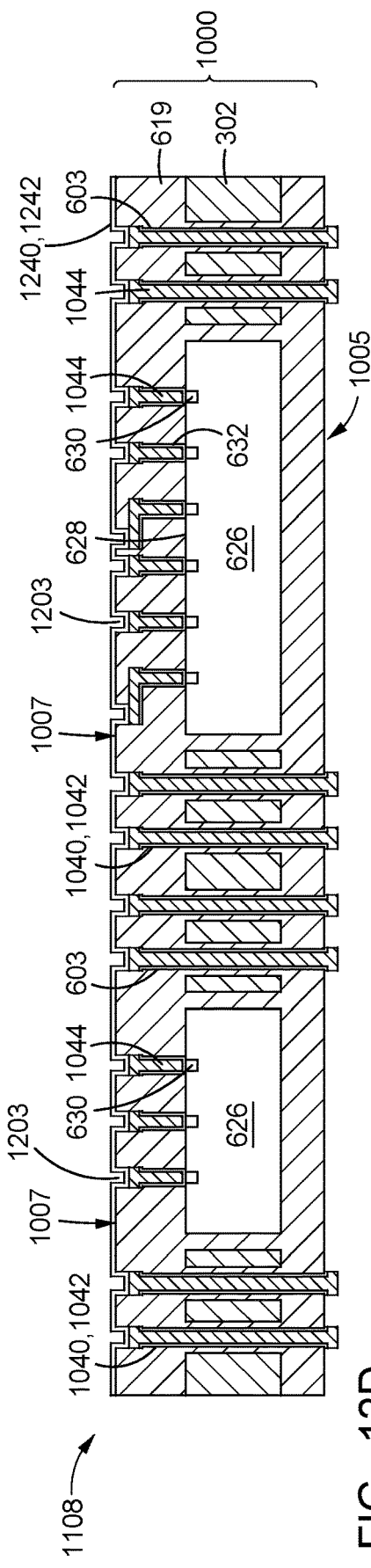

At operation 1108 and FIG. 12D, an optional adhesion layer 1240 and/or seed layer 1242 are formed on the insulating layer 619. In one embodiment, the adhesion layer 1240 is formed from titanium, titanium nitride, tantalum, tantalum nitride, manganese, manganese oxide, molybdenum, cobalt oxide, cobalt nitride, or any other suitable materials or combinations thereof. In one embodiment, the adhesion layer 1240 has a thickness of between about 10 nm and about 300 nm, such as between about 50 nm and about 150 nm. For example, the adhesion layer 1240 has a thickness between about 75 nm and about 125 nm, such as about 100 nm. The adhesion layer 1240 may be formed by any suitable deposition process, including but not limited to CVD, PVD, PECVD, ALD, or the like.

The optional seed layer 1242 is formed from a conductive material such as copper, tungsten, aluminum, silver, gold, or any other suitable materials or combinations thereof. In one embodiment, the seed layer 1242 has a thickness between about 50 nm and about 500 nm, such as between about 100 nm and about 300 nm. For example, the seed layer 1242 has a thickness between about 150 nm and about 250 nm, such as about 200 nm. In one embodiment, the seed layer 1242 has a thickness of between about 0.1 µm and about 1.5 µm. Similar to the adhesion layer 1240, the seed layer 1242 may be formed by any suitable deposition process, such as CVD, PVD, PECVD, ALD dry processes, wet electroless plating processes, or the like. In one embodiment, a molybdenum adhesion layer 1240 and a copper seed layer 1242 are formed on the reconstituted substrate 1000 to reduce undercut of conductive interconnect lines during a subsequent seed layer etch process at operation 1120.

Figure 12E:
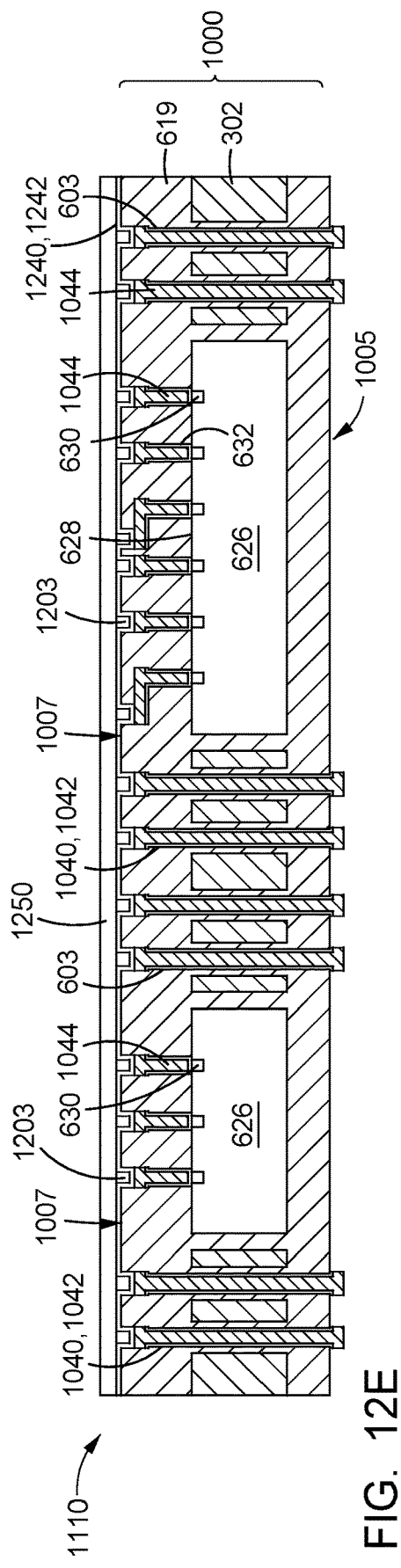

At operations 1110, 1112, and 1114, corresponding to FIGS. 12E, 12F, and 12G respectively, a spin-on/spray-on or dry resist film 1250, such as a photoresist, is applied over the adhesion and/or seed surfaces of the reconstituted substrate 1000 and subsequently patterned and developed. In one embodiment, an adhesion promoter (not shown) is applied to the reconstituted substrate 1000 prior to placement of the resist film 1250. The exposure and development of the resist film 1250 results in the opening of the redistribution vias 1203 and exposure of the insulating layer 619, adhesion layer 1240, or copper seed layer 1242 for formation of redistribution connections 1244 thereon. Thus, patterning of the resist film 1250 may be performed by selectively exposing portions of the resist film 1250 to UV radiation and subsequent development of the resist film 1250 by a wet process, such as a wet etch process. In one embodiment, the resist film development process is a wet etch process utilizing a buffered etch process selective for a desired material. In other embodiments, the resist film development process is a wet etch process utilizing an aqueous etch process. Any suitable wet etchant or combination of wet etchants may be used for the resist film development process.

At operations 1116 and 1118, corresponding to FIGS. 12H and 12I respectively, redistribution connections 1244 are formed on exposed surfaces of the reconstituted substrate 1000, such as through the exposed redistribution vias 1203, and the resist film 1250 is thereafter removed. The redistribution connections 1244 are formed by any suitable methods, including electroplating and electroless deposition. In one embodiment, the resist film 1250 is removed via a wet process. As depicted in FIGS. 12H and 12I, the redistribution connections 1244 fill the redistribution vias 1203 and protrude from the surfaces of the reconstituted substrate 1000 upon removal of the resist film 1250. In one embodiment, the redistribution connections 1244 are formed of copper. In other embodiments, the redistribution connections 1244 may be formed of any suitable conductive material including but not limited to aluminum, gold, nickel, silver, palladium, tin, or the like.

As described with reference to the interconnections 1044, the redistribution connections 1244 may also include lateral trace regions for electrical connection of redistribution connections 1244 with other electrical contacts or devices. The lateral trace regions can include a portion of the conductive layer formed in operation 1116 and will typically extend across a portion of the major surfaces of the reconstituted substrate 1000.

Figure 12J:
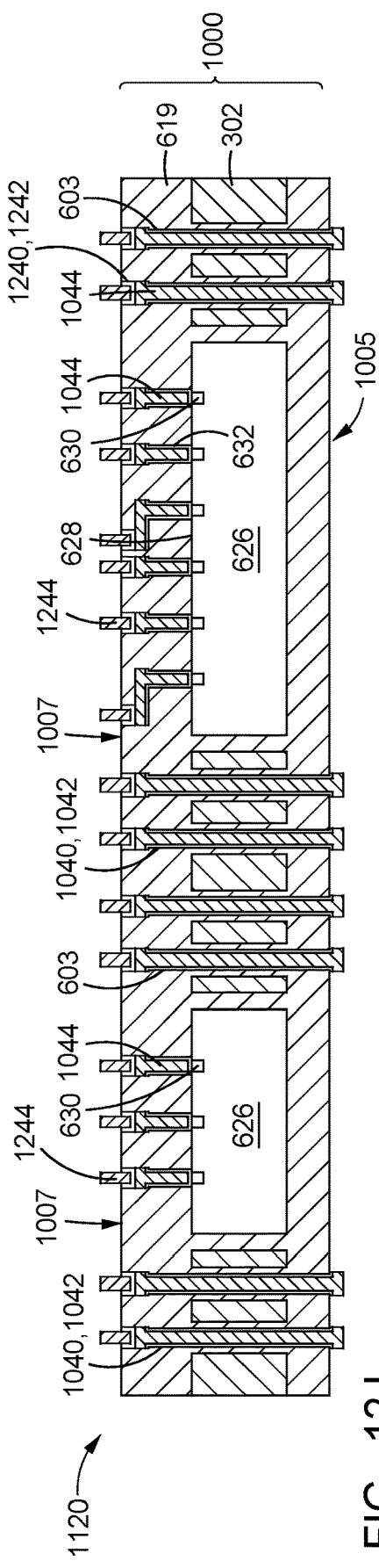

At operation 1120 and FIG. 12J, the reconstituted substrate 1000 having the redistribution connections 1244 formed thereon is exposed to an adhesion and/or seed layer etch process substantially similar to that of operation 970. In one embodiment, the adhesion and/or seed layer etch is a wet etch process including a rinse and drying of the reconstituted substrate 1000. In one embodiment, the adhesion and/or seed layer etch process is a wet etch process utilizing a buffered etch process selective for a desired material of the seed layer 1242. In other embodiments, the etch process is a wet etch process utilizing an aqueous etch process. Any suitable wet etchant or combination of wet etchants may be used for the seed layer etch process.

Figure 12K:
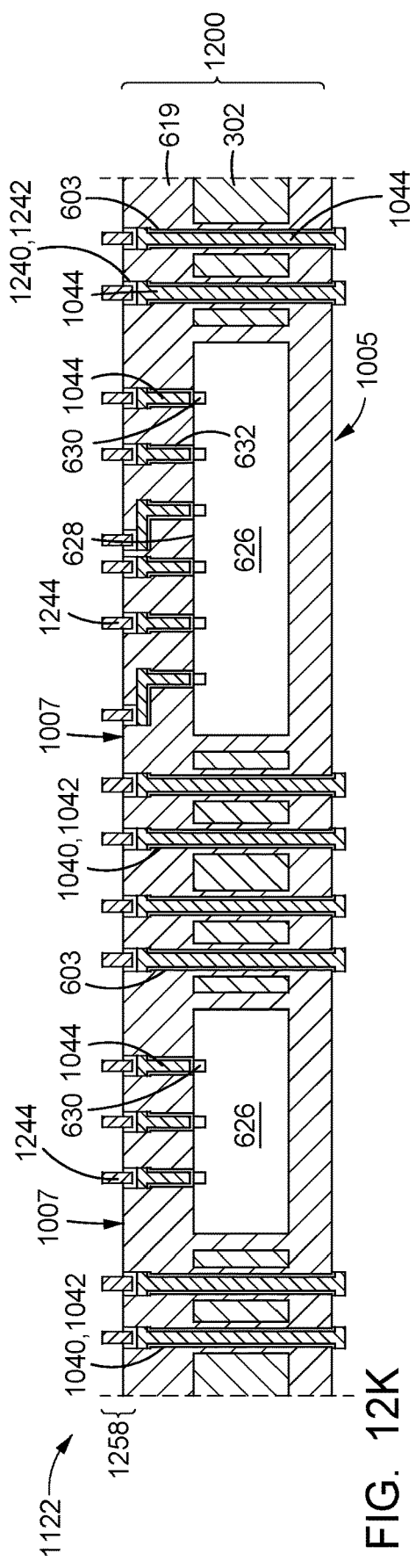
Figure 12L:
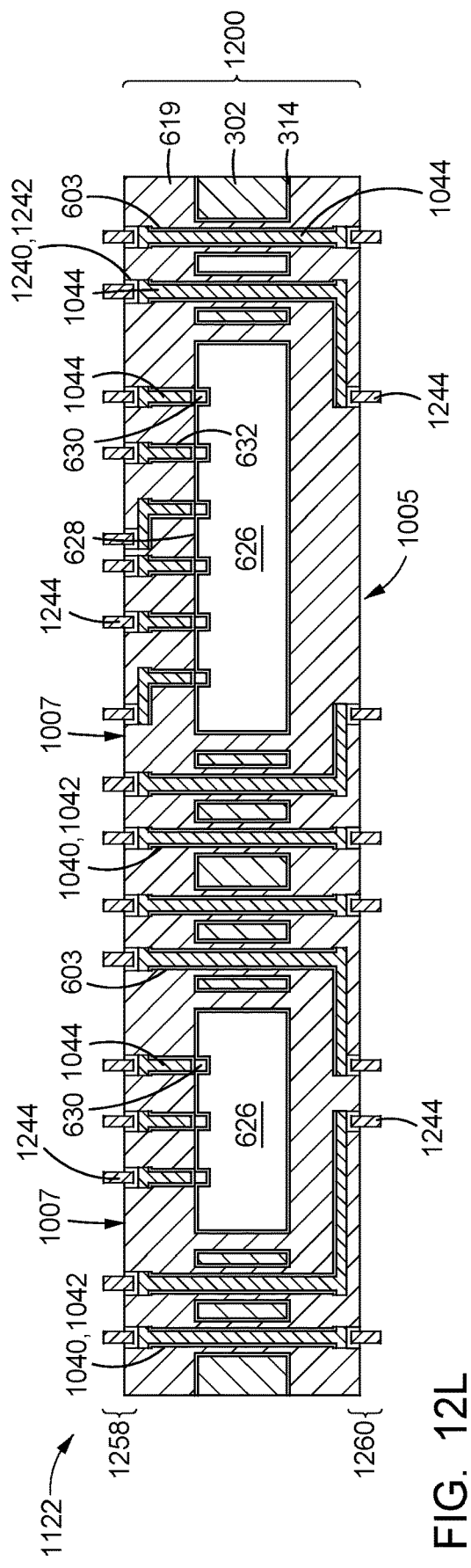

At operation 1122 and depicted in FIG. 12K, one or more functional 2D packages 1200 may be singulated from the 2D reconstituted substrate 1000. (Although described as a package, the packages 1200 may also refer to SiPs and other functional packaged devices.) In some embodiments, however, additional redistribution layers may be formed on the reconstituted substrate 1000 prior to singulation of packages 1200 by utilizing the sequences and processes described above. For example, one or more additional redistribution layers 1260 may be formed on a side or surface of the reconstituted substrate 1000 opposite of the first redistribution layer 1258, such as the major surface 1007, as depicted in FIG. 12L. Alternatively, one or more additional redistribution layers 1260 may be formed on the same side or surface of the first redistribution layer 1258, such as major surface 1007. The packages 1200 may then be singulated from the reconstituted substrate 1000 after all desired redistribution layers are formed. Each package 1200 may thereafter be integrated with other semiconductor devices and packages in desired 2.5D and 3D arrangements and architectures, which may be heterogeneous or homogeneous. For example, the packages 1200 may be vertically stacked with other semiconductor devices and systems to form heterogeneous 3D stacked systems. In yet another embodiment, however, the reconstituted substrate 1000 having one or more redistribution layers 1258, 1260 formed thereon may be 3D integrated with additional semiconductor devices and systems prior to singulation into individual 3D packages or SiPs, which may be heterogeneous or homogeneous.

Figure 12M:
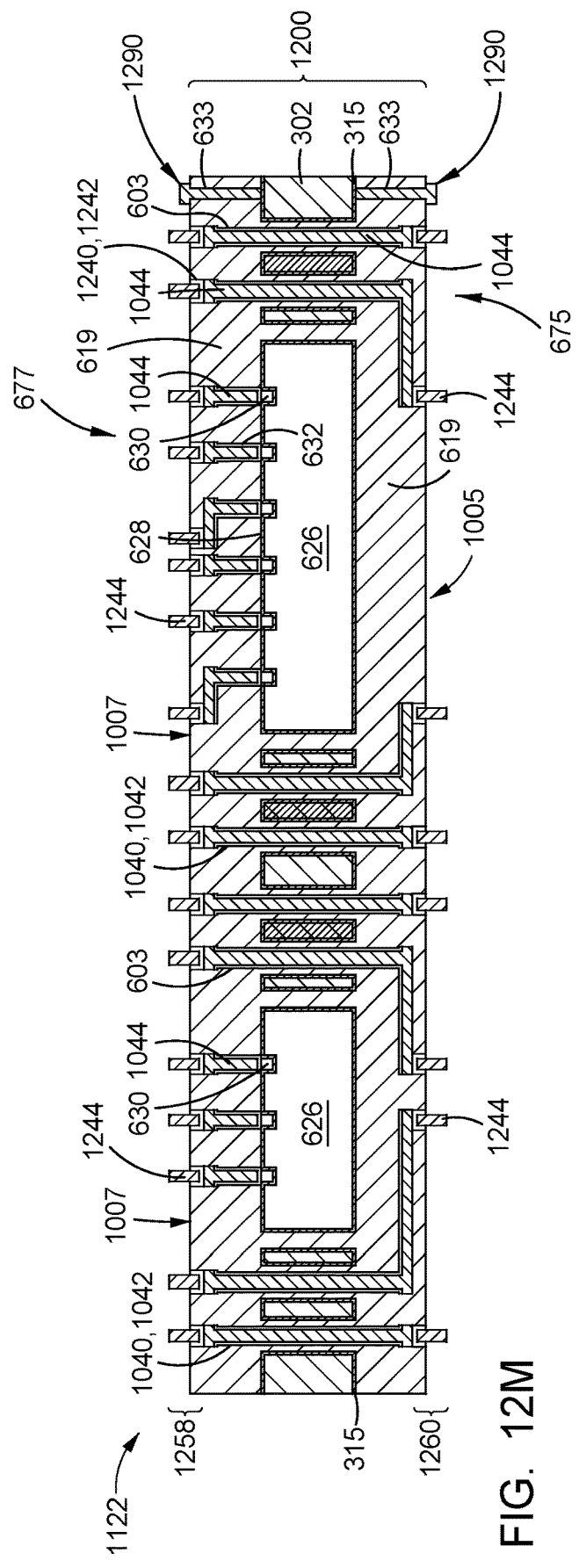
Figure 12N:
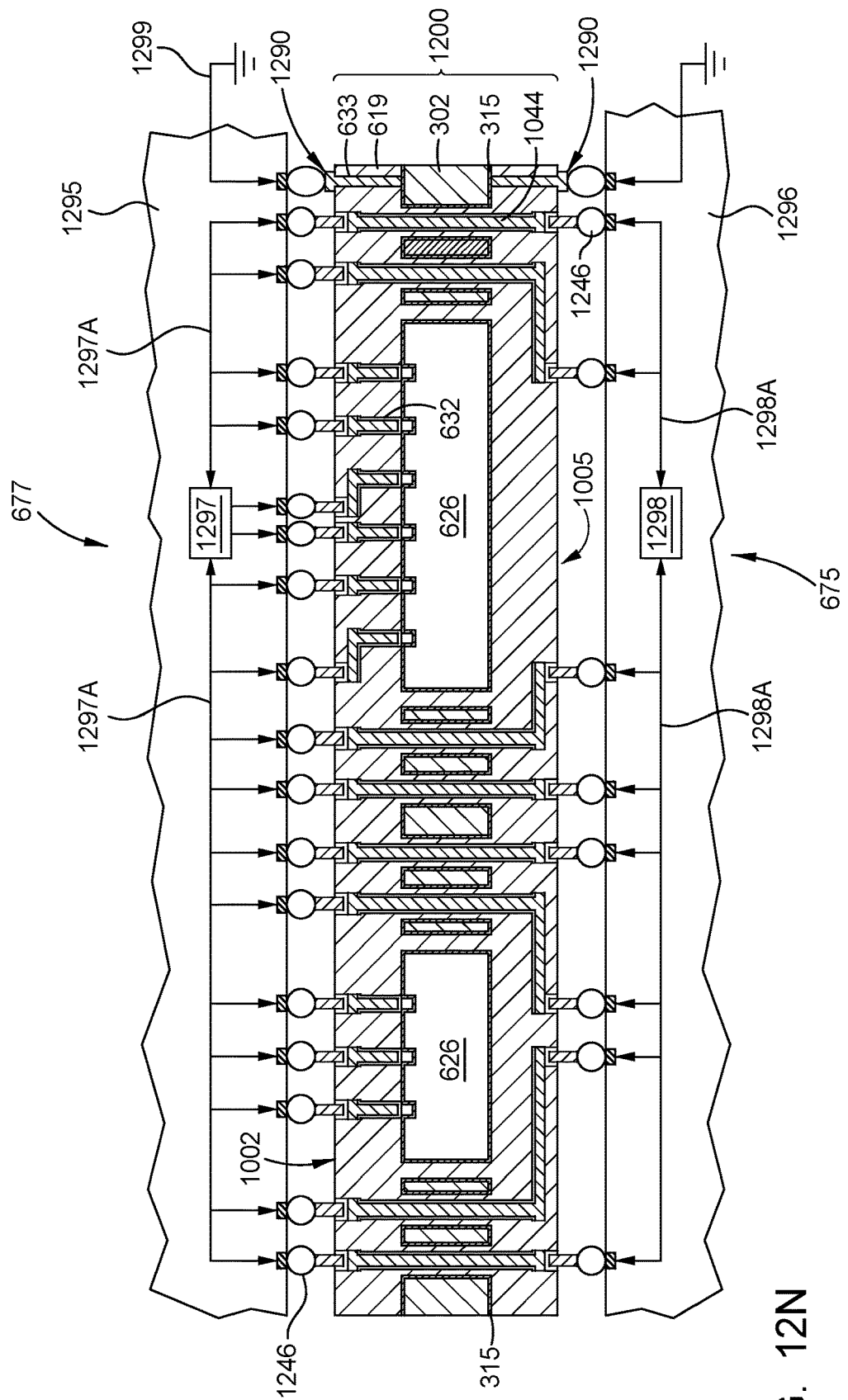

FIGS. 12L-12N further depict packages 1200 wherein the reconstituted substrate 1000 includes the oxide layer 314 or the metal cladding layer 315. As shown in FIG. 12L, the oxide layer 314 is formed on all surfaces of the substrate 302, including the sidewalls of the cavities 305 and the vias 303, which now have semiconductor dies 626 or interconnections 1044 disposed therein and surrounded by the insulating layer 619. The flowable dielectric material of the insulating layer 619 surrounds the oxide layer 314, and thus, at least the insulating layer 619 and the oxide layer 314 separate surfaces of the substrate 302 from any semiconductor dies 626 and/or interconnections 1044 and prevent contact therebetween.

Similarly, in FIG. 12M, the metal cladding layer 315 is formed on all surfaces of the substrate 302. However, unlike the oxide layer 314, the metal cladding layer 315 is coupled to at least one cladding connection 1290 forming at least one connection point on at least one side of the package 1200, or as shown in FIGS. 12N-12M, a cladding connection 1290 forming at least one connection point on both sides 677 and 675. The cladding connections 1290 are connected to a common ground used by one or more the semiconductor dies disposed with the package 1200. Alternatively, the cladding connections 1290 are connected to a reference voltage, such as a power voltage. As depicted, the cladding connections 1290 are formed in the insulating layer 619 and connect the metal cladding layer 315 to connection ends of the cladding connections 1290 that are disposed on or at the surface of the package 1200, such as major surfaces 1007 and 1005, so that the metal cladding layer 315 can be connected to an external common ground or reference voltage (shown in FIG. 12N as an exemplary connection to ground. The cladding connections 1290 are formed of any suitable conductive material, including but not limited to nickel, copper, aluminum, gold, cobalt, silver, palladium, tin, or the like. The cladding connections 1290 are deposited or plated through cladding vias 633 that may be formed at operation 522 and are substantially similar to the contact holes 632. Accordingly, the cladding vias 633 may be laser drilled through the insulating layer 619 directly above or below the substrate 302 having the metal cladding layer 315 formed thereon. Furthermore, like the interconnections 1044, the cladding connections 1290 may completely fill the cladding vias 633 or line the inner circumferential walls thereof, thus having a hollow core. In some embodiments, the cladding vias 633 have a diameter about 5 μm.

To further clarify the grounding function of the metal cladding layer 315 and the cladding connections 1290, FIG. 12N schematically depicts the package 1200 of FIG. 12M simultaneously stacked with two electronic systems 1295, 1296 and coupled to exemplary ground 1299 (3D integration of the reconstituted substrates 1000 and/or packages 1200, however, is described in greater detail with reference to FIGS. 13A-20F below). Although depicted as being connected to ground 1299, the metal cladding layer 315 may alternatively be connected to, for example, a reference voltage as described above. Each electronic system 1295, 1296 includes a 2D or 3D circuit that includes traces, interconnection wiring, and typically one or more electrical devices. In some embodiments, the electronic system 1295, 1296 include one or more electrical device that form part of an electrical system, such as a SIP, SIC, or SOC, which can include one or more semiconductor devices 1297, 1298, respectively. As shown, the semiconductor device 1297 is electrically coupled to interconnections 1044 adjacent to the major surface 1007 of the package 1200 and the semiconductor device 1298 is electrically coupled to interconnections 1044 adjacent to the major surface 1005. Device connections 1297A, 1298A (which may include interconnections and redistribution connections) of the semiconductor devices 1297, 1298, respectively, may be coupled with the interconnections 1044 or redistribution connections 1244 via any suitable structures and methods, including solder bumps or balls 1246.

Simultaneously, the metal cladding layer 315 may be electrically coupled to external ground 1299 via the cladding connections 1290 and any other suitable coupling means. For example, the cladding connections 1290 may be indirectly coupled to external ground 1299 via solder bumps 1246 on opposing sides of the package 1200. In some embodiments, the cladding connections 1290 may be first routed through a separate electronic system, such as electronic system 1295, before coupling to the external ground 1299. The utilization of a grounding pathway between the metal cladding layer 315 and the external ground 1299 reduces or eliminates interference between interconnections 1044 and/or redistribution connections 1244 and prevents shorting of integrated circuits coupled thereto, which may damage the semiconductor dies 626, package 1200, and any systems or devices integrated therewith.

Figure 13:
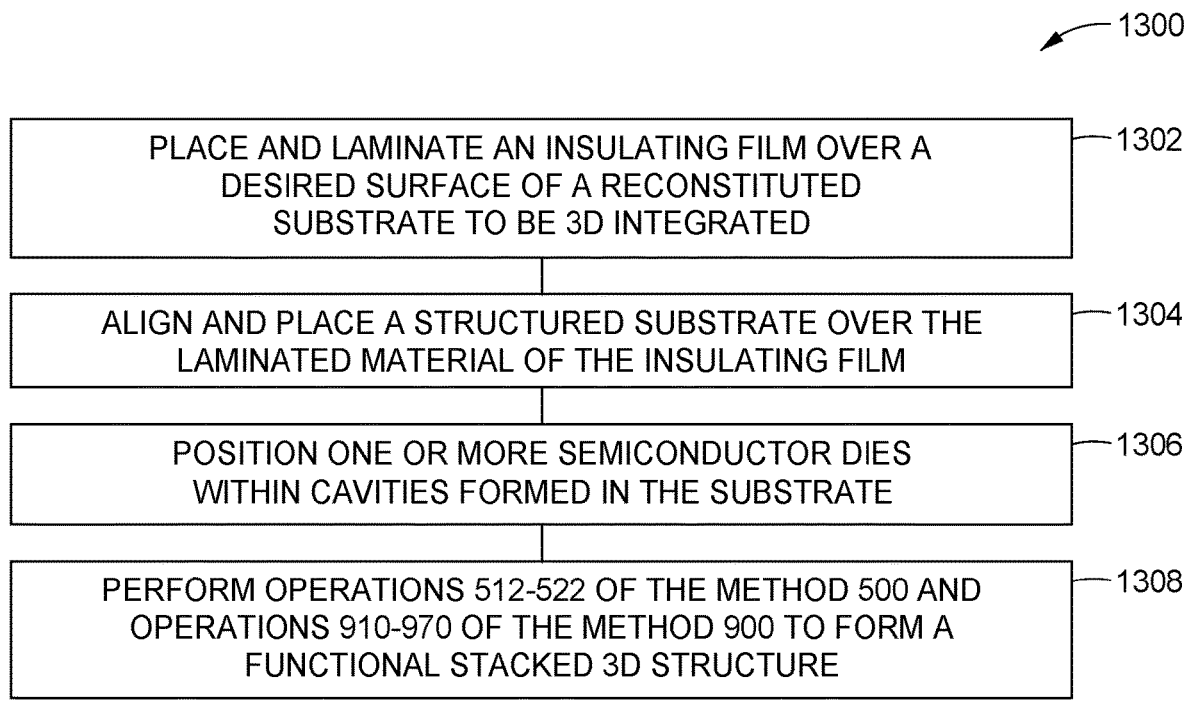
FIG. 13 illustrates a flow diagram of a process for forming a stacked 3D structure integrating a reconstituted substrate by build-up stacking, according to embodiments described herein.
Figure 14C:
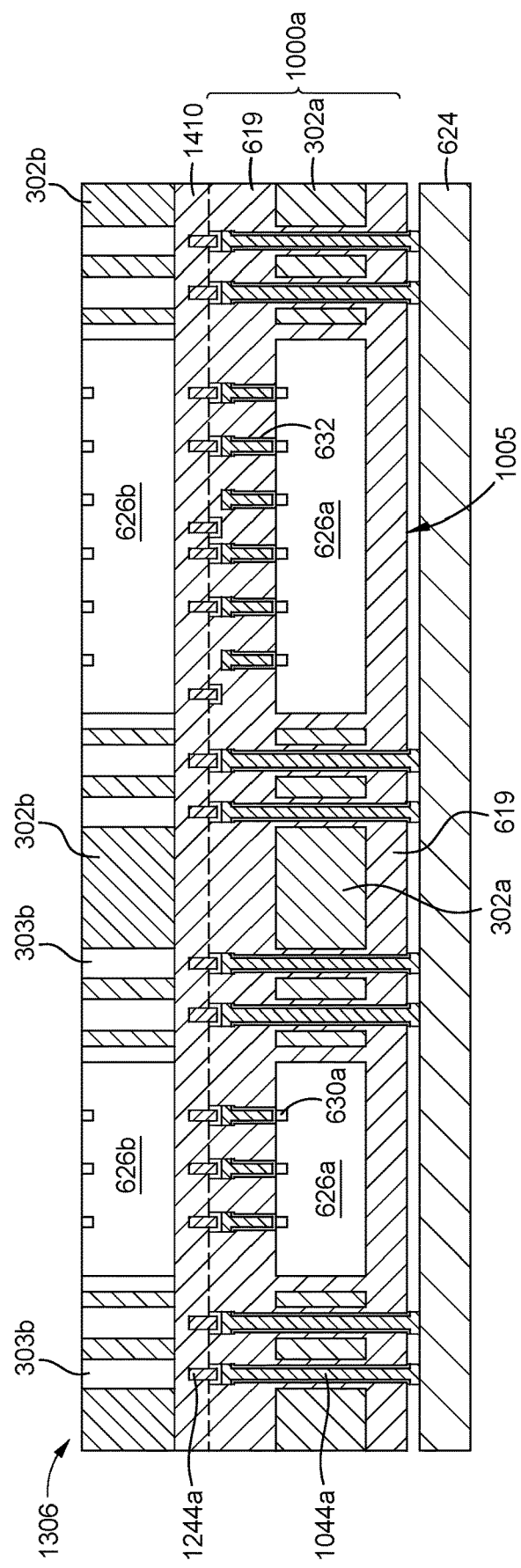
Figure 14D:
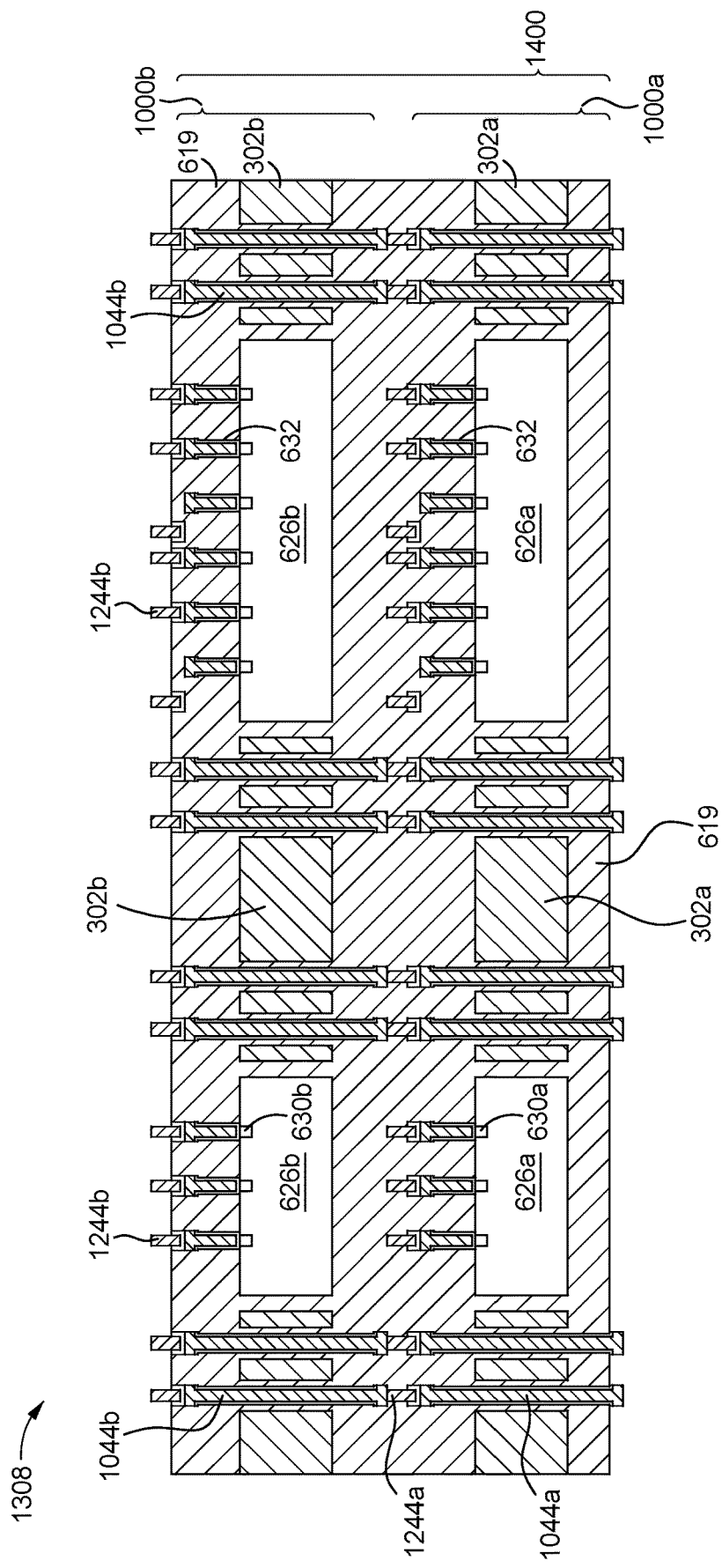

FIG. 13 illustrates a flow diagram of a representative method 1300 of forming an exemplary stacked 3D structure 1400 having two vertically stacked reconstituted substrates. FIGS. 14A-14D schematically illustrate cross-sectional views of the stacked 3D structure 1400 at different stages of the method 1300 depicted in FIG. 13. Thus, FIG. 13 and FIGS. 14A-14D are herein described together for clarity. Further, the methods depicted in FIGS. 13 and 14A-14D and described below involve a build-up technique to form the stacked 3D structure 1400. Accordingly, such methods may be referred to as "build-up stacking."

The method 1300 begins at operation 1302 and FIG. 14A wherein a first insulating film 1416 is placed on a desired surface of a reconstituted substrate 1000a to be integrated with another device, such as another reconstituted substrate, and thereafter laminated. The reconstituted substrate 1000*a* may include all of the features described above with reference to the reconstituted substrate 1000, including a structural frame formed from a substrate 302*a* having cavities 305*a* and vias 303*a* patterned therein.

As depicted in FIG. 14A, the insulating film 1416 is placed on the major surface 1007 having a single redistribution layer 1258*a* formed thereon. Generally, the insulating film 1416 is placed on a surface of the reconstituted substrate 1000*a* having exposed interconnections, such as redistribution connections 1244*a*, that are conductively coupled to the contacts 630*a* on the active surfaces 628*a* of the semiconductor dies 626*a* and/or interconnections 1044*a*. Though depicted as having a single redistribution layer 1258*a*, the reconstituted substrate 1000*a* may have more or less than one redistribution layer formed on any desired surfaces thereof. Furthermore, the method 1300 may be utilized to 3D integrate structures other than the reconstituted substrate 1000*a*, such as the intermediary die assembly 602. Still further, prior to placement and lamination of the insulating film 1416, the reconstituted substrate 1000*a* may be secured on a carrier, such as the carrier 624, for mechanical support during any of the operations of the method 1300.

The insulating film 1416 is substantially similar to the insulating films 616 and 1216 and may include one or more flowable layers 1418 formed of polymer-based dielectric materials and one or more protective layers 1422 formed of, for example, PET. In one embodiment, the flowable layer 1418 includes an epoxy resin material, such as a ceramic-filler-containing epoxy resin material. In another embodiment, the flowable layer 1418 includes a polyimide material, such as a photosensitive or non-photosensitive polyimide material. In still other embodiments, the flowable layer 1418 includes a PBO material, a silicon dioxide material, and/or a silicon nitride material.

In some examples, the material of the flowable layer 1418 is different from the material of the flowable layer 618 and/or the flowable layer 1218. In other examples, the flowable layer 1418 includes the same materials as the flowable layer 618 and/or the flowable layer 1218.

The insulating film 1416 has a total thickness of less than about 80 μm, such as between about 10 μm and about 60 μm. For example, the insulating film 1416 including the flowable layer 1418 and the protective layer 1422 has a total thickness of less than about 120 μm, such as between about 20 μm and about 40 μm. The flowable layer 1418 itself may have a thickness between about 5 and about 50, such as a thickness between about 10 and about 25.

Upon placement of the insulating film 1416, the reconstituted substrate 1000*a* is exposed to a lamination process substantially similar to the lamination processes described above with reference to operations 508, 516, 740, and 1102. The reconstituted substrate 1000*a* is exposed to elevated temperatures to soften the flowable layer 1418 of the insulating film 1416, which subsequently bonds to the major surface 1007 of the reconstituted substrate 1000*a* (e.g., with the redistribution layer 1258*a*). The flowable layer 1418 thus becomes integrated with the insulating layer 619 of the reconstituted substrate 1000*a* and forms a base layer 1410 for any devices and/or structures to be stacked directly thereon. The base layer 1410 covers any exposed interconnections on the surface it is bonded to, such as the redistribution connections 1244*a* on the major surface 1007, and provides a substantially planar structure upon which additional devices may be formed.

In one embodiment, the lamination process at operation 1302 is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between 10 psig and about 100 psig while a temperature of between about 80° C. and about 140° C. is applied to the substrate 302 and insulating film 1216 for a period between about 1 minute and about 30 minutes. For example, the lamination process is performed at a pressure of between about 30 psig and about 80 psig and a temperature of between about 100° C. and about 120° C. for a period between about 2 minutes and about 10 minutes. For example, the lamination process is performed at a temperature of about 110° C. for a period of about 5 minutes. In further examples, the lamination process is performed at a pressure between about 30 psig and about 70 psig, such as about 50 psig.

After lamination, the protective layer 1422 is mechanically removed from the base layer 1410 and the reconstituted substrate 1000*a* is ready to have another device stacked thereon (e.g., vertically integrated therewith).

In the exemplary embodiment depicted in FIG. 13 and FIGS. 14A-14D, the reconstituted substrate 1000*a* is stacked with a second reconstituted substrate 1000*b* by build-up stacking, wherein the second reconstituted substrate 1000*b* is built up directly over the reconstituted substrate 1000*a* in a manner substantially similar to the operations described with reference to methods 500 and 900. Thus, for clarity, only operations 1304 and 1306 will be described in further detail, as the remaining operations of method 1300 are described above with reference to methods 500 and 900.

At operation 1304, a second structured substrate 302*b* is placed upon the base layer 1410 formed on the reconstituted substrate 1000*a*. The second structured substrate 302*b* may include any desired features patterned therein, including vias 303*b* for formation of interconnections therethrough and cavities 305*b* for placement of semiconductor dies therein. In some embodiments, the substrate 302*b* further includes an oxide layer 314, such as a silicon oxide film formed on desired surfaces thereof for insulation. During placement, the substrate 302*b* is aligned with the reconstituted substrate 1000*a* such that vias 303*b* formed in the substrate 302*b* are aligned with contact points of the redistribution connections 1244*a* or interconnections 1044*a*. In some embodiments, the substrate 302*b* may be placed over the base layer 1410 such that the vias 303*b* are disposed directly above the interconnections 1044*a* and/or redistribution connections 1244*a*.

At operation 1306, one or more semiconductor dies 626*b* are placed within the cavities 305*b* formed in the substrate 302*b*. As described above, the cavities 305*b* may have any desired lateral dimensions and geometries, thus enabling placement of different types of semiconductor devices and/or dies in any desired arrangement for heterogeneous 3D integration. Accordingly, the one or more semiconductor dies 626 placed in the cavities 305*b* may be of the same type or of different types from each other and/or the semiconductor dies 626 embedded within the reconstituted substrate 1000*a*. Furthermore, the semiconductor dies 626 within each reconstituted substrate 1000*a* and 1000*b* may be of the same or different types and have different shapes, dimensions, and/or arrangements. Generally, even if the semiconductor dies 626 in each reconstituted substrate 1000*a* or 1000*b* are of different types and/or have different shapes, dimensions, and/or arrangements, the lateral dimensions of the reconstituted substrates 1000*a*, 1000*b* (e.g., the substrates 302*a*, 302*b*) are still substantially the same to enable build-up stacking. However, it is contemplated that reconstituted substrates of different lateral dimensions may be stacked together by the build-up stacking methods described herein.

After placement of the dies 626*b* within the cavities 305*b* (i.e., FIG. 14C), operations 512-522 of the method 500 and operations 910-970 of the method 900 are performed to the substrate 302*b* at operation 1308 to form a completed reconstituted substrate 1000*b* over the reconstituted substrate 1000*a*, thus forming the 3D stacked structure 1400. For example, an insulating layer is formed around the substrate 302*b* by placing, laminating, and curing an insulating film substantially similar to films 616 and 1416 over the substrate 302*b*. A flowable layer of the insulating film may flow into the vias 303*b* and the cavities 305*b* and integrate with the base layer 1410 and insulating layer 619 upon lamination, thus forming an extension of the insulating layer 619. Accordingly, the insulating layer 619 may be described as being extended to substantially surround both the substrate 302*a* and the substrate 302*b* to form a singular and integrated 3D device structure.

Upon the formation of an insulating layer around the substrate 302*b*, the substrate 302*b* has one or more interconnections 1044*b* formed therein. Similar to the processes described above, one or more through-assembly vias are laser-drilled through the vias 303*b*, now filled with the extended insulating layer 619. The drilling of through-assembly vias in the substrate 302*b* exposes contact points (e.g., top surfaces) of the redistribution connections 1244*a* and the interconnections 1044*a* of the reconstituted substrate 1000*a* below, enabling the interconnections 1044*b* to be formed in direct contact with the redistribution connections 1244*a* and the interconnections 1044*a*. Therefore, after exposing the underlying conductive features by laser drilling, interconnections 1044*b* may be formed in (e.g., by growing or plating conductive material) directly over and in contact with the redistribution connections 1244*a* and the interconnections 1044*a*, eliminating any need for the utilization of intermediary electrical coupling structures between the reconstituted substrates 1000*a* and 1000*b*, such as solder bumps or contact pads.

The interconnections 1044*b* formed through the reconstituted substrate 1000*b* are formed by any suitable methods including electroplating and electroless deposition. In some embodiments, the interconnections 1044*b* completely fill the through-assembly vias and contact holes in which they are formed or only cover inner circumferential walls thereof. For example, the interconnections 1044*b* may line the inner circumferential walls of their corresponding through-assembly vias and have hollow cores. In some embodiments, the interconnections 1044*b* are formed of copper. In other embodiments, the interconnections 1044*b* may be formed of any suitable conductive material including but not limited to aluminum, gold, nickel, silver, palladium, tin, or the like. Further, the interconnections 1044*b* may be formed of the same or different conductive material than the interconnections 1044*a* and/or redistribution connections 1244*a* of the reconstituted substrate 1000*b*. In some embodiments, the material of the interconnections 1044*b* of the reconstituted has a different grain size than the material of the interconnections 1044*a* and/or the redistribution connections 1244*a*.

In some embodiments, after interconnection formation, one or more redistribution layers 1258*b* having redistribution connections 1244*b* may be formed upon the reconstituted substrate 1000*b*. Accordingly, the formation of the reconstituted substrate 1000*b* results in a fully functional stacked 3D structure 1400 that vertically integrates the reconstituted substrates 1000*a*, 1000*b*, depicted in FIG. 14D. Thus, after formation of the stacked 3D structure 1400, one or more additional devices may be stacked upon the 3D structure 1400 by build-up stacking or other stacking methods, or the 3D structure 1400 may be singulated into individual 3D packages or SiPs.

The devices and methods described above provide many advantages over conventional stacking arrangements and may be utilized in any suitable advanced 2.5D or 3D integration application. In one exemplary embodiment depicted in FIG. 15A, the method 1300 is utilized to efficiently form 3D stacked DRAM structures 1500*a*-*c* in heterogeneous batches, with each stacked DRAM structure 1500*a*-*c* having a different grade of memory die 1526*a*-*c* embedded therein, respectively. Thus, during formation or the reconstituted substrates 1000, each grade of memory dies 1526*a*-*c* is sorted and placed in the same designated cavities formed in the substrate frames (e.g., substrate 302) of each reconstituted substrate 1000. Upon forming the stack of the reconstituted substrates 1000, individual stacked DRAM structures 1500*a*-*c* may then be singulated from the stacked reconstituted substrates 1000 to form individual stacks. Accordingly, the method 1300 may be utilized to achieve batch memory stacking, wherein each memory stack may comprise of only one type of memory die for performance matching. While not illustrated in FIG. 15A, in some embodiments, the singulated stacks may include two or more silicon dies within a cavity 305 thereof.

In another exemplary embodiment, the stacked DRAM structures 1500*a*-*c* are integrated into high bandwidth memory (HBM) modules having large parallel interconnect densities between memory dies and central processing unit (CPU) cores or logic dies. Traditionally, HBM modules include a flip chip DRAM die stack interconnected to a logic die by a silicon interposer and solder bumps. Bandwidth between the DRAM die stack and the logic die is therefore limited by the size of the solder bumps and the pitch therebetween, which is generally larger than about 20 µm. A smaller pitch between memory die interconnections of an HBM module, however, is enabled by utilizing stacked memory dies, such as the stacked DRAM structures 1500*a*-*c* described above, and embedding them into the cavity 305 of a larger reconstituted substrate 1000 along with a logic die, as illustrated in FIGS. 15*b* and 15*c*.

Figure 15A:
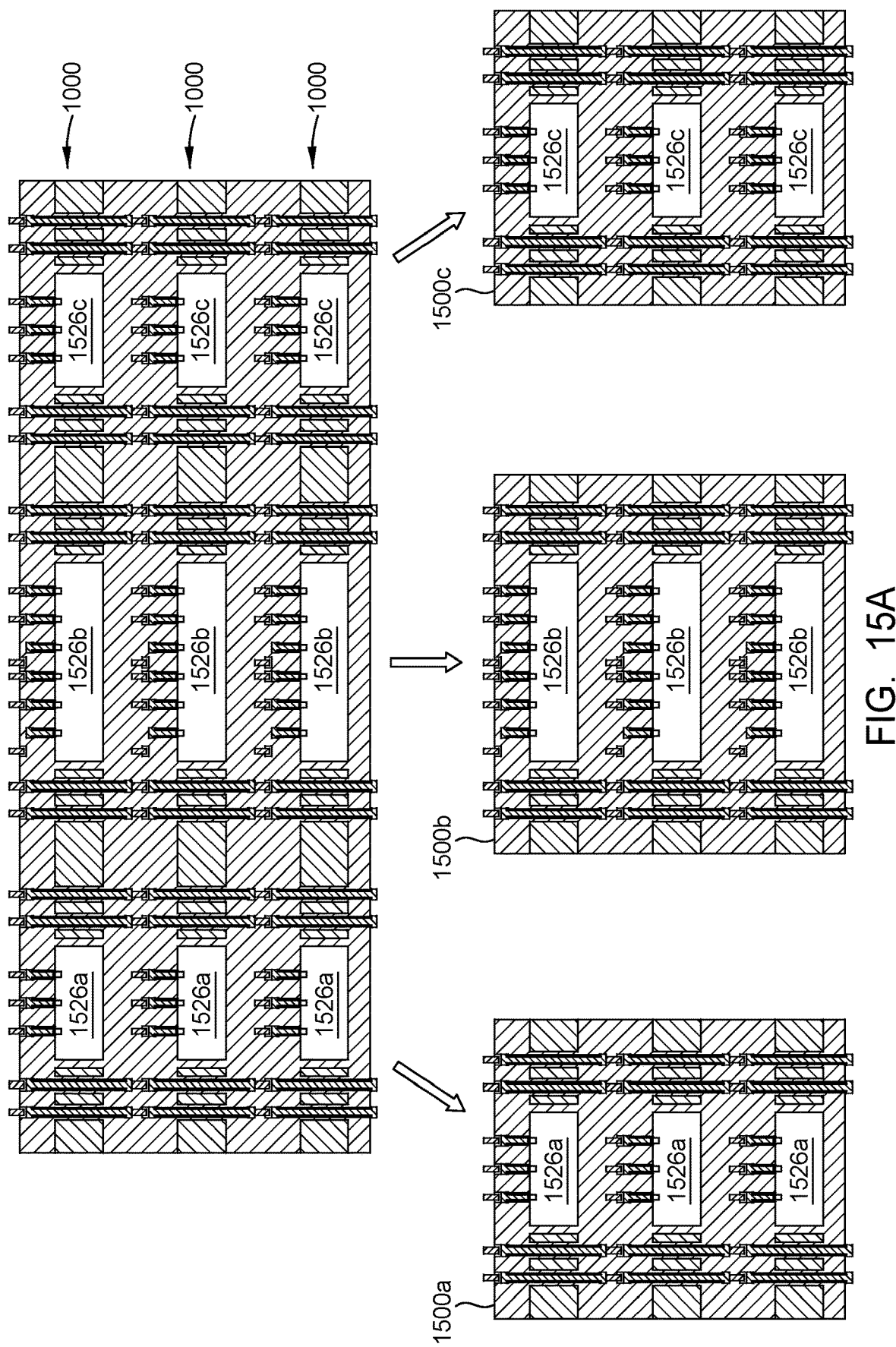
FIG. 15A-15C schematically illustrate cross-sectional views of structures incorporating dynamic random access memory (DRAM) stacks formed by the process depicted in FIG. 13, according to embodiments described herein.
Figure 15B:
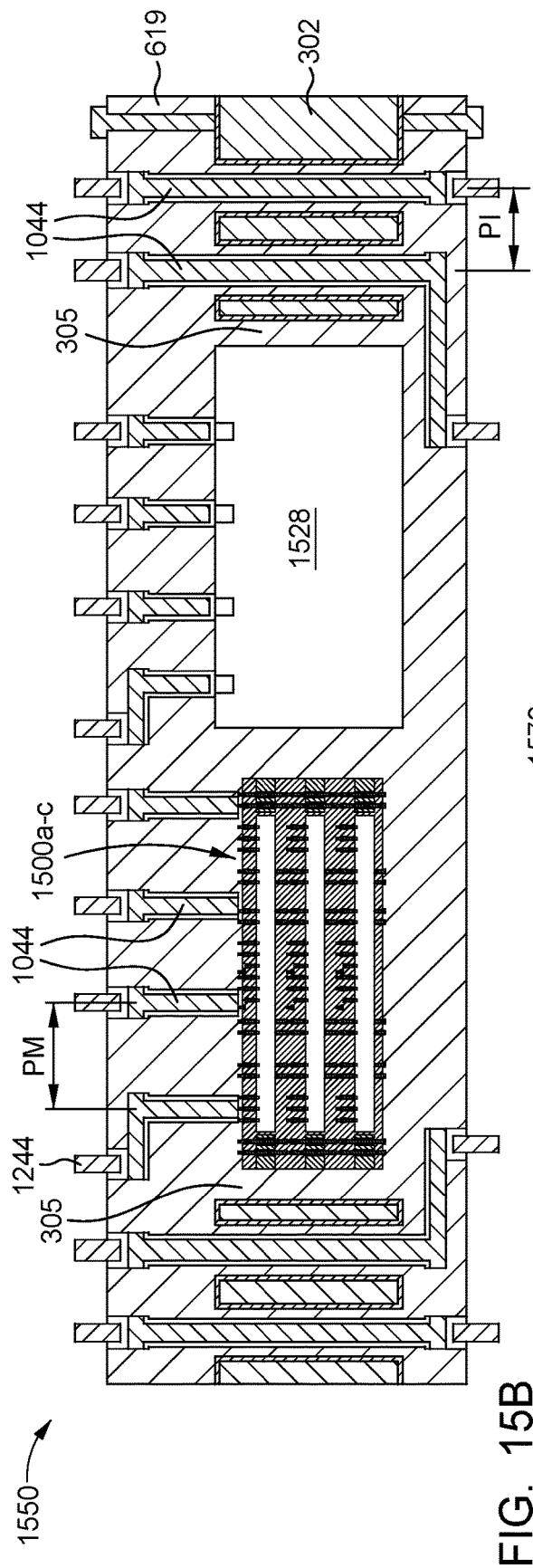
Figure 15C:
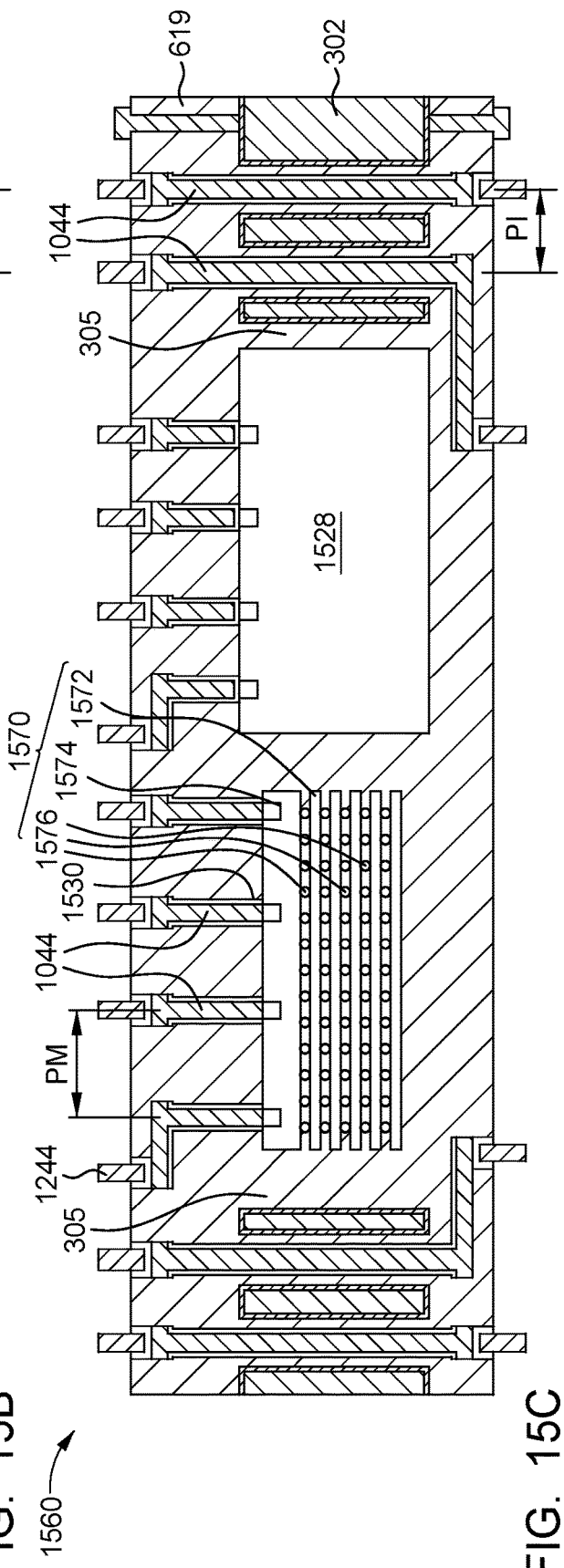
Figure 16:
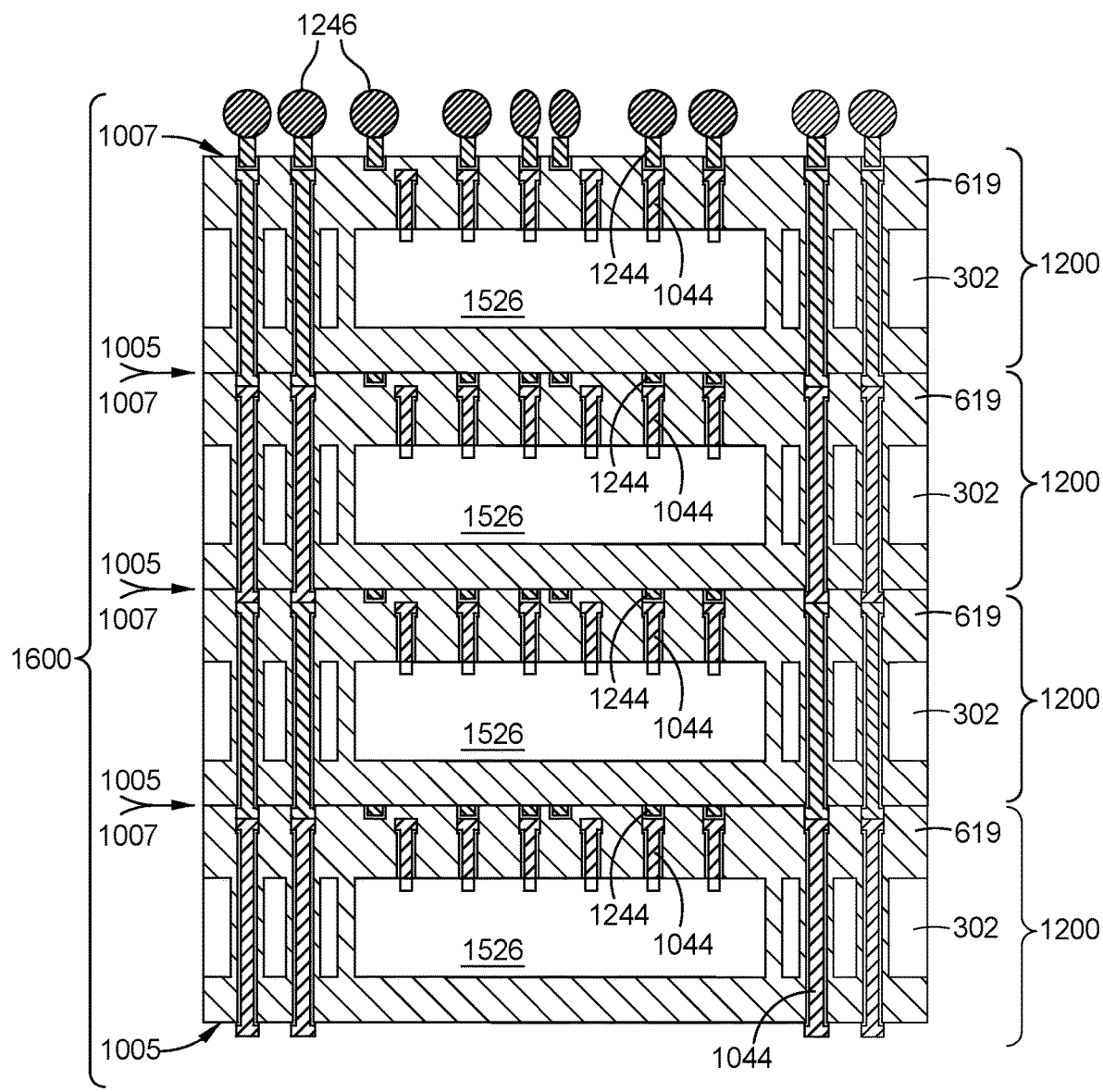
FIG. 16 schematically illustrates a stacked 3D structure integrating a reconstituted substrate, according to embodiments described herein.

As depicted in FIG. 15*b*, an HBM structure 1550 may include any of the stacked DRAM structures 1500*a*-*c* embedded within the cavity 305 of the reconstituted substrate 1000. Alternatively, FIG. 15*c* illustrates an HBM structure 1560 having an exemplary HBM flip chip stack 1570 in place of the DRAM structures 1500*a*-*c*. The HBM flip chip stack 1570 generally comprises a stack of DRAM memory dies 1572 communicatively coupled to a controller die 1574, all interconnected by solder bumps 1576. To account for the thickness of the memory die stacks, the substrate 302 of the reconstituted substrate 1000 has a thickness less than about 900 µm, such as less than about 800 µm, such as for example, less than about 775 µm. A pitch Pi between centers of the interconnections 1044 through the reconstituted substrate 1000 is between 150 µm and about 250 µm, such as about 200 µm.

The DRAM structure 1500*a*-*c* or HBM flip chip stack 1570 are embedded within the cavity 305 alongside an active logic die 1528 and are interconnected therewith by the interconnections 1044 and redistribution connections 1244. Utilizing the methods described above, such as methods 900 and 1100, a pitch PM of less than about 20 µm between interconnections 1044 coupled to the contacts 1530 of the memory stacks as well as the interconnections 1044 coupled to the active logic die 1528 is enabled. Thus, the density of the interconnections 1044 coupling the DRAM structure 1500*a-c* or the HBM flip chip stack 1570 with the active logic die 1528 is increased, improving the performance of the HBM structures 1550 and 1560.

Another exemplary embodiment of a stacked structure utilizing the devices and methods described above is depicted in FIG. 16, where four packages 1200 are homogenously integrated by wafer-to-wafer polymer-copper hybrid bonding to form a stacked structure 1600. As depicted, each package 1200 includes a memory die 1526 embedded within the substrate 302 and encapsulated by the insulating layer 619 (e.g., having a portion of each side in contact with the insulating layer 619). One or more interconnections 1044 are formed though the entire thickness of each package 1200, which are directly bonded with one or more adjacent packages 1200. Although memory dies 1526 are depicted, any type of semiconductor device or die, such as semiconductor dies 626, may be utilized.

The wafer-to-wafer bonding of the packages 1200 may be accomplished by planarizing the major surfaces 1005, 1007 of adjacent reconstituted substrates 1000 (prior to singulation) or packages 1200 (after singulation) and placing the major surfaces 1005, 1007 against one another while applying physical pressure, elevated temperatures, or an electrical field to the packages. Upon bonding, the one or more interconnections 1044 and/or redistribution connections 1244 of each reconstituted substrate 1000 or package 1200 directly contact one or more interconnections or redistribution connections of an adjacent reconstituted substrate 1000 or package 1200, thus forming electrically conducting paths that may span the thickness or height of the entire DRAM structure 1600. One or more solder bumps 1246 may then be plated or deposited over the interconnections 1044 and/or redistribution connections 1244 for further integration with other systems and/or devices.

Wafer-to-wafer bonding of the packages 1200 enables the stacking of semiconductor dies 626 differing in size and without the utilization of solder bumps, providing a CTE-matched stack since both the semiconductor dies 626 and the substrates 302 are made of silicon. The close-proximity stacking of individual packages 1200 further provides a rigid structure that reduces or eliminates warping and/or sagging thereof. Without solder bumps, copper interconnections 1044 of individual packages 1200 may also be directly coupled to each other, thus reducing or eliminating reliability issues associated with intermetallic reactions caused by solder bumps.

Figure 17A:
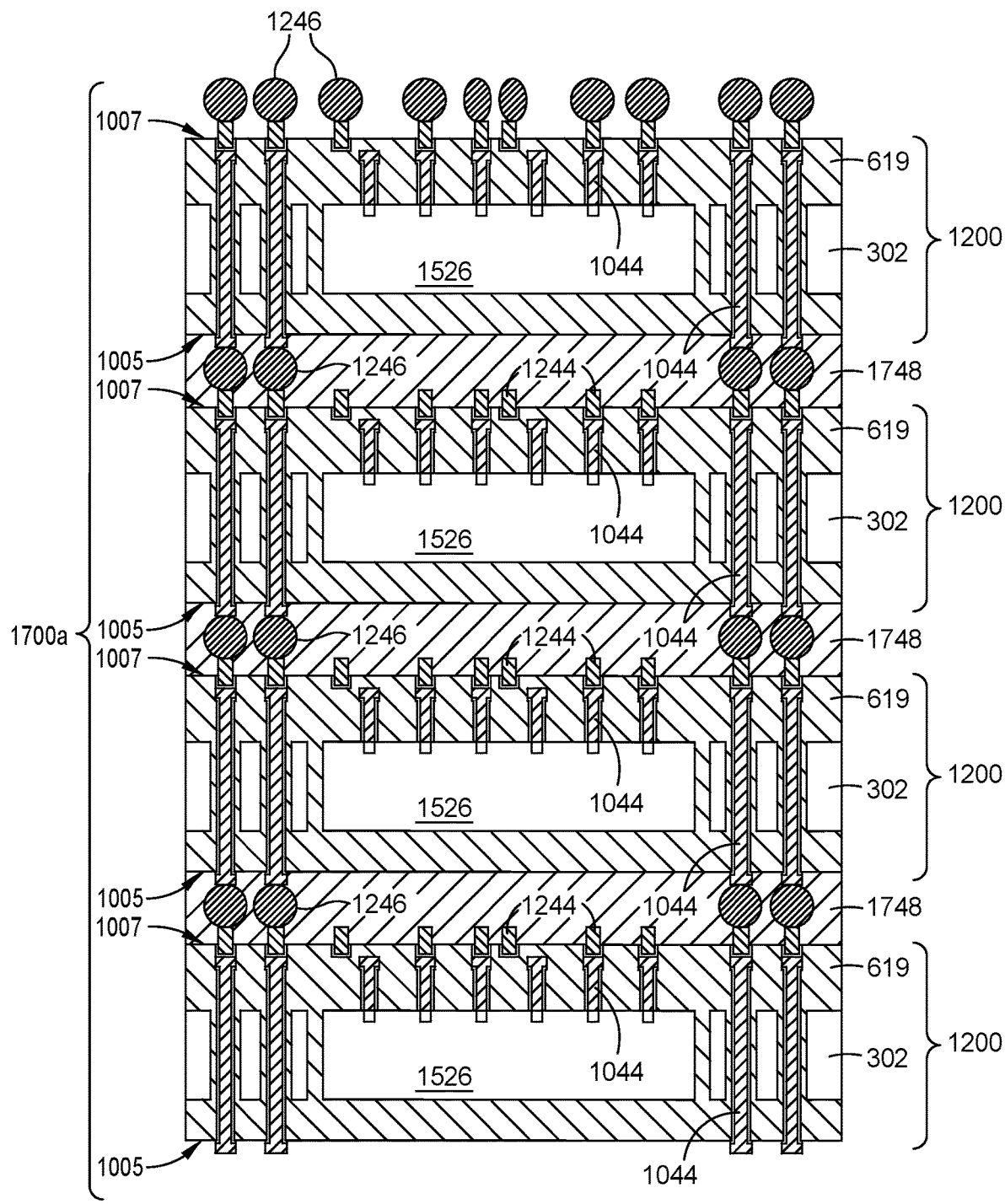
FIGS. 17A-17B schematically illustrate stacked 3D structures integrating a reconstituted substrate, according to embodiments described herein.
Figure 17B:
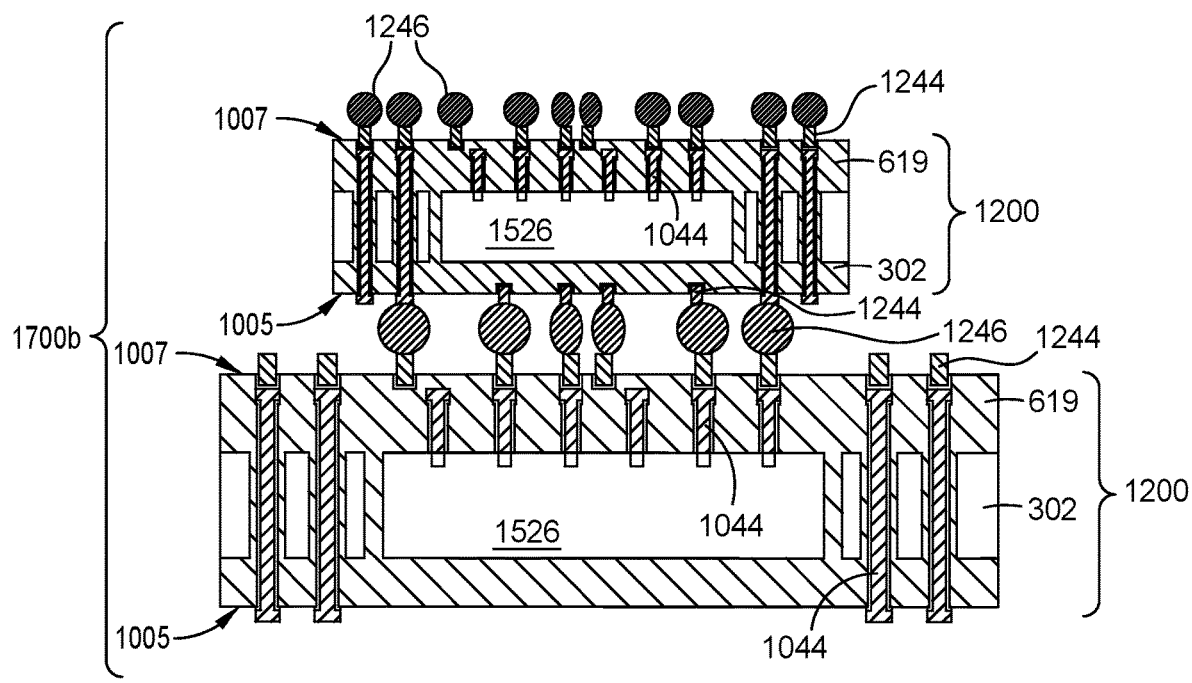

FIGS. 17A-17B illustrate additional exemplary stacked structures 1700*a* and 1700*b* similar to stacked structure 1600. Unlike stacked structure 1600, however, one or more interconnections 1044 are directly in contact with one or more solder bumps 1246 disposed between major surfaces 1005 and 1007 of adjacent (i.e., stacked above or below) packages 1200. For example, as depicted in the stacked structure 1700*a*, four or more solder bumps 1246 are disposed between adjacent packages 1200 to bridge (e.g., connect, couple) the interconnections 1044 of each package 1200 with the interconnections 1044 of an adjacent package 1200. The utilization of solder bumps 1246 enables the stacking of semiconductor dies, packages, and/or reconstituted substrates having the same or different lateral dimensions. FIG. 17A illustrates four stacked memory dies 1526 and packages 1200 having substantially the same lateral dimensions, while FIG. 17B illustrates two stacked packages 1200 with memory dies 1526 having different dimensions.

The utilization of solder bumps 1246 to bridge interconnections 1044 of adjacent packages 1200 further creates a space (e.g., distance) between the insulating layers 619 thereof. In one embodiment, these spaces are filled with an encapsulation material 1748 to enhance the reliability of the solder bumps 1246. The encapsulation material 1748 may be any suitable type of encapsulant or underfill. In one example, the encapsulation material 1748 includes a pre-assembly underfill material, such as a no-flow underfill (NUF) material, a nonconductive paste (NCP) material, and a nonconductive film (NCF) material. In one example, the encapsulation material 1748 includes a post-assembly underfill material, such as a capillary underfill (CUF) material and a molded underfill (MUF) material. In one embodiment, the encapsulation material 1748 includes a low-expansion-filler-containing resin, such as an epoxy resin filled with (e.g., containing) $SiO_2$, AlN, $Al_2O_3$, SIC, $Si_3N_4$, $Sr_2Ce_2Ti_5O_{16}$, $ZrSiO_4$, $CaSiO_3$, BeO, $CeO_2$, BN, $CaCu_3Ti_4O_{12}$, MgO, $TiO_2$, ZnO and the like. In some embodiments, the encapsulation material 1748 has a thickness corresponding to the diameters of the solder bumps 1246.

In one embodiment, the solder bumps 1246 are formed of one or more intermetallic compounds, such as a combination of tin (Sn) and lead (Pb), silver (Ag), Cu, or any other suitable metals thereof. For example, the solder bumps 1246 are formed of a solder alloy such as Sn—Pb, Sn—Ag, Sn—Cu, or any other suitable materials or combinations thereof. In one embodiment, the solder bumps 1246 include C4 (controlled collapse chip connection) bumps. In one embodiment, the solder bumps 1246 include C2 (chip connection, such as a Cu-pillar with a solder cap) bumps. Utilization of C2 solder bumps enables a smaller pitch between contact pads and improved thermal and/or electrical properties for the stacked structure 1700. In some embodiments, the solder bumps 1246 have a diameter between about 10 μm and about 150 μm, such as a diameter between about 50 μm and about 100 μm. The solder bumps 1246 may further be formed by any suitable wafer bumping processes, including but not limited to electrochemical deposition (ECD) and electroplating.

Figure 18:
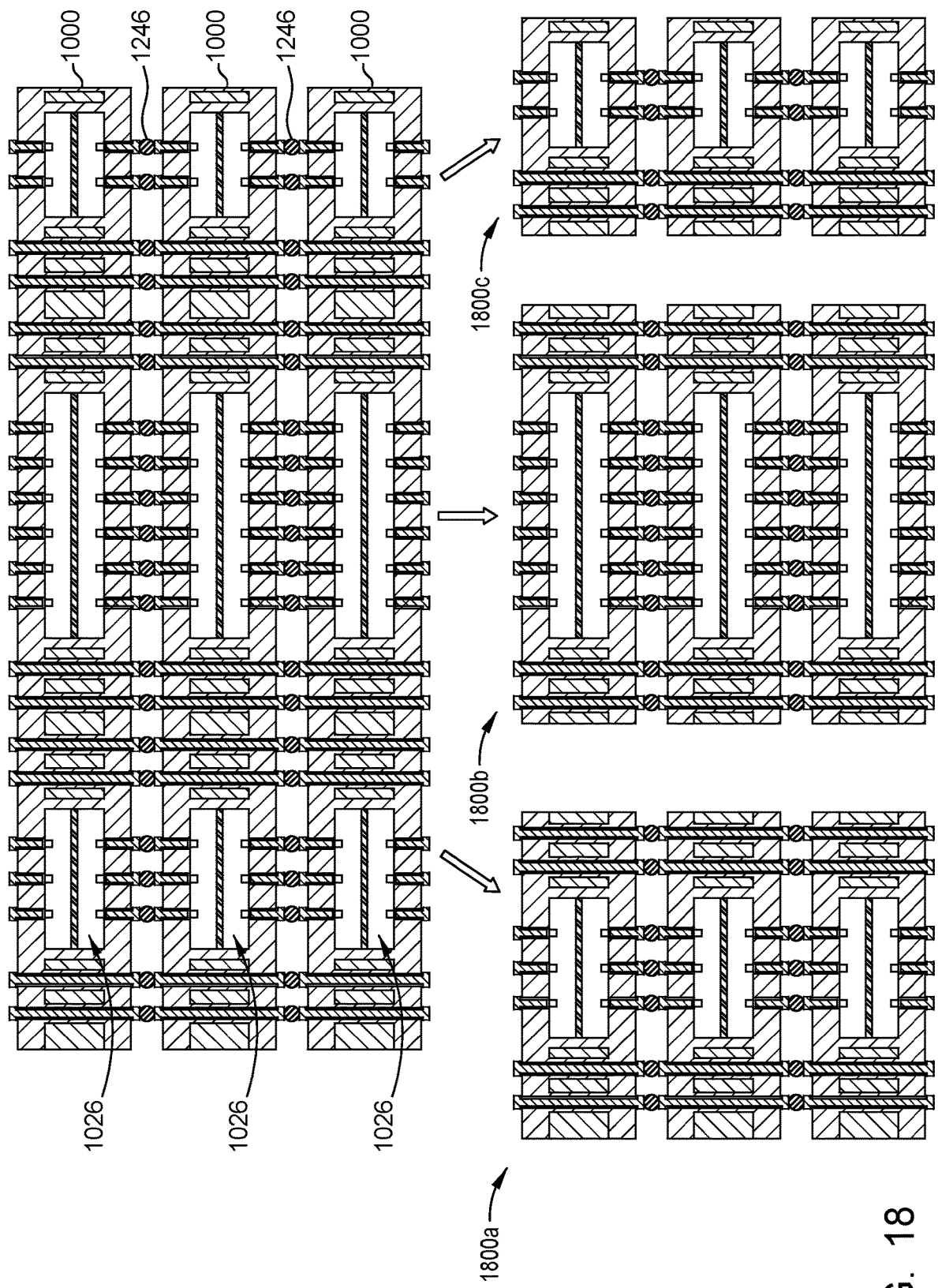
FIG. 18 schematically illustrates cross-sectional views of dynamic random access memory (DRAM) stacks formed by processes described herein, according to certain embodiments.

FIG. 18 schematically illustrates an efficient method of forming individual stacked memory (e.g., DRAM) structures 1800*a-c* utilizing solder bumps 1246 instead of build-up stacking methods, similar to stacked structure 1700*a*. As depicted, desired memory dies 1526 are embedded within reconstituted substrates 1000 and stacked utilizing solder bumps 1246 to provide coupling between interconnections and/or redistribution connections of each reconstituted substrate 1000. In the exemplary embodiment shown in FIG. 18, the memory dies 1526 in each reconstituted substrate 1000 are arranged within die stacks 1026, previously described with reference to FIGS. 10I-10K and the method 900. It is also contemplated that the memory dies 1526 may be individual placed or arranged in a side-by-side configuration with additional memory dies 1526 in each cavity of the reconstituted substrates 1000. After a desired number of reconstituted substrates 1000 are stacked with the solder bumps 1246, individual stacked DRAM structures 1800*a-c* may be singulated therefrom, thus enabling batch memory stacking with solder bumps 1246.

Figure 19:
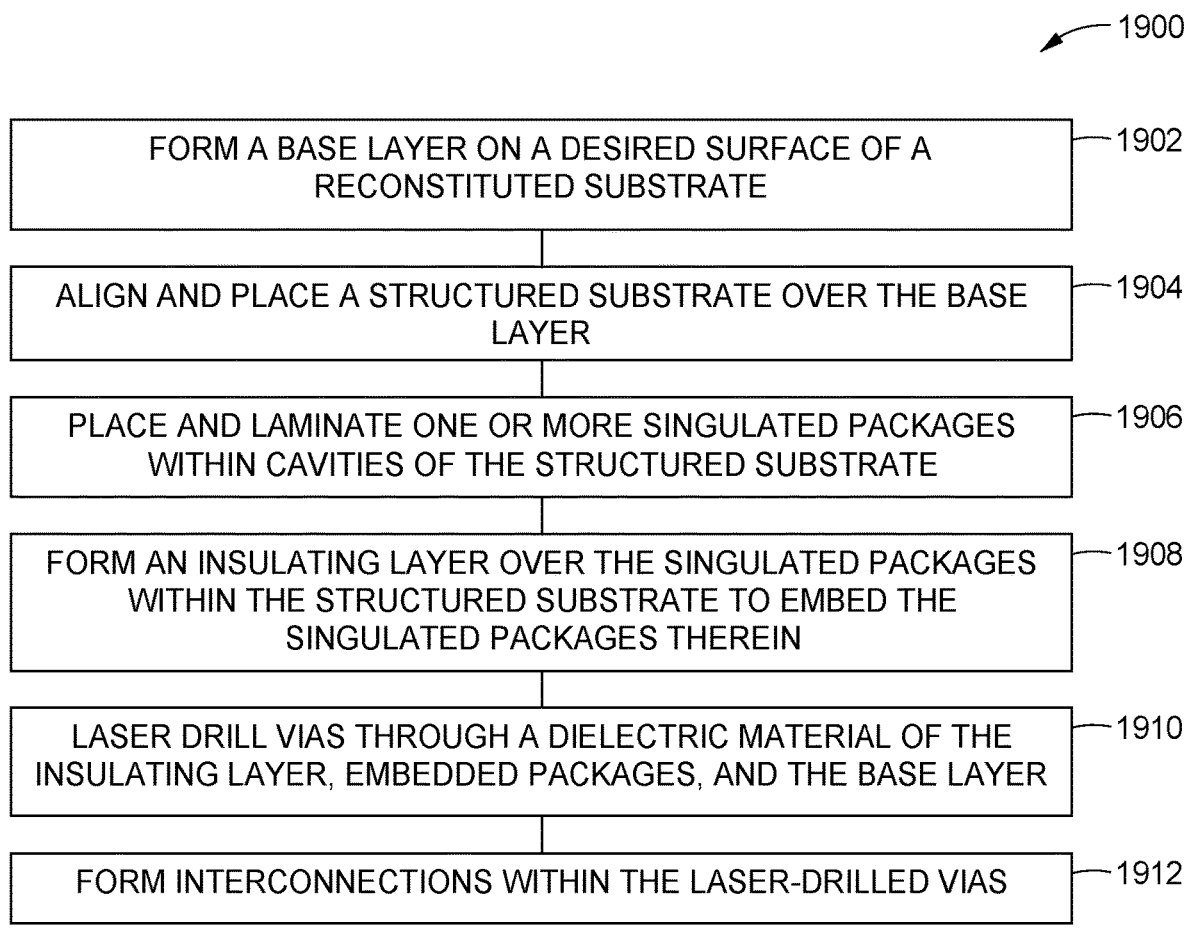
FIG. 19 illustrates a flow diagram of a process for forming a stacked 3D structure integrating a reconstituted substrate by build-up stacking, according to embodiments described herein.

The stacked structures and methods described above generally include embedded semiconductor dies and devices having substantially the same vertical orientation, wherein active surfaces thereof face the same direction or side of the stacked structure. It is further contemplated, however, that semiconductor dies and other devices may be embedded within the above-described structures having differing (e.g., opposite) orientations. FIG. 19 illustrates a flow diagram of a representative method 1900 of forming an exemplary stacked 3D structure 2000 wherein embedded semiconductor dies or other devices have different vertical orientations between different layers (e.g., levels). FIGS. 20A-20F schematically illustrate cross-sectional views of the stacked 3D structure 2000 at different stages of the method 1900. Thus, FIG. 19 and FIGS. 20A-20F are herein described together for clarity. As with the method 1300, the methods depicted with reference to FIGS. 19 and 20A-20F may also be described as "build-up stacking."

Figure 20A:
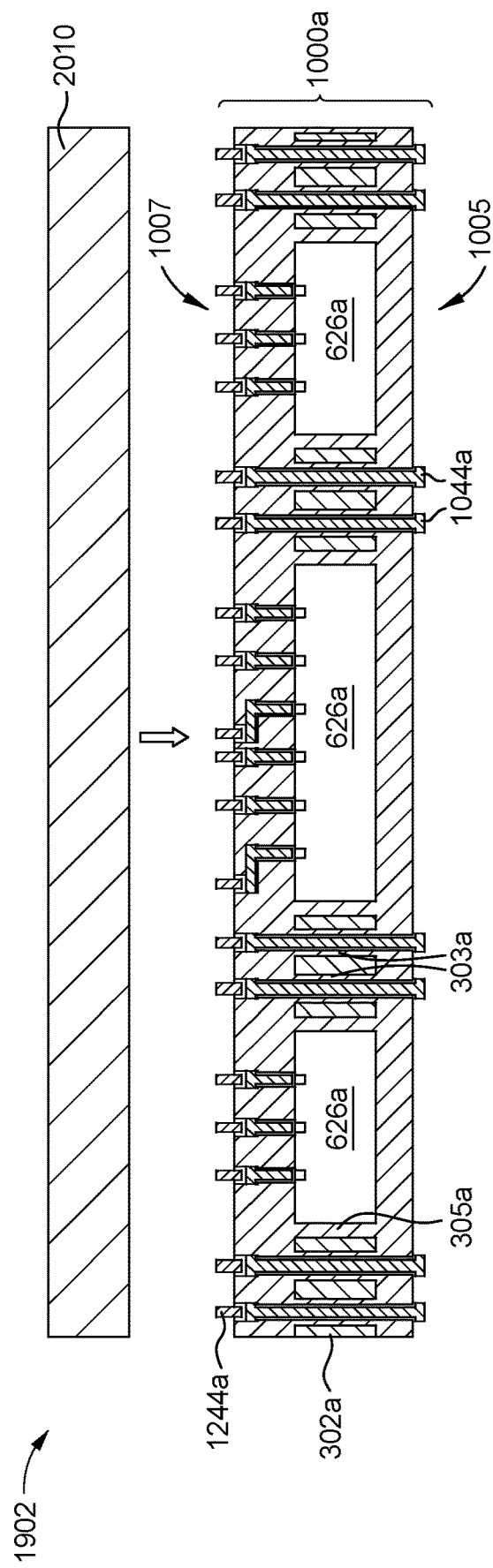
FIGS. 20A-20F schematically illustrate cross-sectional views of a stacked 3D structure at different stages of build-up stacking, as depicted in FIG. 19.

Generally, the method 1900 begins at operation 1902 and FIG. 20A wherein a base layer 2010 is formed on a desired surface of the reconstituted substrate 1000a to be integrated with another layer of devices. The reconstituted substrate 1000a may include all of the features described above, including a structural frame formed from a silicon substrate 302a and having cavities 305a and vias 303a patterned therein. The base layer 2010 is substantially similar to the base layer 1410 and may be formed of the same materials and by the same methods described above with reference to FIGS. 13 and 14A-14D.

As depicted in FIG. 20A, the base layer 2010 is formed over the major surface 1007 having a single redistribution layer 1258a thereon. Though depicted as having a single redistribution layer 1258a, the reconstituted substrate 1000a may have more or less than one redistribution layer formed on any desired surfaces thereof. Generally, the base layer 2010 is formed on a surface of the reconstituted substrate 1000a corresponding with the side towards which active surfaces 628a of semiconductor dies 626a are facing (e.g., oriented towards). In the present example, the active surfaces 628a are oriented towards the side 677 of the substrate 302a.

Figure 20B:
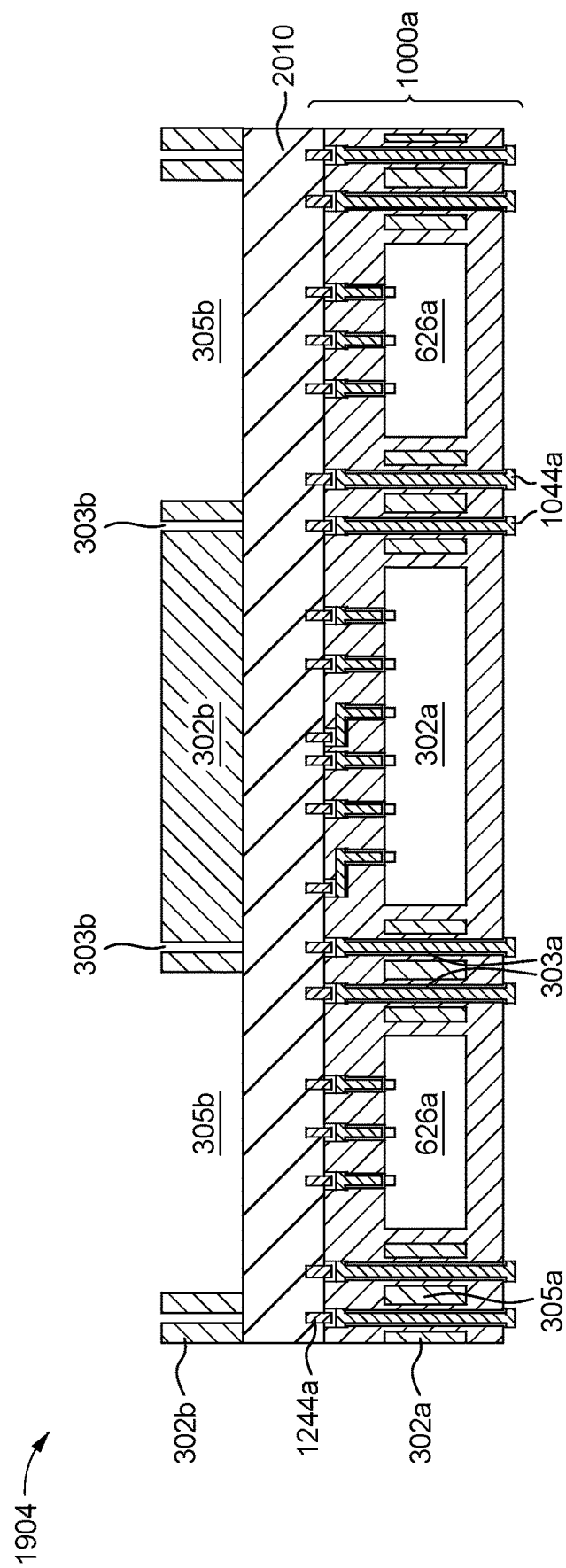

At operation 1904 and FIG. 20B, a structured substrate 302b is aligned and placed upon the base layer 2010 formed on the reconstituted substrate 1000a. Generally, the structured substrate 302b has dimensions substantially the same as the substrate 302a of the reconstituted substrate 1000a. As described with reference to the method 1300, the second structured substrate 302b may include any desired features patterned therein, including vias 303b and cavities 305b. In some embodiments, the substrate 302b further includes an oxide layer 314 or metal cladding layer 315. During placement, the substrate 302b is aligned with the reconstituted substrate 1000a such that vias 303b formed in the substrate 302b are aligned with contact points of the redistribution connections 1244a or interconnections 1044a.

Figure 20C:
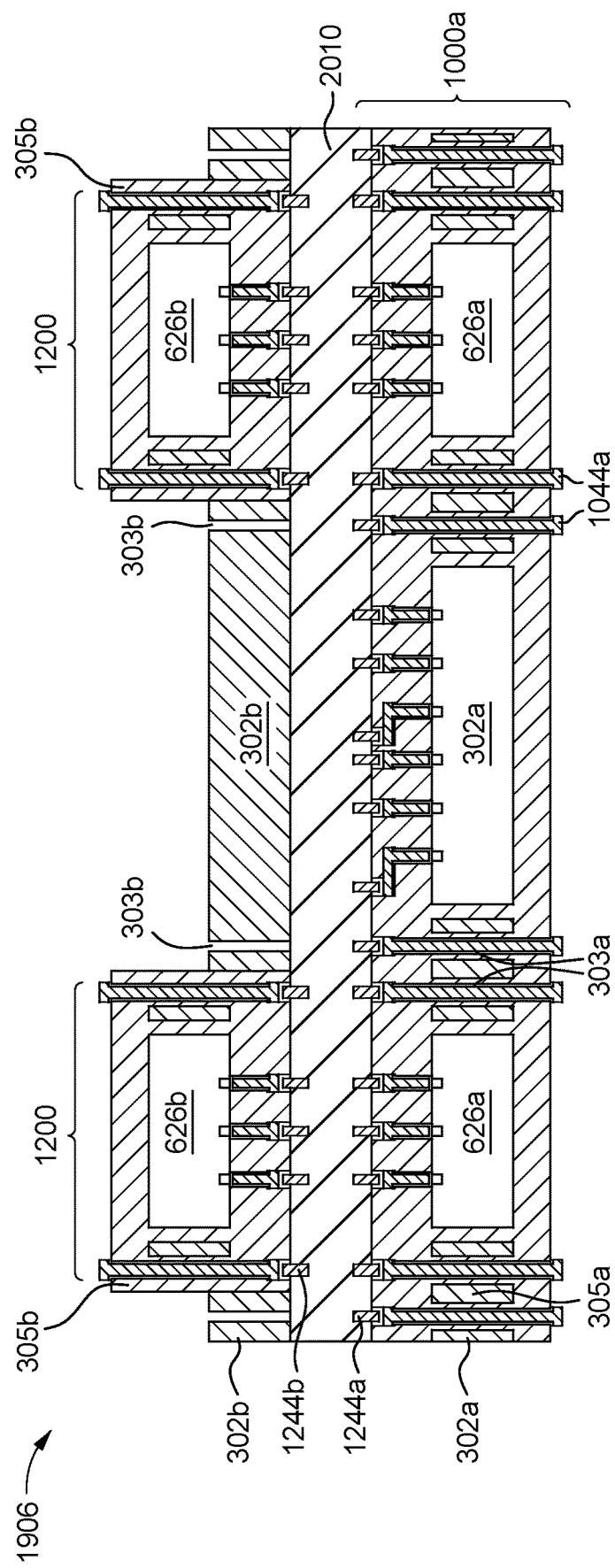

At operation 1906, one or more singulated packages 1200, each having one or more semiconductor dies 626b, are placed within the cavities 305b and are thereafter laminated. As depicted in FIG. 20C, the singulated packages 1200 are placed in the cavities 305b with active surfaces 628b of the semiconductor dies 626b facing the base layer 2010, therefore being in an orientation opposite that of the active surfaces 628a. As previously described, the cavities 305b may have any desired lateral dimensions and geometries to enable placement of packages 1200 having different types of semiconductor devices and/or dies therein. Accordingly, the semiconductor dies 626b may be of the same type or of different types from each other and/or the semiconductor dies 626a embedded within the reconstituted substrate 1000a. It is further contemplated that in certain embodiments, intermediary die assemblies 602 may be placed within the cavities 305b in place of the singulated packages 1200, or in addition thereto.

Figure 20D:
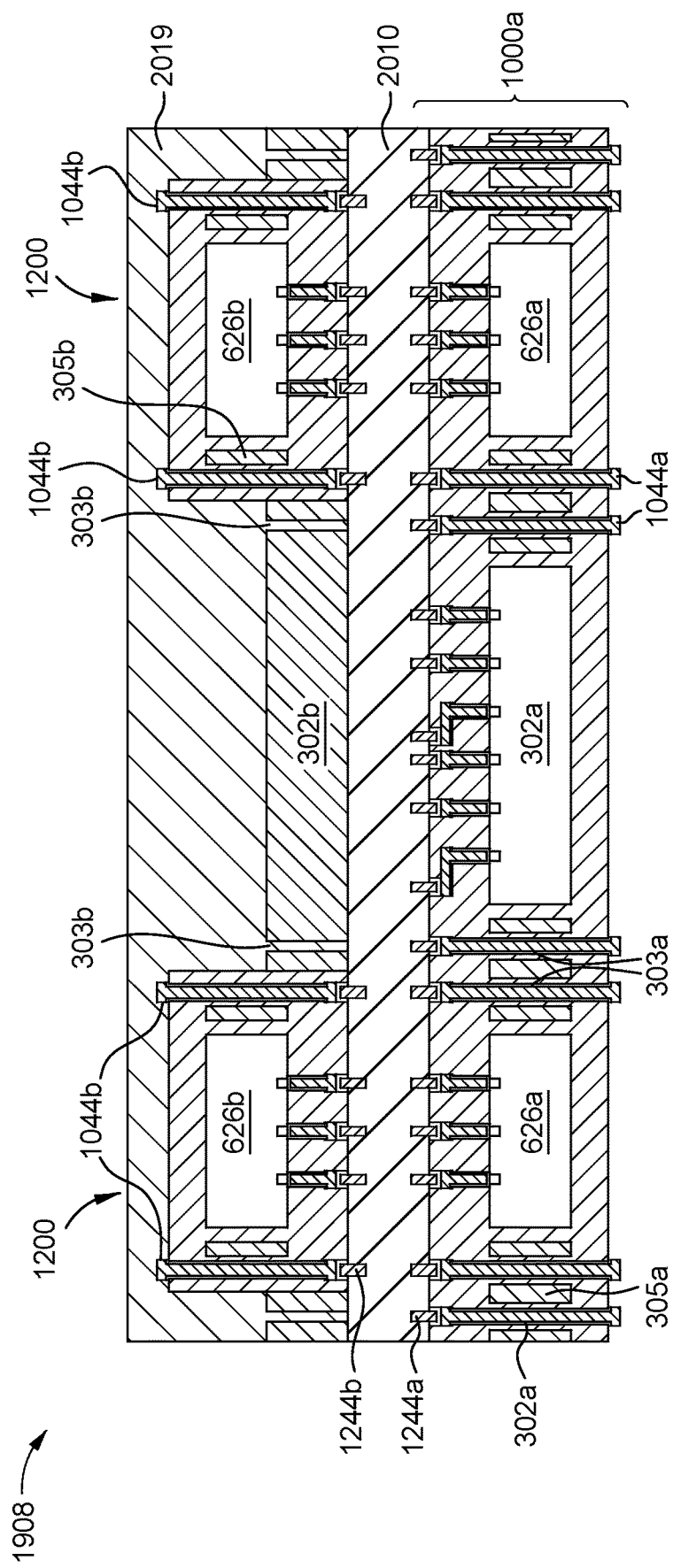

Upon lamination of the packages 1200 within the substrate 302b, an insulating layer 2019 is formed over the packages 1200 and the substrate 302b at operation 1908 and FIG. 20D. The insulating layer 2019 is substantially similar to the insulating layer 619, and may be formed of the same materials and by the same methods described above. Accordingly, formation of the insulating layer 2019 over the substrate 302 results in any unoccupied cavities 305b and vias 303b of the substrate 302b being filled with insulating dielectric material, as well as the packages 1200 being embedded within the substrate 302b.

Figure 20E:
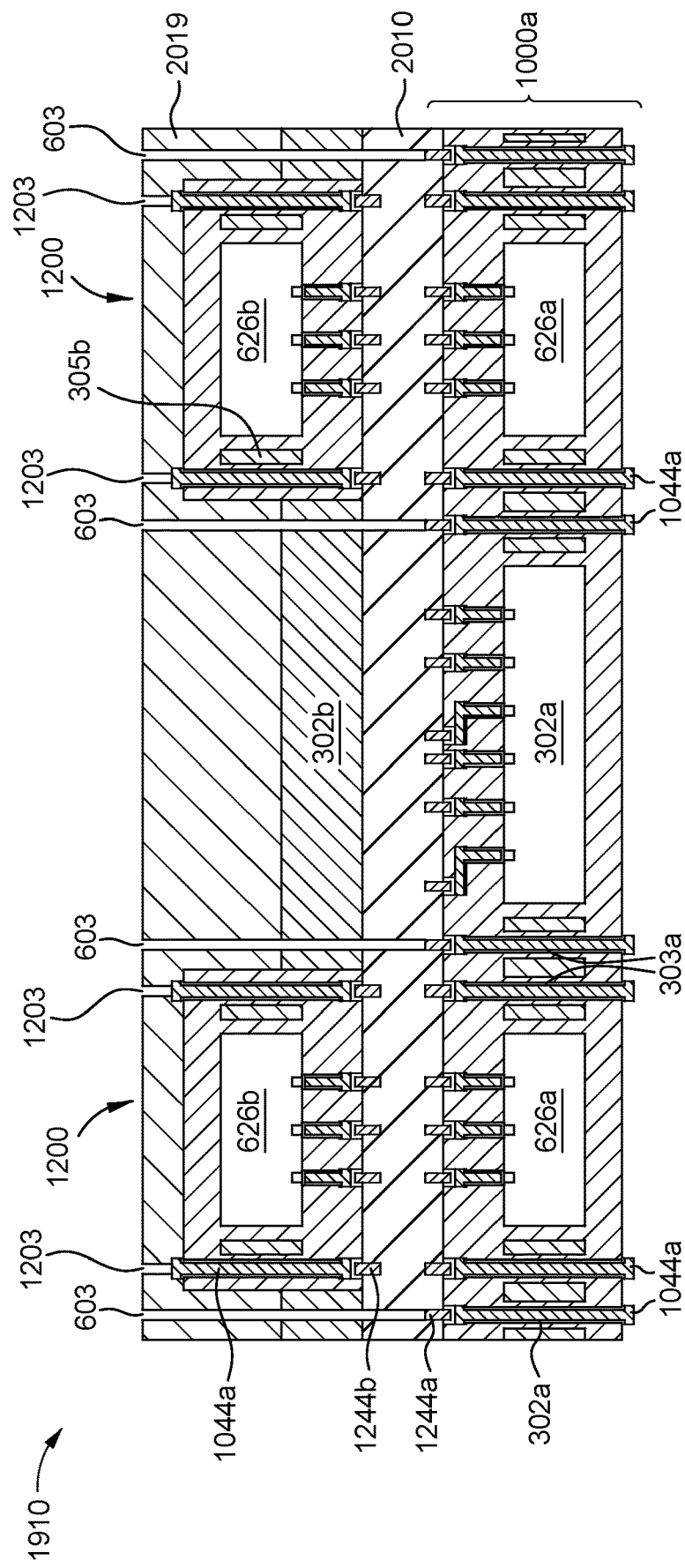
Figure 20F:
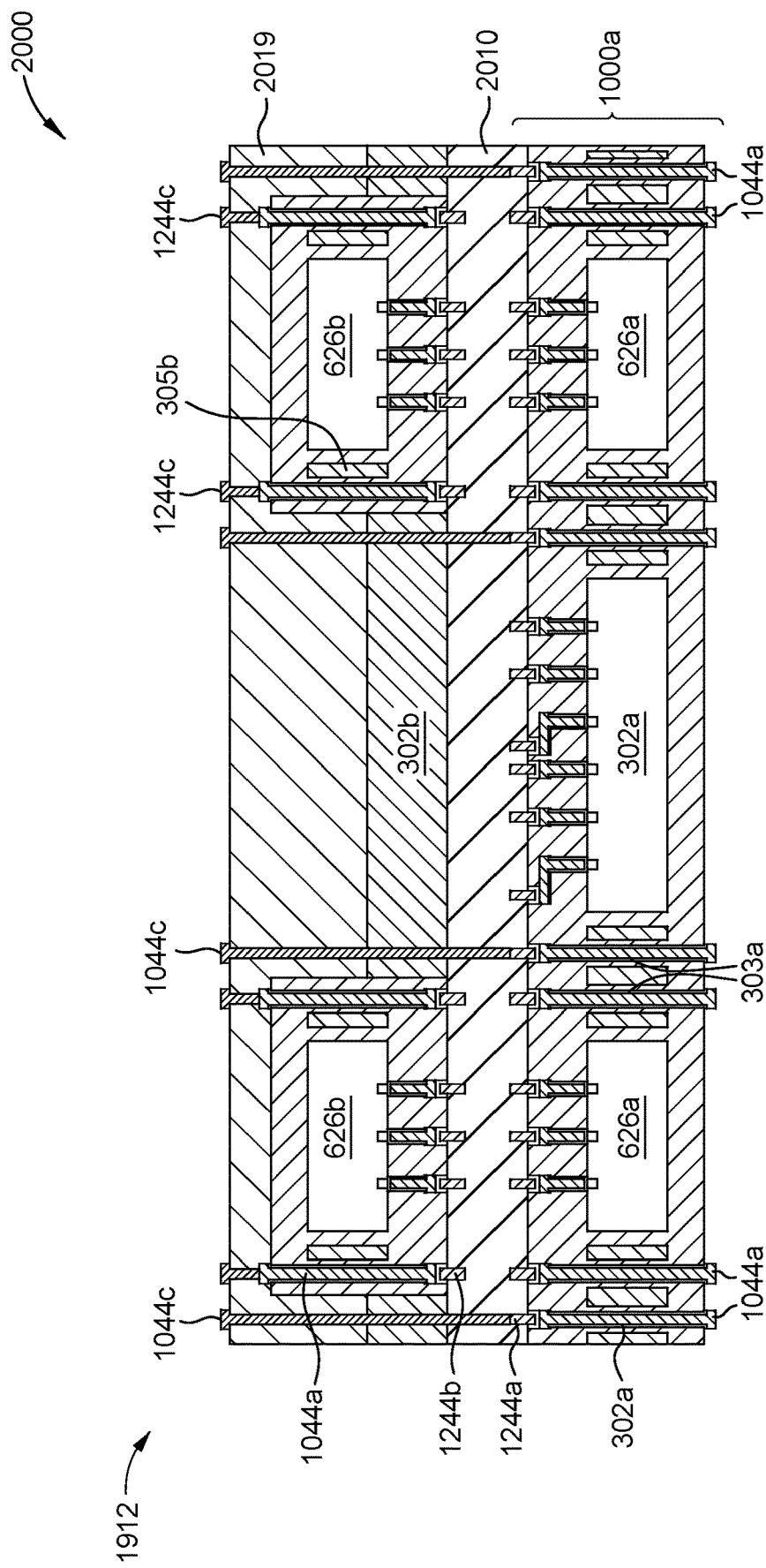

At operations 1910-1912 and FIGS. 20E-20F, one or more interconnections 1044c are formed through the dielectric-filled vias 303b and connected with interconnections 1044a or redistribution connections 1244a of the reconstituted substrate 1000a. Additionally, new redistribution connections 1244c may be formed in the insulating layer 2019 to reroute interconnections 1044b of the packages 1200. Prior to metallization, one or more through-assembly vias 603 and/or redistribution vias 1203 are laser-drilled through the dielectric material of the insulating layer 2019, packages 1200, and/or base layer 2010, similar to the processes described above. The drilling of through-assembly vias 603 and/or redistribution vias 1203 exposes contact points (e.g., top surfaces) of the interconnections 1044a, redistribution connections 1244a, and/or interconnections 1044b, enabling the interconnections 1044b and/or redistribution connections 1244c to be formed in direct contact therewith. Thus, after exposing the underlying conductive features by laser drilling, the interconnections 1044c may be formed in (e.g., by growing or plating conductive material, as described in embodiments above) directly over and in contact with the redistribution connections 1244a and the interconnections 1044a, eliminating any need for the utilization of intermediary electrical coupling structures between the reconstituted substrate 1000a and the packages 1200 integrated above, such as solder bumps or contact pads. Upon completion of operation 1912, one or more additional redistribution layers may be formed and/or devices stacked over desired surfaces of the stacked structure 2000.

The stacked structures 1400, 1500a-d, 1600, 1700a-b, 1800a-c, and 1900 provide multiple advantages over conventional stacked structures. Such benefits include thin form factor and high die-to-package volume ratio, which enable greater I/O scaling to meet the ever-increasing bandwidth and power efficiency demands of artificial intelligence (AI) and high performance computing (HPC). The utilization of a structured silicon frame provides optimal material stiffness and thermal conductivity for improved electrical performance, thermal management, and reliability of 3-dimensional integrated circuit (3D IC) architecture. Furthermore, the fabrication methods for through-assembly vias and via-in-via structures described herein provide high performance and flexibility for 3D integration with relatively low manufacturing costs as compared to conventional TSV technologies.

In sum, the embodiments described herein advantageously provide improved methods of reconstituted substrate formation and wafer-to-wafer stacking for fabricating advanced integrated semiconductor devices. By utilizing the methods described above, high aspect ratio features may be formed on glass and/or silicon substrates, thus enabling the economical formation of thinner and narrower reconstituted substrates for 2D and 3D integration. The thin and small-form-factor reconstituted substrates and reconstituted substrate stacks described herein provide the benefits of not only high I/O density and improved bandwidth and power, but also more economical manufacturing with dual-sided metallization and high production yield by eliminating single-die flip-chip attachment, wire bonding, and over-molding steps, which are prone to feature damage in high-volume manufacturing of integrated semiconductor devices.

While the foregoing is directed to embodiments of the present disclosure, other and further embodiments of the disclosure may be devised without departing from the basic scope thereof, and the scope thereof is determined by the claims that follow.

What is claimed is:

1. A method of forming a stacked semiconductor device, comprising:
    placing a first dielectric film over a semiconductor package, the semiconductor package comprising:
        a first semiconductor die disposed within a first cavity of a first substrate and embedded within a first insulating layer, the first insulating layer disposed over a first side and a second side of the first substrate and contacting each side of the first semiconductor die, the first substrate comprising a material to be selected from a group comprising at least one of: silicon or glass; and
        a first conductive interconnection disposed within a first via of the first substrate and extending from at least the first side to the second side of the first substrate, wherein the first insulating layer is disposed between the first conductive interconnection and a sidewall of the first via;
    positioning a second substrate over the first dielectric film, the second substrate comprising a second cavity and a second via formed therein, the second substrate comprising a material to be selected from a group comprising silicon or glass;
    placing a second semiconductor die within the second cavity formed in the second substrate;
    placing a second dielectric film over the second substrate, wherein the second substrate is disposed between the second dielectric film and the first dielectric film;
    laminating the first and second dielectric films to form a second insulating layer, the second insulating layer embedding the second semiconductor die within the second cavity; and
    forming a second conductive interconnection within the second via.

2. The method of claim 1, wherein the forming the second conductive interconnection comprises:
    laser ablating a hole in the second insulating layer disposed within the second via; and
    forming a metal layer over a surface of the hole in the second insulating layer.

3. The method of claim 2, wherein the forming the second conductive interconnection further comprises:
    forming a molybdenum adhesion layer and a copper seed layer over the surface of the hole prior to forming the metal layer.

4. The method of claim 2, wherein the laser ablation exposes a surface of the first conductive interconnection through the hole, and wherein the second conductive interconnection is electrically coupled to the first conductive interconnection.

5. The method of claim 2, wherein the forming the metal layer comprises one of electroplating and electroless deposition.

6. The method of claim 2, wherein the second conductive interconnection extends at least from a first surface to a second surface of the second substrate, wherein the cavity extends from the first surface.

7. The method of claim 1, wherein the first and the second semiconductor dies comprise different circuit configurations.

8. The method of claim 1, wherein the first and the second semiconductor dies comprise the same circuit configuration.

9. The method of claim 8, wherein the first and second semiconductor dies are DRAM dies and the stacked semiconductor device is a stacked DRAM device.

10. The method of claim 1, wherein the first insulating layer and the second insulating layer comprise the same material.

11. The method of claim 10, wherein the first insulating layer and the second insulating comprise an epoxy resin material having ceramic fillers.

12. The method of claim 1, wherein the second insulating layer comprises a polyimide material.

13. A method of forming a stacked semiconductor device, comprising:
    placing a first dielectric film over a semiconductor package, the semiconductor package comprising:
        a first plurality of semiconductor dies disposed within one or more first cavities of a first substrate and embedded within a first insulating layer, the first insulating layer disposed over a first side and a second side of the first substrate and contacting each side of each of the first plurality of semiconductor dies, the first substrate comprising a material to be selected from a group comprising at least one of: silicon or glass; and
        a first plurality of conductive interconnections disposed within a first plurality of vias of the first substrate and extending from at least the first side to the second side of the first substrate, wherein the first insulating layer is disposed between the each of the first plurality of conductive interconnection and surfaces of the first plurality of vias;
    positioning a second substrate over the first dielectric film, the second substrate comprising one or more second cavities and a second plurality of vias formed therein, the second substrate comprising a material to be selected from a group comprising silicon or glass;
    placing a second plurality of semiconductor dies within the one or more second cavities formed in the second substrate;
    placing a second dielectric film over the second substrate, wherein the second substrate is disposed between the second dielectric film and the first dielectric film;
    laminating the first and second dielectric films to form a second insulating layer, the second insulating layer embedding the second plurality of semiconductor dies within the one or more second cavities and filling each of the second plurality of vias;
    laser ablating a plurality of holes in the second insulating layer, each of the plurality of holes formed through a portion of the second insulating layer filling one of the second plurality of vias; and
    forming a second plurality of conductive interconnections, each of the second plurality of conductive interconnections formed over a surface of one of the plurality of holes.

14. The method of claim 13, wherein the forming the second plurality of conductive interconnections further comprises:
    forming a molybdenum adhesion layer and a copper seed layer over the surfaces of each of the plurality of holes.

15. The method of claim 13, wherein the laser ablation exposes a surface of at least one of the first plurality of conductive interconnections through the plurality of holes, and wherein at least one of the second plurality of conductive interconnections is electrically coupled to the at least one of the first plurality of conductive interconnections.

16. The method of claim 13, wherein the forming the second plurality of conductive interconnections comprises one of electroplating and electroless deposition of the second plurality of conductive interconnections.

17. The method of claim 13, wherein at least one of the second plurality of conductive interconnections extends at least from a first surface to a second surface of the second substrate.

18. The method of claim 13, wherein at least one of the first plurality of semiconductor dies and at least one of the second plurality of semiconductor dies are different materials.

19. The method of claim 13, wherein at least one of the first plurality of semiconductor dies and at least one of the second plurality of semiconductor dies are the same material.

20. A method of forming a stacked DRAM device, comprising:
- placing a first dielectric film over a semiconductor package, the semiconductor package comprising:
  - a first DRAM die disposed within a first cavity of a first substrate and embedded within a first insulating layer, the first insulating layer disposed over a first side and a second side of the first substrate and contacting each side of the first DRAM die, the first substrate comprising a material to be selected from a group comprising at least one of: silicon or glass; and
  - a first conductive interconnection disposed within a first via of the first substrate and extending from at least the first side to the second side of the first substrate, wherein the first insulating layer is disposed between the first conductive interconnection and surfaces of the first via;
- positioning a second substrate over the first dielectric film, the second substrate comprising a second cavity and a second via formed therein, the second substrate comprising a material to be selected from a group comprising silicon or glass;
- placing a second DRAM die within the second cavity formed in the second substrate;
- placing a second dielectric film over the second substrate, wherein the second substrate is disposed between the second dielectric film and the first dielectric film;
- laminating the first and second dielectric films to form a second insulating layer, the second insulating layer embedding the second DRAM die within the second cavity and filling the second via;
- laser ablating a hole in the second insulating layer filling the second via; and
- forming a second conductive interconnection over a surface of the hole.

* * * * *

UNITED STATES PATENT AND TRADEMARK OFFICE
CERTIFICATE OF CORRECTION

PATENT NO. : 12,354,968 B2
APPLICATION NO. : 18/362433
DATED : July 8, 2025
INVENTOR(S) : Han-Wen Chen et al.

Page 1 of 2

It is certified that error appears in the above-identified patent and that said Letters Patent is hereby corrected as shown below:

On the Title Page

On the page 5, in Column 2, under "Other Publications", Line 12, delete "diphenylsilanedio" and insert -- diphenylsilanediol --.

On the page 5, in Column 2, under "Other Publications", Line 17, delete "diphenylsilanedio/," and insert -- diphenylsilanediol/, --.

On the page 6, in Column 1, under "Other Publications", Line 17, delete "3Dmicrosystems"," and insert -- 3D-microsystems", --.

On the page 6, in Column 2, under "Other Publications", Line 41, delete "PCT/US2021037375." and insert -- PCT/US2021/037375. --.

In the Specification

In Column 1, Line 13, delete "11,364,333," and insert -- 11,264,333, --.

In Column 3, Line 36, delete "FIG." and insert -- FIGS. --.

In Column 17, Line 39, delete "71," and insert -- 7I, --.

In Column 17, Line 46, before "minutes" insert -- 15 --.

In Column 20, Line 48, delete "101" and insert -- 10I --.

In Column 22, Line 42, after "between" insert -- 10 --.

Signed and Sealed this
Tenth Day of February, 2026

John A. Squires
*Director of the United States Patent and Trademark Office*

CERTIFICATE OF CORRECTION (continued)
U.S. Pat. No. 12,354,968 B2

In Column 24, Line 31, delete "121" and insert -- 12I --.

In Column 24, Line 38, delete "121," and insert -- 12I, --.

In Column 30, Line 44, delete "15b and 15c." and insert -- 15B and 15C. --.

In Column 30, Line 45, delete "15b," and insert -- 15B, --.

In Column 30, Line 48, delete "15c" and insert -- 15C --.

In Column 30, Line 66, delete "PM" and insert -- $P_M$ --.

In Column 32, Line 17, delete "SIC," and insert -- SiC, --.

In the Claims

In Column 36, Line 15, in Claim 11, after "insulating" insert -- layer --.